(12) United States Patent
Jain

(10) Patent No.: US 10,741,719 B2
(45) Date of Patent: Aug. 11, 2020

(54) QUANTUM DOT CHANNEL (QDC) QUANTUM DOT GATE TRANSISTORS, MEMORIES AND OTHER DEVICES

(71) Applicant: Faquir Chand Jain, Storrs, CT (US)

(72) Inventor: Faquir Chand Jain, Storrs, CT (US)

(*) Notice: Subject to any disclaimer, the term of this patent is extended or adjusted under 35 U.S.C. 154(b) by 0 days.

(21) Appl. No.: 15/677,498

(22) Filed: Aug. 15, 2017

(65) Prior Publication Data
US 2018/0175241 A1 Jun. 21, 2018

Related U.S. Application Data

(63) Continuation-in-part of application No. 15/068,551, filed on Mar. 12, 2016, now Pat. No. 9,735,236.

(51) Int. Cl.
| | | |
|---|---|---|
| H01L 33/06 | (2010.01) | |
| H01L 33/18 | (2010.01) | |
| H01L 33/34 | (2010.01) | |
| H01L 29/788 | (2006.01) | |
| H01L 29/15 | (2006.01) | |
| H01L 29/423 | (2006.01) | |
| H01L 33/28 | (2010.01) | |

(Continued)

(52) U.S. Cl.
CPC .............. *H01L 33/06* (2013.01); *B82Y 10/00* (2013.01); *H01L 29/0665* (2013.01); *H01L 29/1033* (2013.01); *H01L 29/127* (2013.01); *H01L 29/15* (2013.01); *H01L 29/16* (2013.01); *H01L 29/20* (2013.01); *H01L 29/40114* (2019.08); *H01L 29/40117* (2019.08); *H01L 29/4234* (2013.01); *H01L 29/42324* (2013.01); *H01L 29/788* (2013.01); *H01L 33/18* (2013.01); *H01L 33/28* (2013.01); *H01L 33/34* (2013.01); *H01L 29/0673* (2013.01); *H01L 29/66825* (2013.01); *H01L 29/7613* (2013.01); *H01L 29/775* (2013.01); *H01L 33/08* (2013.01)

(58) Field of Classification Search
CPC ...... H01L 29/06; H01L 29/0665; H01L 33/06
See application file for complete search history.

(56) References Cited

U.S. PATENT DOCUMENTS

| | | | |
|---|---|---|---|
| 2005/0051766 A1* | 3/2005 | Stokes ................... | B82Y 10/00 257/17 |
| 2010/0167512 A1* | 7/2010 | Pan ..................... | B81C 1/00698 438/549 |

(Continued)

*Primary Examiner* — George R Fourson, III
(74) *Attorney, Agent, or Firm* — Steven McHugh

(57) ABSTRACT

This CIP application builds on Ge quantum dot superlattice (QDSL) based field effect transistors where Ge quantum dot arrays are used as a high carrier mobility channel. The QDSL diodes claims that were withdrawn are included. The diodes are used as light emitting devices and photodetectors. A combination of QDC-FETs, light emitting devise, photodetectors are vertically stacked to form a versatile 3-dimensional integrated circuit. Nonvolatile memories using floating quantum dot gates are included in vertical stacking format. Nonvolatile random access memories are integrated as a stack. Also described is the use of 3-layer stack of QDC-FETs making compact electrical circuits interfacing pixels for an active matrix flat panel displays that results in high resolution. Ge or Si quantum dot transport channel based devices processing spin polarized electrons introduced by magnetic tunnel junctions are described for multistate coherent logic.

6 Claims, 69 Drawing Sheets

(51) Int. Cl.

| | |
|---|---|
| *H01L 29/12* | (2006.01) |
| *B82Y 10/00* | (2011.01) |
| *H01L 29/16* | (2006.01) |
| *H01L 29/20* | (2006.01) |
| *H01L 29/10* | (2006.01) |
| *H01L 21/28* | (2006.01) |
| *H01L 29/06* | (2006.01) |
| H01L 29/66 | (2006.01) |
| H01L 33/08 | (2010.01) |
| *H01L 29/775* | (2006.01) |
| H01L 29/76 | (2006.01) |

(56) References Cited

U.S. PATENT DOCUMENTS

| | | | | |
|---|---|---|---|---|
| 2012/0280208 | A1* | 11/2012 | Jain | B82Y 10/00 |
| | | | | 257/20 |
| 2012/0300796 | A1* | 11/2012 | Sysak | H01S 5/1032 |
| | | | | 372/6 |
| 2014/0185640 | A1* | 7/2014 | Jain | B82Y 20/00 |
| | | | | 372/45.011 |
| 2016/0225947 | A1* | 8/2016 | Murayama | H01L 33/06 |
| 2016/0233449 | A1* | 8/2016 | Murayama | C09K 11/565 |
| 2018/0138330 | A1* | 5/2018 | Choi | H01L 51/44 |

\* cited by examiner

Quantum dot superlattice (QDSL) p-n diode as a light-emitting diode (LED).

Figure 25. Quantum dot Ge superlattice (QDSL) p-n diode as an edge-emitting laser diode (LD).

Quantum dot superlattice (QDSL) on poly-Si forming quantum dot channel (QDC) FET configured as a floating gate nonvolatile memory in vertical NAND format.

A 3-dimensional vertical stack of layers integrated circuits comprising of electrical circuits using high mobility Ge QDSL n-channel QDC-FETs realized on poly-Si thin films sandwiched between oxide/ insulating layers.

A 3-dimensional vertical stack of layers integrated circuits comprising of electrical circuits using high mobility Ge QDSL n-channel QDC-FETs realized on poly-Si thin films sandwiched between oxide/insulating layers, whereas various functional blocks are connected via optical interconnects.

light emitting diode LED

A 3-dimensional vertical stack of layers integrated circuits comprising of electrical circuits as well as dynamic random access memory (DRAM) cells.

A QDC-FET is shown using high mobility GeO$_x$-Ge quantum dot layers. The p-aSi layer on glass or sapphire or polyimide substrate replaces the layer shown as 2039. Additionally, QDC-FET is shown (as another embodiment) where glass substrate is replaced by box oxide. Box oxide is like layer 20391 or an oxide 2038 depending on the application and circuit architecture.

NAND architecture of floating gate nonvolatile memory cells (WL1-WLn) between two FETs (SSL and GBL) providing connections to bit line (BL) and source line.

Floating gate nonvolatile memory NAND architecture.

Schematic diagram and cross-sectional view of 3D V-NAND array

Prior Art

More details of vertically stacked memory cells using transport channel in poly-Si are shown.

Cross-sectional schematic showing silicon nitride trap layer and poly-Si channel in vertical stacked cells in a V-NAND array.

Additional details of V-NAND cell (charge trap flash, CTF) construction

Oxide isolated charge storage in a trench capacitor

Prior Art

A formation of Mach-Zehnder interferometer (MZI) or optical modulators using silicon waveguides (including photonic crystal waveguide) is shown.

Prior Art

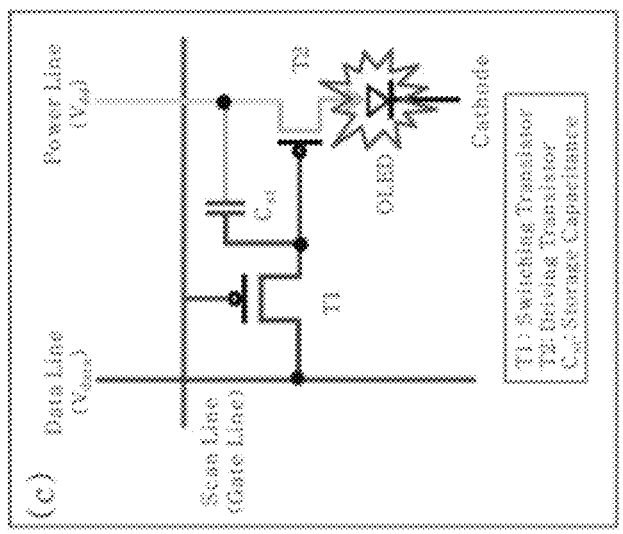
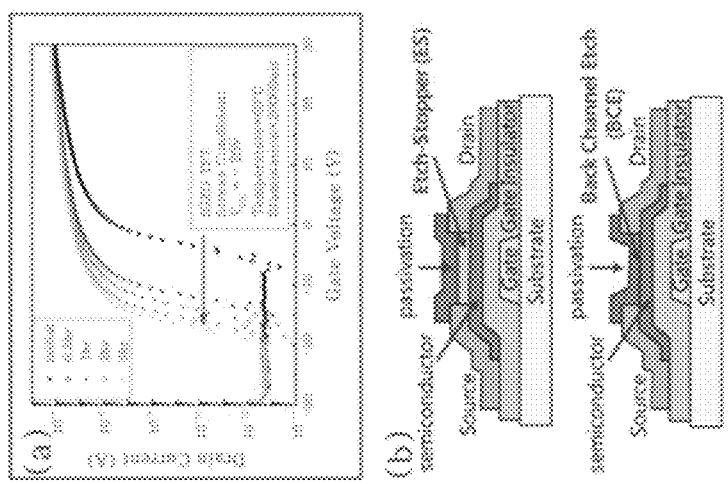
Figure 40A
Figure 40B
Figure 40C
Prior Art

Table 1: Shown is a comparison of AMOLED panel designs based on polysilicon, amorphous silicon, and oxide TFTs.

| AMOLED Panel | Poly-Si TFT | a-Si:H TFT | Oxide TFT |
|---|---|---|---|
| Semiconductor | Poly-crystalline Si | Amorphous Si | Amorphous IGZO |
| TFT uniformity | Poor | Good | Good |
| Pixel circuit | Complex (5T + 2C etc.) | Complex (4T + 2C, 5T + 2C) | Simple/Complex (2T + 1C6T + 2C) |
| Channel mobility | ~100 cm$^2$/V-sec | 1 cm$^2$/V-sec | >10 cm$^2$/V-sec |
| TFT type | PMOS (CMOS) | NMOS | NMOS |
| TFT mask steps | 5~11 | 4~5 | 5~7 |
| Cost/Yield | High/Medium | Low/No data | Low/Medium |

Figure 41

Prior Art

QUANTUM DOT CHANNEL (QDC) QUANTUM DOT GATE TRANSISTORS, MEMORIES AND OTHER DEVICES

CROSS REFERENCE TO RELATED APPLICATIONS

This application is a continuation-in-part application of Co-Pending U.S. Non-Provisional patent application Ser. No. 15/068,551, filed Mar. 12, 2016 and claims priority to and benefit of the filing dates of U.S. Non-Provisional patent application Ser. No. 13/465,872 and U.S. Non-Provisional patent application Ser. No. 15/068,551, the contents of both of which are incorporated herein by reference in their entirety.

STATEMENT REGARDING FEDERALLY SPONSORED RESEARCH

The United States Government has certain rights in this invention pursuant to National Science Foundation Grant No. ECS 0622068.

FIELD OF THE INVENTION

The present invention applies to field-effect transistors (FETs) and more particularly to FETs using quantum dot channels, nonvolatile random access memories (RAMs) with addressable quantum dot floating gates and ultrahigh value capacitors for energy storage as well as a method of fabricating heteroepitaxial structures which are mediated by quantum dot layers to reduce defects.

BACKGROUND OF THE INVENTION

In the past few years, researchers have investigated various approaches to fabricating FETs which range from using carbon nanotube to using graphene devices, nanowire Si and SiGe FETs, and Ge and InGaAs FETs. Unfortunately however, current FETs have only one inversion layer which is formed in the proximity of the gate insulator. Accordingly, this limits the current FETs to only exhibit two states: ON and OFF. Thus, the applications for current transistors are limited in that designs must take into account the bi-state functionality of the FETs. Accordingly, functionality of current FETs are limited.

One such example is seen in FIG. 1a which illustrates a single channel FET in accordance with the prior art. Another such example is seen in FIG. 1b which illustrates a floating gate memory cell having an asymmetric source/drain, with the drain side of p-type halo or pocket doping in accordance with the prior art. Still yet another example is shown in FIG. 1c which illustrates a NOR array architecture of a floating gate memory cell and which shows erasing in accordance with the prior art. Still yet another example is shown in FIG. 1d which illustrates a NAND array architecture of a floating gate memory cell in accordance with the prior art. Furthermore, other examples are shown in FIG. 2a which illustrates a quantum dot gate 3-state FET and FIG. 2b which illustrates a conventional nanocrystal quantum dot floating gate memory both in accordance with the prior art. It should be appreciated that although the quantum dot gate FET of FIG. 2a does exhibit 3-states, the intermediate state (i.e. the third state) is a low-current state near the threshold region, which is undesirable.

SUMMARY OF THE INVENTION

A quantum dot channel (QDC) field-effect transistor device is provided and includes a substrate, wherein the substrate includes a source region, a gate region, a drain region, and a transport channel located between the source region and the drain region, wherein the transport channel is comprised of an array of cladded quantum dots, the cladded quantum dots being comprised of at least one Si and Ge and having a thin cladding layer comprised of at least one of SiOx and GeOx, and wherein the array of cladded quantum dots include a top layer of cladded quantum dots and a bottom layer of cladded quantum dots, the array of cladded quantum dots being assembled on a semiconductor substrate of p-type conductivity and being constructed from a semiconductor material which includes at least one of Si, Ge, InGaAs, GaAs, GaN, wherein the array of cladded quantum dots are deposited in a region between source region and the drain region, and wherein the cladding of the top layer of cladded quantum dots is deposited with a thin gate insulator layer, wherein the thin gate insulator layer is deposited with a gate material constructed from at least one of a metallic material and a semiconducting material which results in a pre-determined threshold voltage for the field-effect transistor.

A field effect transistor is provided, wherein the FET is configured as a nonvolatile random access memory. The FET includes a source region, a gate region, a drain region, and a transport channel region located between the source region and the drain region, wherein the gate region includes a first thin gate insulator layer deposited with a first set of cladded quantum dots over the transport channel region, and wherein the first set of cladded quantum dots is deposited with a second set of cladded quantum dots having a thin cladding layer, the first set of cladded quantum dots forming a floating gate which stores a charge when a memory is written, and wherein the second set of cladded quantum dots include a thin barrier and a small core to transport charge, wherein a top part of the second set of cladded quantum dots is deposited with a second gate insulator over the transport channel region, wherein a first gate is formed over the first set of cladded quantum dots and the second set of cladded quantum dots, wherein the first gate is disposed over the transport channel region, and wherein the second set of cladded quantum dots are contacted by a second gate which is located differently from the first gate, wherein the second gate is formed in a region where the gate insulator is relatively thicker then the first gate insulator, and wherein the second gate is used to extract electrons deposited on the quantum dot floating gate during an erase cycle, wherein the electrons may be removed by biasing the second gate and the source region.

A p-n junction diode is provided and includes at least one layer of quantum dot superlattice, wherein the quantum dot superlattice includes two or more layers of cladded quantum dots, wherein the cladding is thin and is comprised of higher energy gap oxide than the gap of the quantum dot, wherein the other layer forming the diode is of opposite conductivity than that of the quantum dot superlattice.

A quantum dot channel (QDC) field-effect transistor device is provided and is configured as a nonvolatile random access memory device and includes a substrate, wherein the substrate includes a source region, a gate region, a first drain region, and a transport channel located between source region and the drain region, wherein the transport channel is comprised of an array of cladded quantum dots, the cladded quantum dots being comprised of at least one Si and Ge and having a thin cladding layer comprised of at least one of SiOx and GeOx, and wherein the array of cladded quantum dots include a top layer of cladded quantum dots and a bottom layer of cladded quantum dots, the array of cladded quantum dots being assembled on a semiconductor substrate of p-type conductivity and being constructed from a semiconductor material which includes one of Si, Ge, InGaAs, GaAs, GaN, amorphous-Si, amorphous Si-on-glass, amorphous Si on polyimide, wherein the array of cladded quantum dots are deposited in a region between source region and drain region, and wherein the cladding of the top layer of cladded quantum dots is deposited with a first thin gate insulator, and wherein said source region and first drain region are n-dopeed, wherein the first thin gate insulator layer is deposited with a first set of cladded quantum dots over the transport channel region comprising of an array of cladded quantum dots, and wherein the first set of cladded quantum dots is deposited with a second set of cladded quantum dots having a thin cladding layer, the first set of cladded quantum dots forming a floating gate which stores charges when said memory device is written, and wherein the second set of cladded quantum dots include a thin barrier and a small core to transport charge, wherein a top part of the second set of cladded quantum dots is deposited with a second gate insulator layer over the transport channel region, wherein a first gate is formed over the thin first gate insulator layer, the first set of cladded quantum dots, and the second set of cladded quantum dots, and second gate insulator layer or control gate insulator layer, wherein the first gate is deposited over the transport channel region, and wherein the second set of cladded quantum dots are contacted by a second gate and a second drain region which is located differently from the first gate and first drain region, wherein the second gate is formed in a region where the first and second gate insulators are of different thicknesses to facilitate operation of quantum dot access channel, and wherein the second drain region is isolated from the first drain region which is in contact with the quantum dot transport channel, and wherein the second drain region is isolated from the first set of cladded quantum dots comprising of the floating gate region, wherein the second gate and second drain are used to extract charges deposited on the quantum dot floating gate during an erase cycle, wherein the electrons may be removed by biasing the second gate or second drain region and the source region.

A field effect transistor is provided and is configured as a nonvolatile random access memory, wherein the field effect transistor includes a source region, a gate region, a first drain region, and a transport channel region located between the source region and the first drain region, wherein the gate region includes a first thin gate insulator layer deposited with a first set of cladded quantum dots over the transport region, and wherein the first set of cladded quantum dots is deposited with a second set of cladded quantum dots having a thin cladding layer, the first set of cladded quantum dots forming a floating gate which stores a charge when a memory is written, and wherein the second set of cladded quantum dots include a thin barrier and a small core to transport charge, wherein a top part of the second set of cladded quantum dots is deposited with a second gate insulator over the transport channel region, wherein a first gate is formed over the thin first gate insulator layer, the first set of cladded quantum dots, and the second set of cladded quantum dots, and second gate insulator layer, wherein the first gate is deposited over the transport channel region, and wherein the second set of cladded quantum dots are contacted by a second gate or a second drain, and wherein the second gate and second drain are located differently from the first gate and first drain, wherein the second gate is formed in a region where the gate insulator is relatively thicker then the first gate insulator and over the first set of cladded quantum dots, and wherein the second gate insulator layer is thinner or non-existent, and wherein the second drain region is isolated from the first drain region in contact with the quantum dot transport channel, and wherein the second drain region is isolated from the first set of cladded quantum dots comprising of the floating gate region, wherein the second gate and second drain are used to extract charges deposited on the quantum dot floating gate during an erase cycle, and wherein deposited electrons may be removed by biasing the second gate, second drain region and the source region, and wherein the second gate and second drain are used to deposit charges on quantum dot floating gate during Write cycle, and wherein electrons are deposited by biasing of first gate, second gate, second drain, and first drain with respect to said source region.

A quantum dot channel logic device is provided and includes a primary source region, a primary drain region and a primary gate region, and wherein a primary quantum dot channel is located under the gate region between the primary source and primary drain regions, and wherein primary quantum dot channel has a width and a length under the primary gate region, and wherein primary source, primary quantum dot channel, and primary drain regions are disposed on first p-Si layer, and said first p-Si layer is disposed on first insulator layer selected one from SiO2, ZnMgS, ZnBeMgS, and wherein first insulator layer is disposed on second p-Si layer, and the second p-Si layer is disposed on second insulator layer such as SiO2 box layer, and said box oxide is deposited on a Si substrate, a plurality of secondary quantum dot channels in vicinity and along the length of primary quantum dot channel, and wherein width of secondary quantum dot channels is less than the length of primary quantum dot channel, and wherein primary source region is a magnetic tunnel junction, and primary drain region is a magnetic tunnel junction, and wherein spin polarized electrons are introduced in primary source region by the magnetic tunnel junction upon biasing with respect to first p-Si layer, and wherein electrons are transferred from the primary quantum dot channel to one of plurality of secondary quantum dot channels upon application of gate voltage with respect to primary source region and primary gate region, and wherein transferred spin polarized electrons from the primary quantum dot channel are wave-guided and interfaced with logic gates, and wherein logic is performed using quantum interference transistors realized in electron waveguides, and wherein transistor configuration is one selected from T junctions, quantum interference transistors (QUIT) with two arms like Mach-Zehnder interferometer, and wherein ON and OFF operation is carried out with at least two input voltage signals A and B to realize a logic function selected from NAND, NOR and AND, and wherein the output of logic gate in secondary channel is a binary state "1" or "0", and wherein the output end of the secondary channel is connected to the primary drain region, serving as common return path for spin polarized electrons, and wherein the overall logic performed by plurality of secondary quantum dot channels is global, and wherein global logic is dependent on ON and OFF states of all inputs applied to said secondary quantum dot channel based logic, wherein primary and secondary quantum dot channels comprise of at least one layer of quantum dot superlattice (QDSL) transport channel, and wherein the quantum dot superlattice layer includes one or more layers of cladded Ge, Si, GaAs quantum dots, and wherein the cladding layer selected one from GeOx, SiOx, HfO$_2$, ZnSSe, on quantum dots is thin and is of higher energy gap than the energy gap of the quantum dot, and wherein QDSL layer forming primary and secondary quantum dot channels have disposed on top tunnel oxide insulator layer, and wherein tunnel oxide is disposed with a gate layer selected one from TaN, TiN, Al, Au, poly-Si and poly-Ge, wherein the width of primary and secondary quantum dot channels is in the range of 4-10 nm, and width permits guiding of coherent spin-polarized electrons, and wherein the lengths of T-junction and Mach-Zehnder type quantum interference transistors permit ballistic carrier transport.

BRIEF DESCRIPTION OF THE FIGURES

The foregoing and other features and advantages of the present invention should be more fully understood from the accompanying detailed description of illustrative embodiments taken in conjunction with the following Figures in which like elements are numbered alike in the several Figures:

FIG. 4c is a graph showing the Id-Vd characteristics of the fabricated Ge QDC-FET of FIG. 4a.

FIG. 10b is a schematic block diagram showing the cross-section $X_1$-$X_2$ of the nonvolatile random access memory of FIG. 10a.

FIG. 10c is a schematic block diagram showing the cross-section $Y_1$-$Y_2$ of the nonvolatile random access memory of FIG. 10a.

FIG. 40A shows flat panel displays using active matrix addressed organic light emitting diodes (AMOLED). ID-VG transfer characteristics as a function of bias-temperature-illumination stress.

FIG. 40B The schematics of etch-stopper (ES) and back-channel-etch (BCE) structures are illustrated.

FIG. 40C illustrates conventional pixel design for an AMOLED panel uses two transistors and one capacitor.

FIG. 41 illustrates a table showing a comparison of AMOLED panel designs, in accordance with the prior art.

DETAILED DESCRIPTION OF THE INVENTION

Figure 1A:
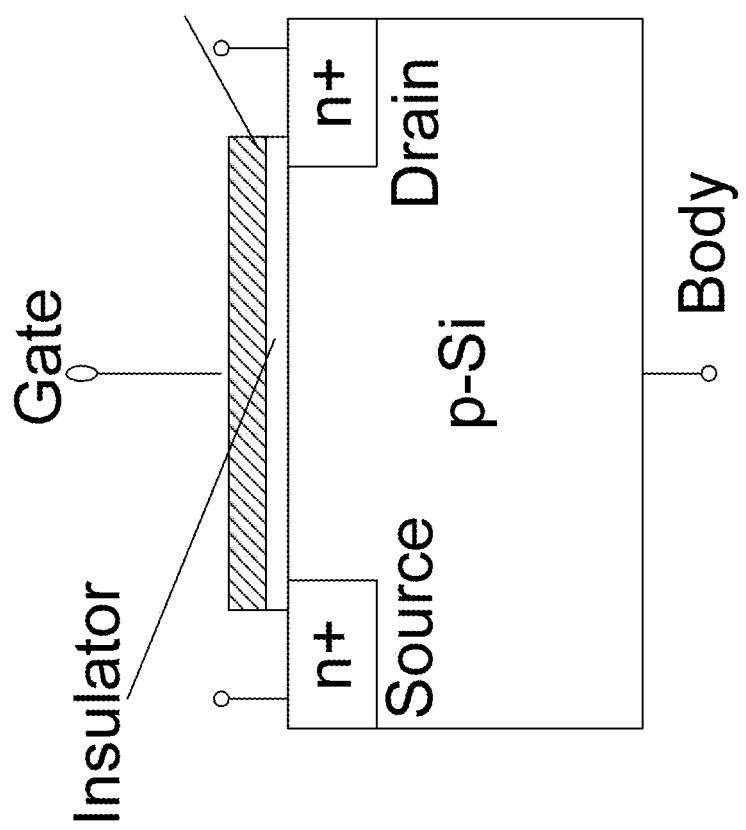
FIG. 1a is a schematic block diagram showing a single channel Field Effect Transistor (FET), in accordance with the prior art.

In accordance with the present invention, this invention builds on Ge QDSL based field effect transistors where Ge quantum dot arrays are used as a high carrier mobility channel. The QDSL diodes claims that were withdrawn are included. The diodes are used as light emitting devices and photodetectors. A combination of QDC-FETs, light emitting devise, photodetectors are vertically stacked to form a versatile 3-dimensional integrated circuit. Nonvolatile memories using floating quantum dot gates are included in vertical stacking format. Nonvolatile random access memories are integrated as a stack. Also described is the use of 3-layer stack of QDC-FETs making compact electrical circuits interfacing pixels for an active matrix flat panel displays that results in high resolution.

In accordance with the invention, a field-effect transistor in which a channel is formed in an array of quantum dots is provided and described herein. In one embodiment the quantum dots are cladded with a thin layer serving as an energy barrier. The array of quantum dots with a thin barrier (about 1-2 nm) form a superlattice like layer in two or three dimensions. The quantum dot channel (QDC) may consist of one or more layers of cladded quantum dots. These quantum dots may be realized on a single or polycrystalline substrate. It should be appreciated that when QDC FETs are realized on polycrystalline or nanocrystalline thin films, they may yield higher mobility than in conventional nano- or microcrystalline thin films. These FETs can advantageously be used as thin film transistors (TFTs) in a variety of applications. In another embodiment QDC-FETs are combined with: (a) coupled quantum well Spatial Wavefunction Switched (SWS) channels and (b) quantum dot layers like used in 3-state FETs. In another embodiment, a QDC is combined with a floating gate layer in nonvolatile memories to achieve faster erasing and individual memory cell addressing like a nonvolatile random access memory. It should be appreciated that an array of quantum dots forming a quantum dot channel (QDC) is referred to as a Quantum dot superlattice (QDSL) layer that can be used to form n-region of a p-n diode, bipolar transistors (n-p-n or p-n-p), and/or a p-n solar cell.

In another embodiment, the quantum dots, forming the floating gate of a nonvolatile memory device, may be accessed to remove charge from the floating gate to accomplish a faster erase operation. Such a device is also presented.

In still yet another embodiment, stacks of quantum dots are formed to realize a high value ultra large capacitor. This utilizes the high dielectric constant of cladded quantum dots such as SiOx-cladded Si dots and GeOx-cladded Ge dots with a higher effective dielectric constant than SiOx or GeOx.

In still yet another embodiment, a layer of quantum dots may be used to serve as a mediator layer, thereby reducing dislocations to achieve growth of mismatched epitaxial layer on a substrate.

This application builds on U.S. patent application Ser. No. 12/006,974 for nonvolatile floating quantum dot gate and three-state devices, the contents of which are incorporated herein by reference in its entirety. It should be appreciated that double quantum dot structures, which are laterally coupled by Coulomb blockade barriers and that involve spin-based quantum computing, have been recently reported by a number of investigators. By contrast, quantum dot gate FETs exhibit three-state behavior and multiple states are reported for single electron transistors, SETs.

In accordance with the present invention, Quantum Dot Channel (QDC) FET structures where the transport channel is comprised of an array of quantum dots (with 3-4 nm core cladded with thin barriers) where current transport is quantized is provided and disclosed herein. These devices exhibit step-like drain current-gate voltage (ID-VG) characteristics which are generally expected in single electron transistors (SETs). QDC-FETs involve more than a few electrons and advantageously operate at room temperature. Moreover, Quantum Dot Channels can advantageously be combined with spatial wave-function-switched (SWS) Field-Effect Transistors to process two or more bits simultaneously.

Figure 3A:
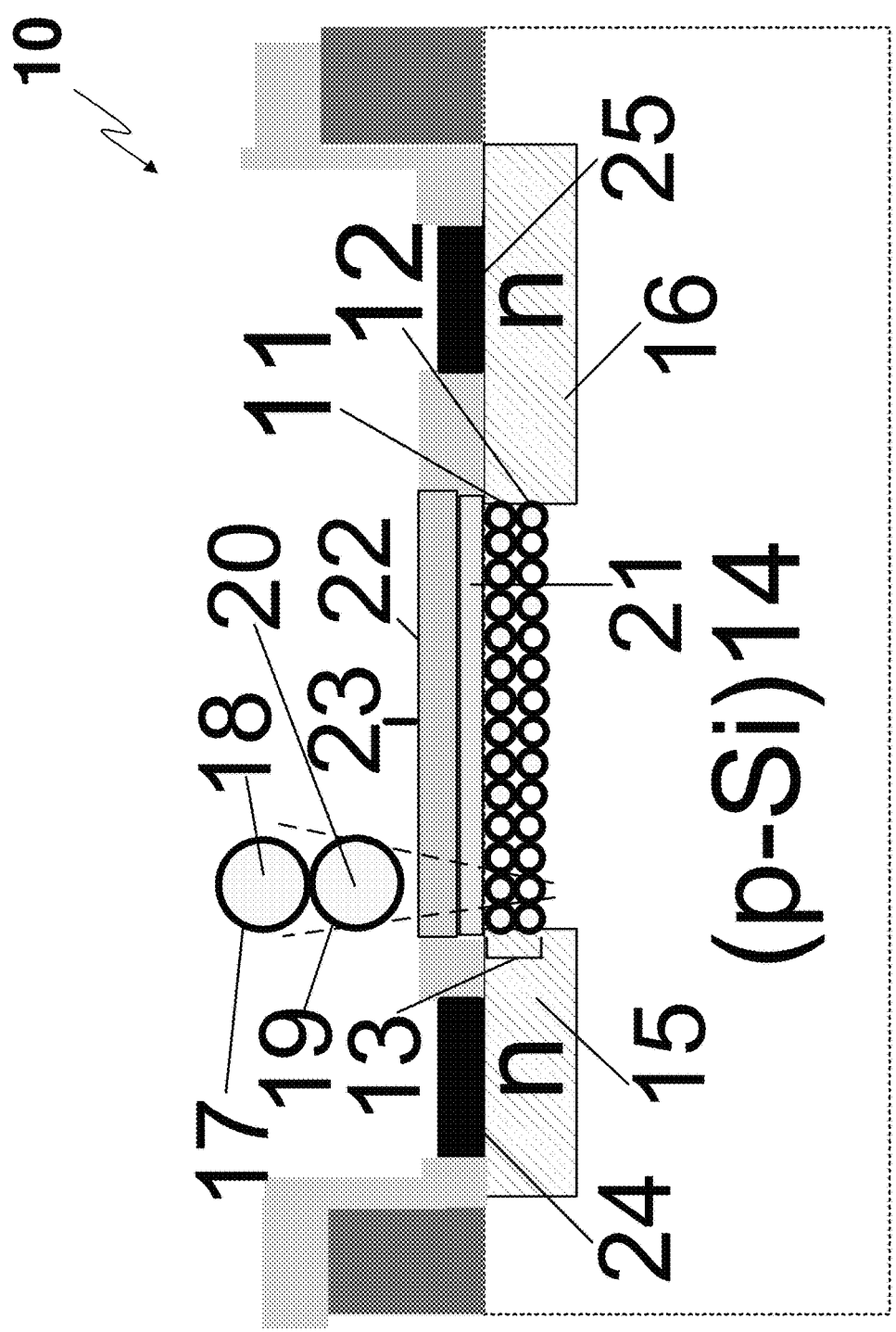
FIG. 3a is a schematic block diagram of a $SiO_x$-cladded Si Quantum Dot Channel (QDC) Si FET, in accordance with one embodiment of the present invention.

FIG. 3a shows the structure of a quantum dot channel QDC-FET 10, in accordance with one embodiment of the present invention. Two layers 11 and 12 of $SiO_x$-cladded Si dots are site-specifically self-assembled to form a transport channel 13 serving as an n-channel on a p-Si region 14 between the source region 15 and the drain 16 region. The top quantum dot layer 11 may have a thin $SiO_x$ cladding 17 on the Si quantum dots 18 (shown in exploded view). Quantum dots 20 and the cladding 19 on the quantum dots 20 forming the bottom quantum dot layer in the channel is also shown. The exploded view inset shows the details of cladding and dot regions. The top quantum dot layer 11 is deposited with a thin gate insulator layer 21 which material may be selected from one or more of $HfO_2$, SiON, $Al_2O_3$ and/or any other suitable gate insulator film materials or combination of materials. The gate insulator layer 21 is deposited with a gate material 22 which is selected from one or more of Al, TaN, TiN, p- or n-type poly Si, other semiconductor materials and/or combination of semiconductor materials, and/or low and high work function metals. The source region 15 and drain region 16 have contacts 24 and 25, respectively. Additionally, the gate material 22 has an interconnect 23. It should be appreciated that interconnects for the source contact and drain contact is not shown.

Figure 3B:
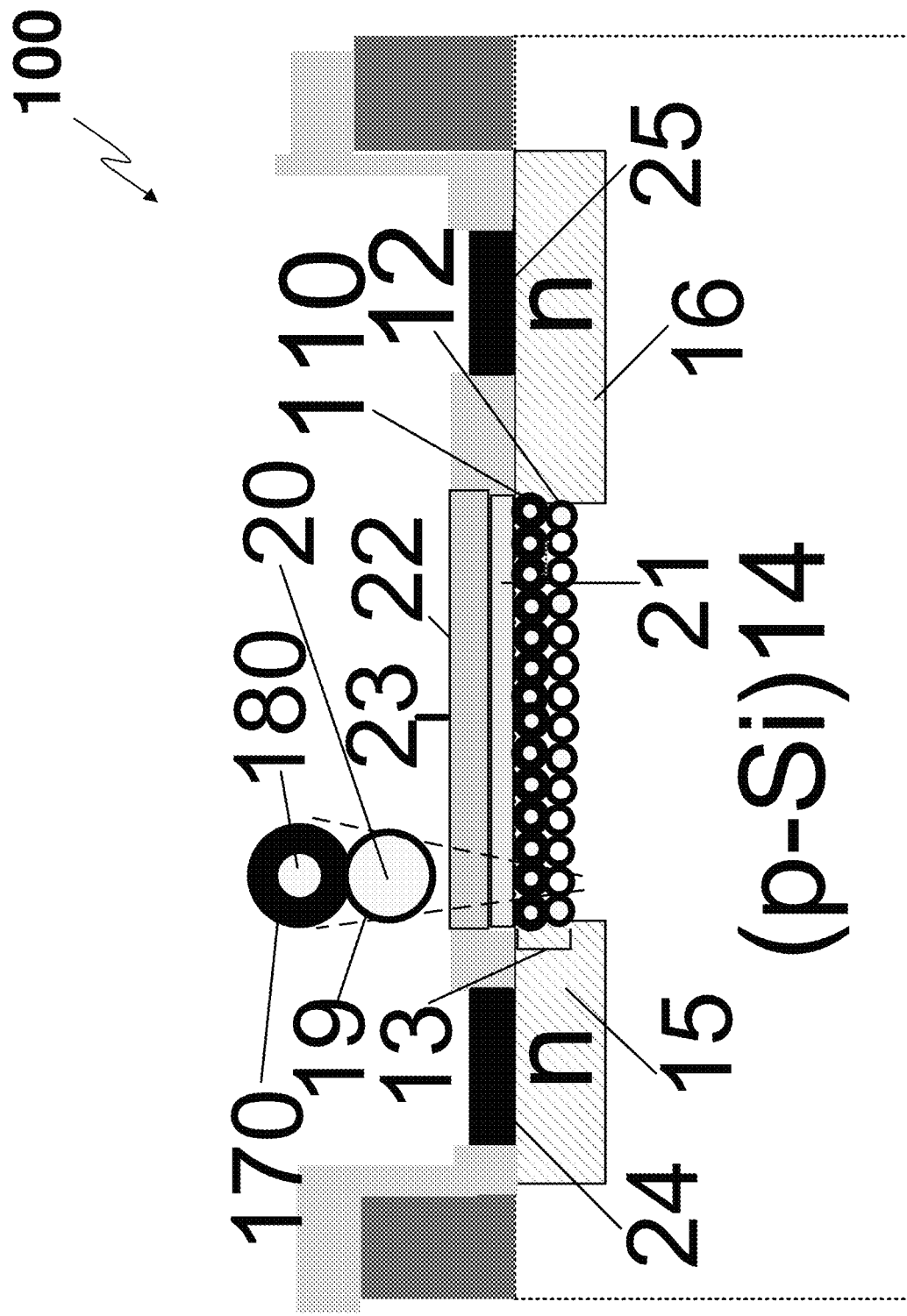
FIG. 3b is a schematic block diagram of a QDC-FET having two asymmetric layers of cladded quantum dots (wherein the top layer has thicker cladding), in accordance with another embodiment of the present invention.

FIG. 3b shows another embodiment of the present invention, wherein in the structure of a quantum dot channel QDC-FET 100 the top cladded dot layer 110 has a thicker $SiO_x$ cladding layer 170 on the Si dot 180 then in the bottom layer 12 (shown in the exploded view). In this embodiment, the top cladded quantum dot layer 110 has quantum dots with smaller diameters and thicker cladding 170 than the quantum dots in the bottom cladded quantum dot layer 12. The top cladded dot layer 170 in conjunction with gate insulator layer 21 serve as the effective gate insulator film. In still yet another embodiment, there may be no separate gate insulator layer 21, where the cladding 170 may serve as the gate dielectric over which the gate metal layer 22 may be deposited.

Figure 3C:
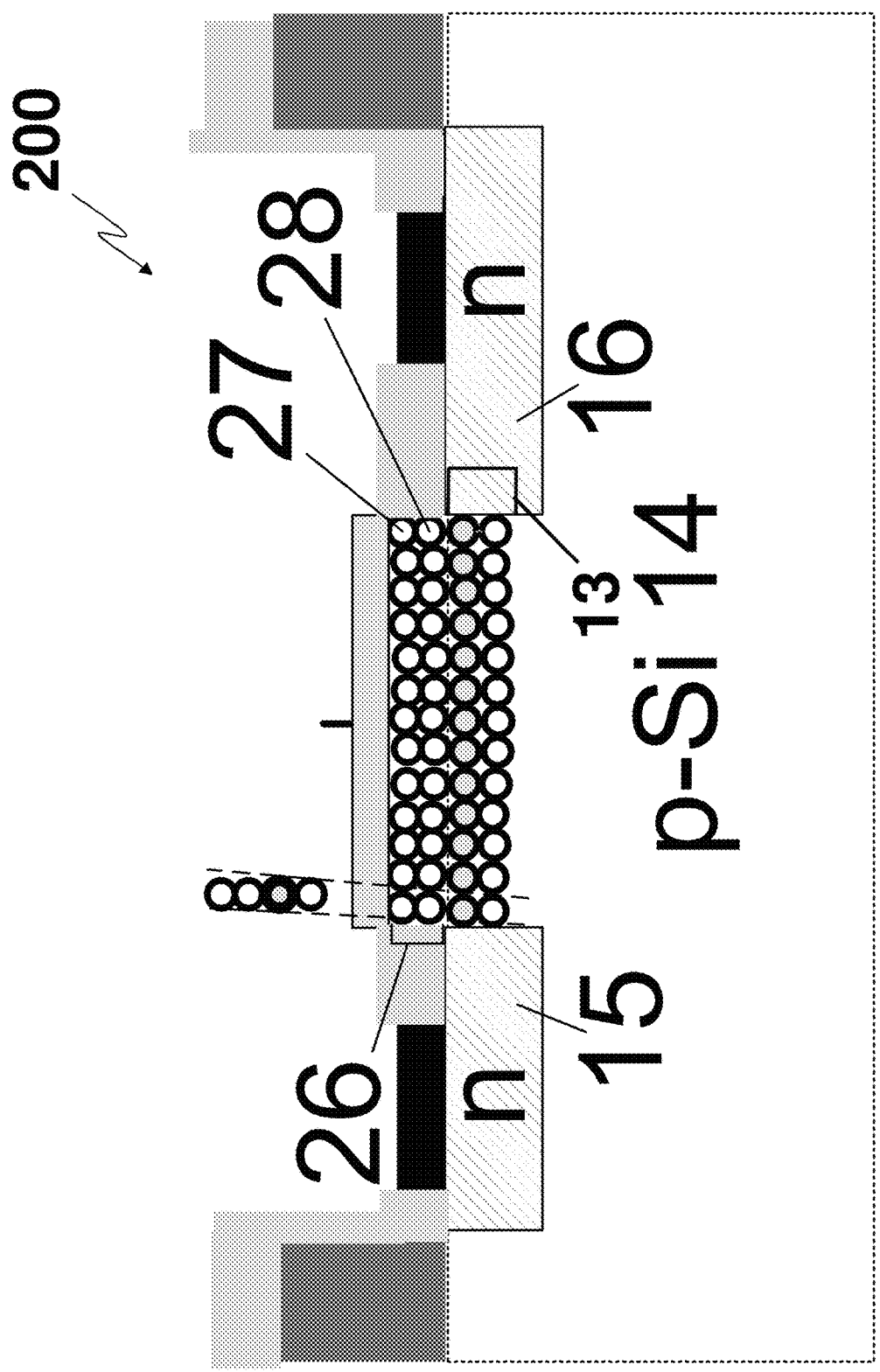
FIG. 3c is a schematic block diagram of a QDC-FET having a quantum dot gate, in accordance with still yet another embodiment of the present invention.

FIG. 3c shows still yet another embodiment of a QDC FET structure 200 which includes an additional set of quantum dot layers 26 which may include two (or more) cladded quantum dot layers 27 (top) and 28 (bottom) comprised of cladded Si quantum dots that form the quantum dot gate, over the first set of quantum dot layers 13 (110 and 12) forming the quantum dot channel shown in FIG. 3b. In the structure of FIG. 3c, the difference is in the construction of the transport channel which is comprised of quantum dots.

Figure 3D:
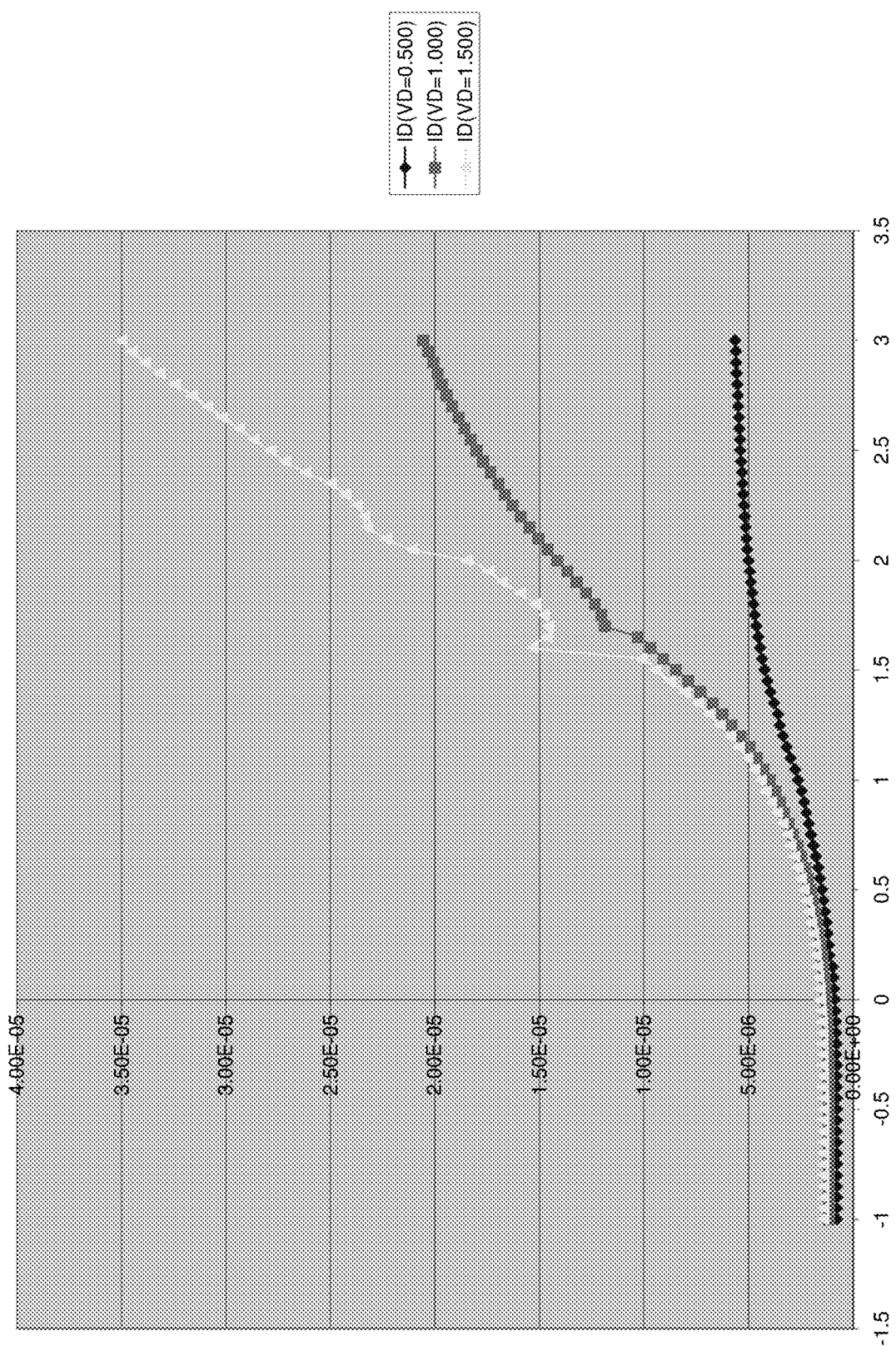
FIG. 3d is a graph showing the drain current (ID)-gate voltage (VG) characteristics of the quantum dot gate QDC-FET of FIGS. 3a, 3b and 3c.

For example, generally in conventional FETs, the carrier transport channel (also known as the inversion layer) is formed on the Si surface that interfaces with the gate insulator (SiO2 or HfO2 etc). Using arrays of quantum dots as a conducting quantum dot channel (QDC) between the source and gate region of a FET under the gate (the QDC-FET) results in more than a 2-state FET device. The QDC transport channel has mini energy bands due to the formation of QDSL. The number of carriers in the QDSL or QDC is determined by the gate voltage (when it is above threshold) and the drain voltage (with respect to source) determines how many mini-energy bands are participating in current conduction. This gives rise to multi-state behavior as shown in FIG. 3d.

Figure 3E:
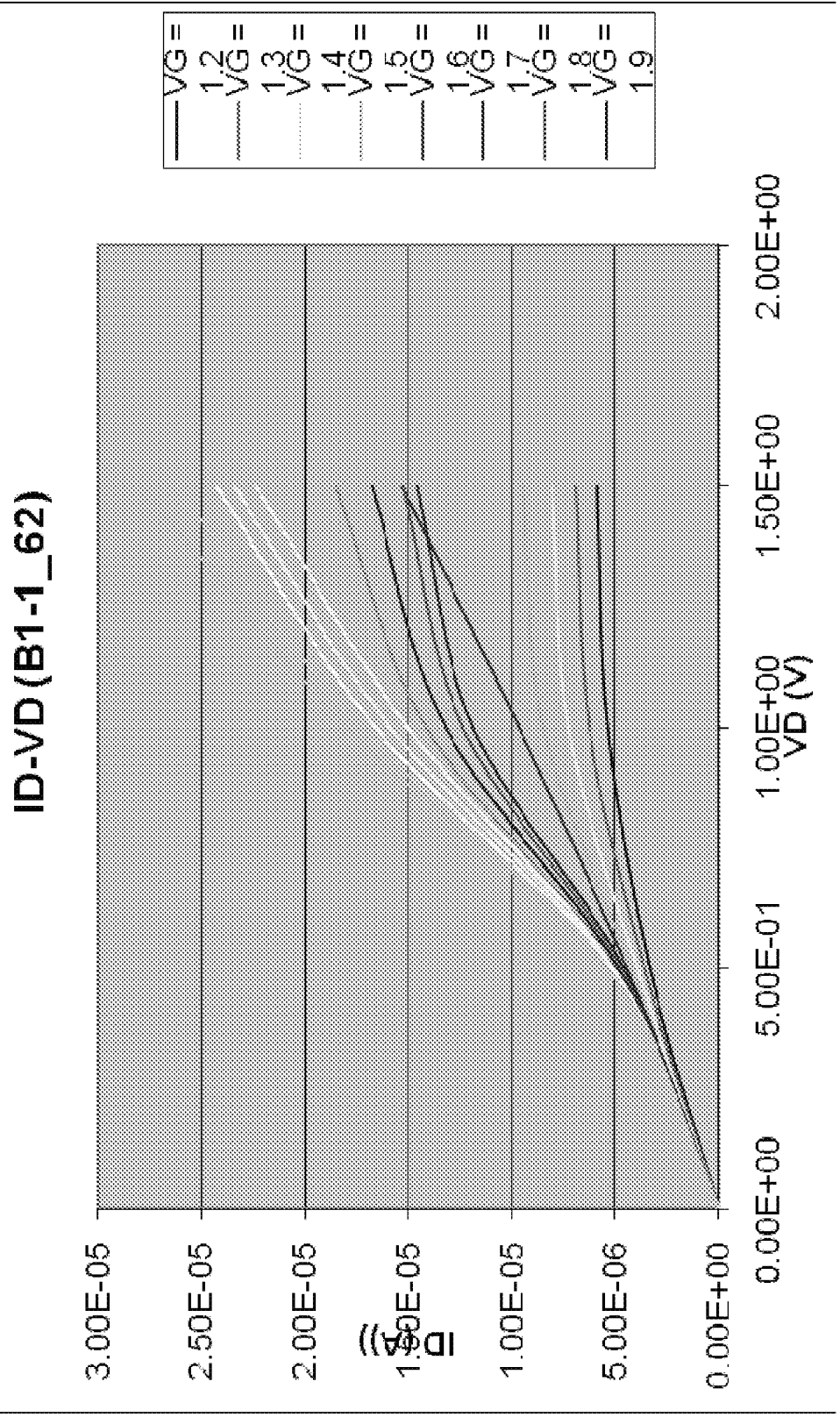
FIG. 3e shows is graph showing the drain current (Id)-drain voltage (Vd) characteristics at various gate voltages for the quantum dot gate QDC-FET of FIGS. 3a, 3b and 3c.

In accordance with the invention, there are distinct regimes of operation of the QDC-FET depending on the gate voltage and drain voltage. In conventional FETs, there are only two states in the ID-VG plot. This is in contrast to the present invention (See FIG. 3d) which has an OFF state below the threshold voltage (Vth equal to about 0.3 V), another state when the first jump appears at about 1.5V (between about 0.3 to about 1.5V), still yet another state at about 2V (that is, between about 1.5V and about 2V), and still yet another state above 2V. Depending on the superlattice minibands and their separation, even more states are possible. FIG. 3d and FIG. 3e illustrate an example of the transfer characteristics (drain current ID-gate voltage VG) and output characteristics (ID-VD), respectively, for the structure of FIG. 3c. As can be seen from FIG. 3d, the transfer characteristics show quantized "intermediate states" as the drain voltage is increased for a given gate voltage. FIG. 3d shows the drain current-drain voltage characteristics as a function of gate voltage, showing clearly three different regimes in which the FET is operated. The QDC channel characteristics, when combined with a multi-state spatial wavefunction-switched (SWS) structure (comprised of coupled quantum well layers), are further modified in terms of number of intermediate states (that would further enhance the number of bits that can be processed in such a device). Thus, QDC-FETs could function in a manner similar to single electron transistors.

Figure 4A:
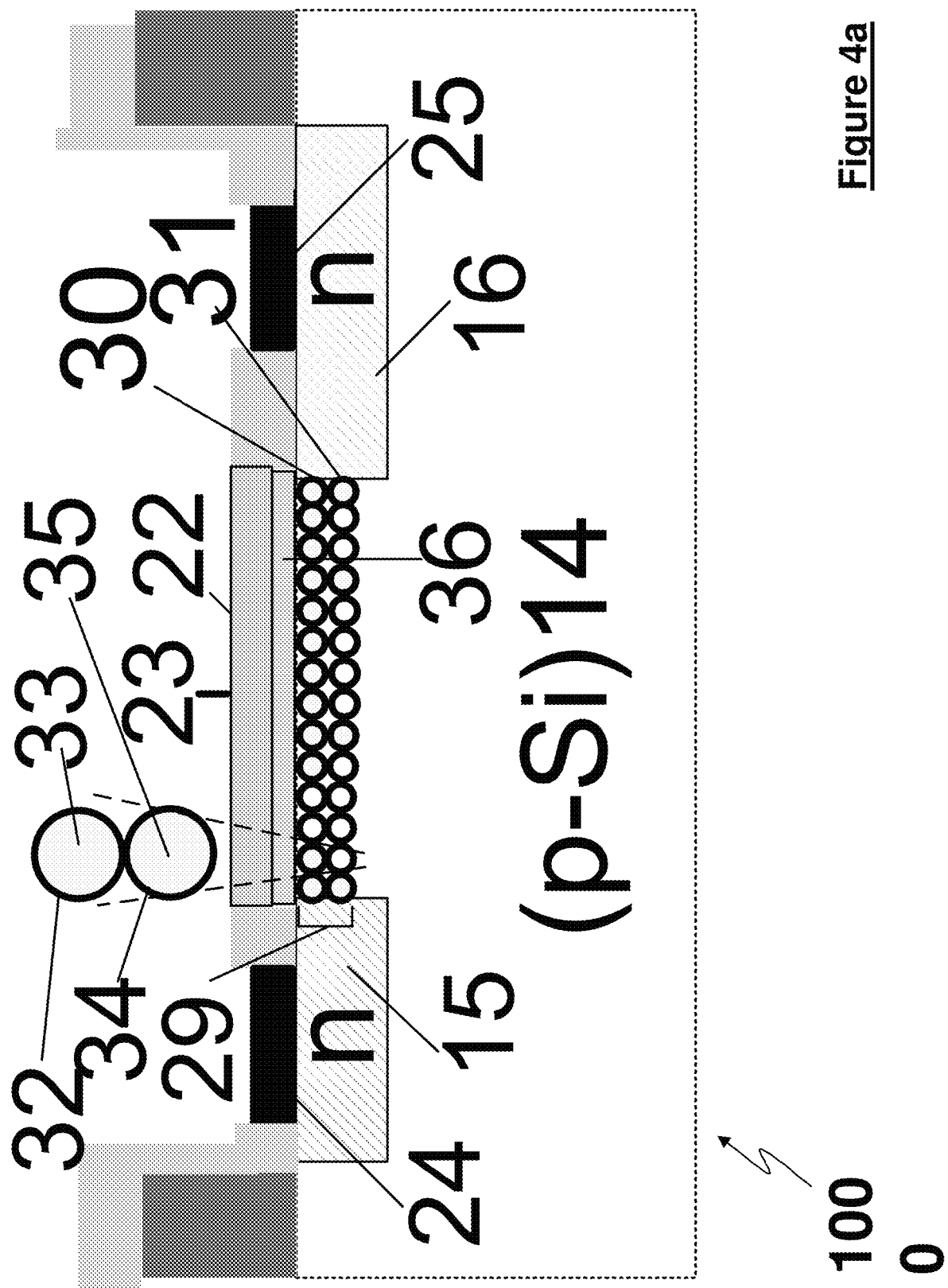
FIG. 4a is a schematic block diagram of a QDC-FET incorporating $GeO_x$-cladded Ge layers to form the quantum dot channel, in accordance with the present invention.
Figure 4B:
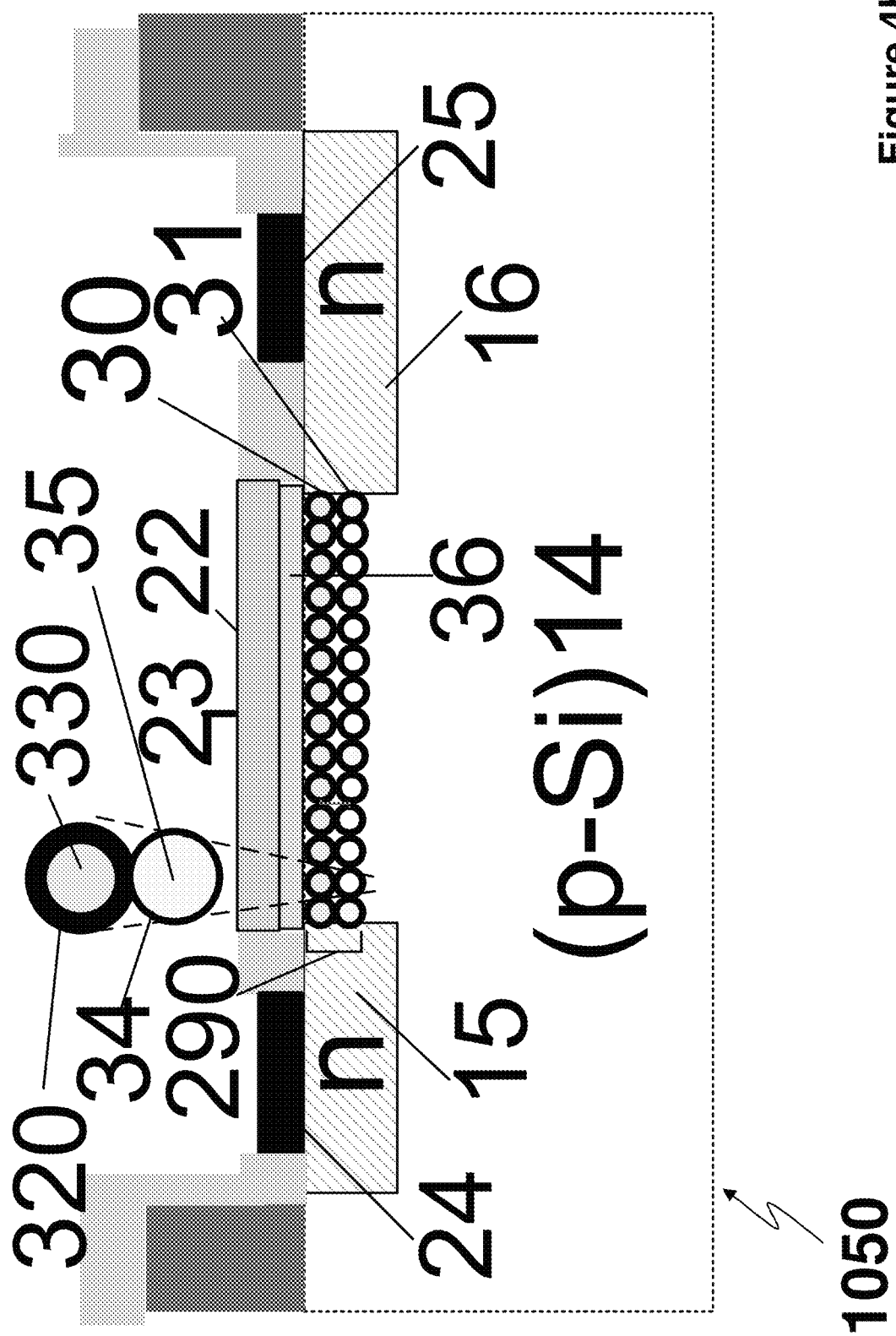
FIG. 4b is a schematic block diagram of a QDC-FET having two asymmetric GeOx-cladded Ge dot layers (wherein the top layer has thicker cladding), in accordance with the present invention.

Referring to FIG. 4a, a QDC-FET 1000 incorporating $GeO_x$-cladded Ge layers which form the quantum dot channel 29 is shown. In this case, two layers 30, 31 of $GeO_x$-cladded Ge quantum dots are site-specifically self-assembled to form a transport channel 29 which serves as an n-channel on a p-Si region 14 between the source region 15 and the drain region 16. The top quantum dot layer 30 has a thin $GeO_x$ cladding 32 on Ge quantum dots 33. The cladding 34 and quantum dot 35 forming the bottom quantum dot layer 31 in the channel 29 is also shown. The exploded inset view shows the details of the cladding and dot regions. The top quantum dot layer 30 is deposited with a thin gate insulator layer 36 which may be constructed from $HfO_2$, SiON, $Al_2O_3$, any combination thereof and/or any other suitable gate insulator film material or combination of materials. FIG. 4b shows another embodiment of a $GeO_x$—Ge QDC-FET 1050. Here, the two layers of quantum dots 30, 31 forming the channel 290 are asymmetric in construction, wherein the quantum dots in the upper quantum dot layer 30 has a thicker cladding 320 and smaller core diameter 330 than the quantum dots in the bottom quantum dot layer 31 whose dot cladding is 34 and dot diameter is shown as 35. It should be appreciated that quantum dots are typically between about 2 nm to about 5 nm and cladding is typically about 1 nm to about 2 nm. Moreover, quantum dots could be thicker (about 6 nm to about 9 nm) but the cladding typically remains around about 1 nm to 2 nm. (these sizes could be more or less than the above ranges as desired).

Figure 4C:
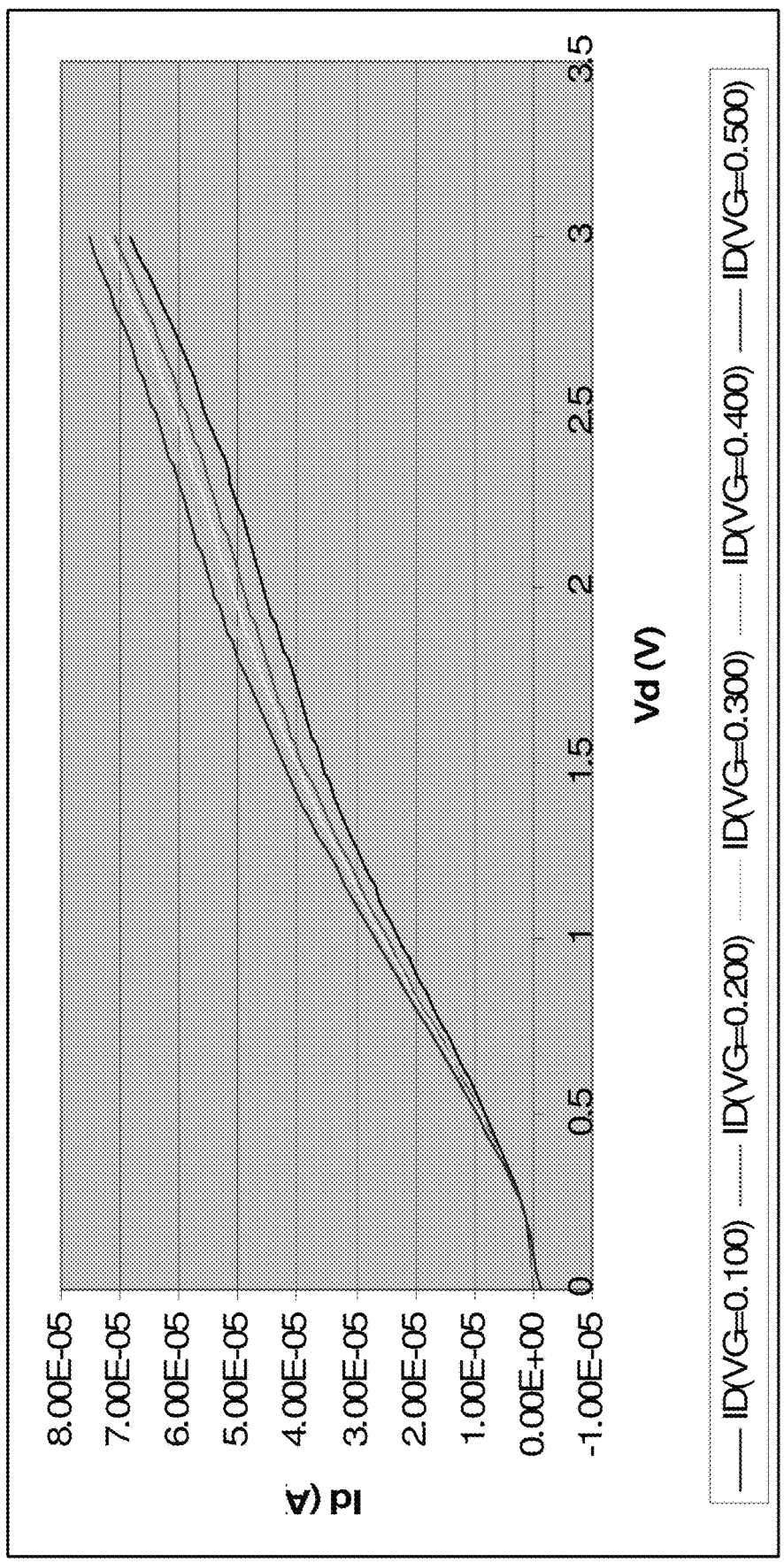

FIG. 4c shows the drain current (Id)-drain voltage (Vd) characteristics as a function of the gate voltage where $HfO_2$ is used as a gate insulator 36 for the QDC-FET 1000 of FIG. 4a. It should be appreciated that the QDC-FET is a generic FET device as is evident from FIGS. 4a-4c where $GeO_x$-cladded-Ge quantum dots have been used to form the channel on Si substrates. Similarly, these dots can be formed to realize QDC-FET on other semiconductor thin films and substrates as desired. It should be appreciated that Ge quantum dots have an advantage of higher mobility channel than Si.

Figure 5A:
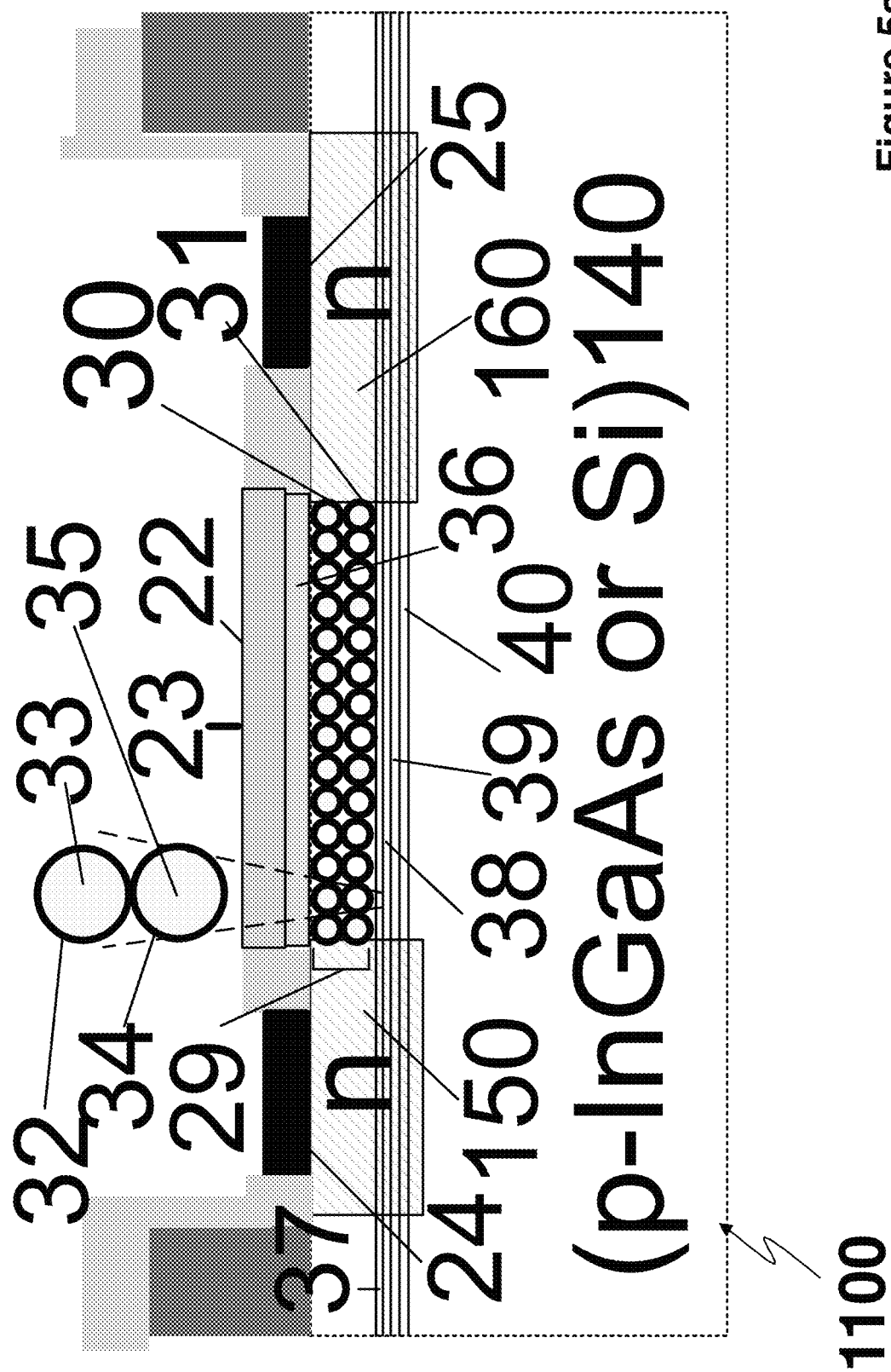
FIG. 5a is a schematic block diagram of a QDC-FET incorporating two quantum well layers as used in spatial wavefunction-switching (SWS) transistors as well as a quantum dot gate layer forming the floating gate, in accordance with the present invention.

Referring to FIG. 5a, a QDC-FET 1100 which incorporates two quantum well layers 37, 39 as used in spatial wavefunction-switching (SWS) transistors as well as a quantum dot gate layer to form the floating gate is provided, in accordance with another embodiment of the present invention. As shown, the QDC-FET 1100 incorporates two quantum well layers 37 and 39 (sandwiched between two barrier layers 38 and 40) grown on a substrate 140, such that the quantum dot channel 29 (comprised of two (could be one or more) quantum dot layers 30 and 31) is realized on the coupled quantum well structure. This quantum well channel and quantum well spatial wavefunction-switching (SWS) structure (comprised of quantum wells and barriers) are contacted by a source 150 and a drain 160. Depending on the material systems used, these regions may be implemented using selective etching and n+ regrowth of layers that provide electrical contacts to the quantum wells as well as the quantum dot channel 29. It should be appreciated that generally the cladded quantum dot layers and asymmetric coupled quantum well layers operate in cooperation. For example, first the inversion electrons appear in the coupled quantum well structure as the gate voltage approaches a threshold voltage. An additional increase in the gate voltage moves the electron charge to the upper quantum well and subsequently to the quantum dot channel 29. It should be appreciated that as used herein asymmetry may apply to different thicknesses and/or different material compositions.

Figure 5B:
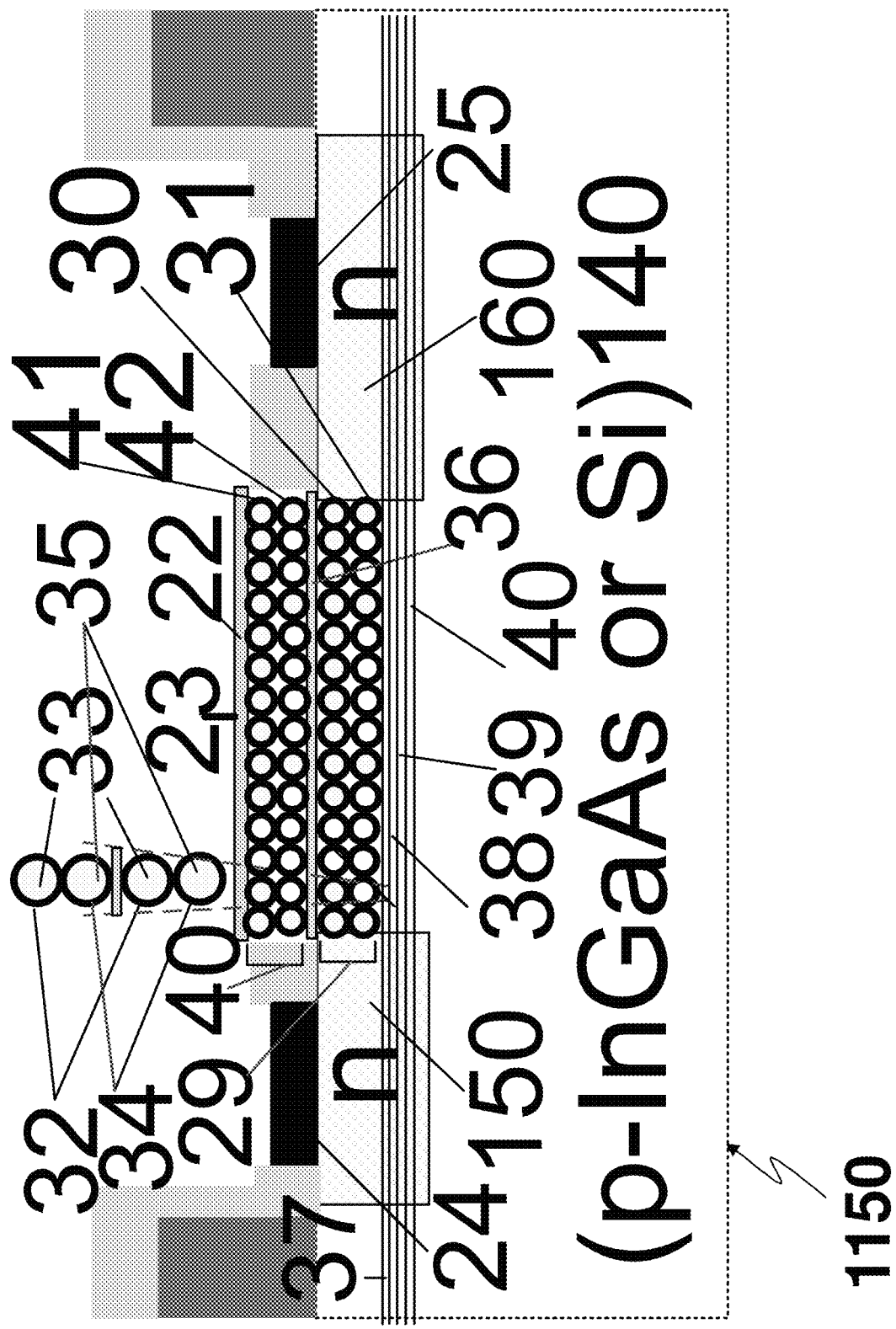
FIG. 5b is a schematic block diagram of a QDC-SWS and QDG FET, in accordance with the present invention.

FIG. 5b shows a QDC-FET 1150 in accordance with another embodiment of the invention, where in addition to the SWS structure a quantum dot gate structure is also incorporated in the gate region. As shown, a quantum dot gate layer 40 is located above the gate insulator layer 36 and is comprised of a cladded quantum dot top layer 41 and a cladded quantum dot bottom layer 42. It should be appreciated that the construction of the cladded quantum dot layers 41, 42 may be similar or different in terms of their cladding and dot materials as well as their thickness. FIG. 5b shows similar quantum dots 41, 42 as that used to form the quantum dot channel 29, where the claddings 32 and 34 and quantum dots 33 and 35 are similar. It should be further appreciated that the top quantum dot layer 41 may be deposited with a gate material 22 and its electrical contact 23 is shown like other figures. It should be further appreciated that the gate material may be selected from a metal (such as TiN, TaN or other suitable material) or it could be a semiconductor material. Its work function (relative to the channel layer work function) determines the flat band voltage and the threshold voltage.

Figure 5C:
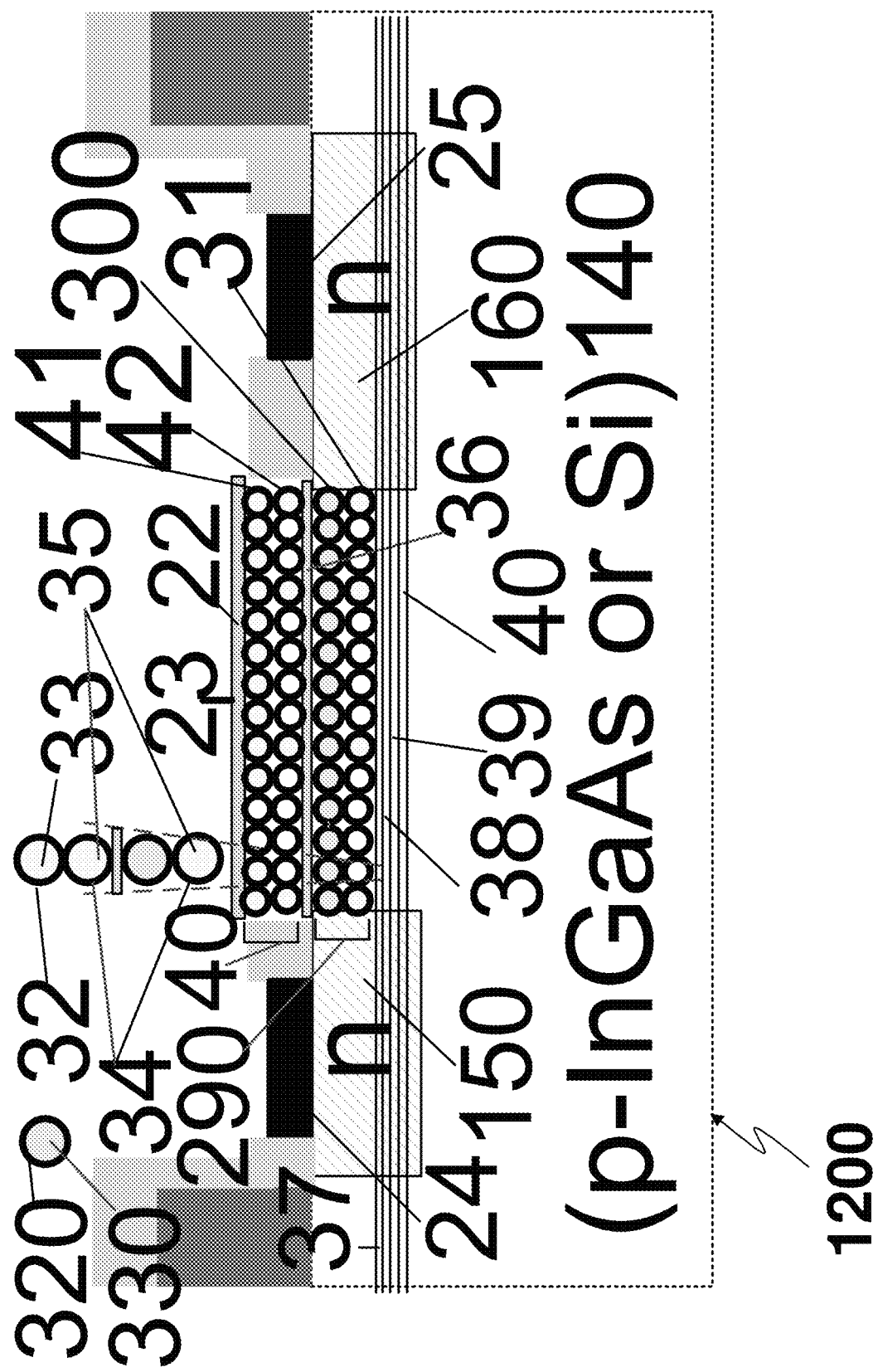
FIG. 5c is a schematic block diagram of a QDC-SWS and QDG FET having asymmetric quantum dot layers, in accordance with the present invention.

FIG. 5c shows a QDG QDC-SWS FET device 1200 in accordance with another embodiment of the invention. In this case, the quantum dot layers forming the quantum dot channel 290 utilize asymmetric quantum dots in their quantum dot bottom layer 31 and quantum dot top layer 300. The top quantum dot core is shown as 330 and its cladding is shown as 320. It should be appreciated that the dot layers are of different dot diameter and cladding thickness. Of the QDC channel 290, the top cladded QD layer 300 has a different cladding thickness and dot diameter than in QD layer 31. The rest of the structure is similar to that of FIG. 5b.

Figure 6:
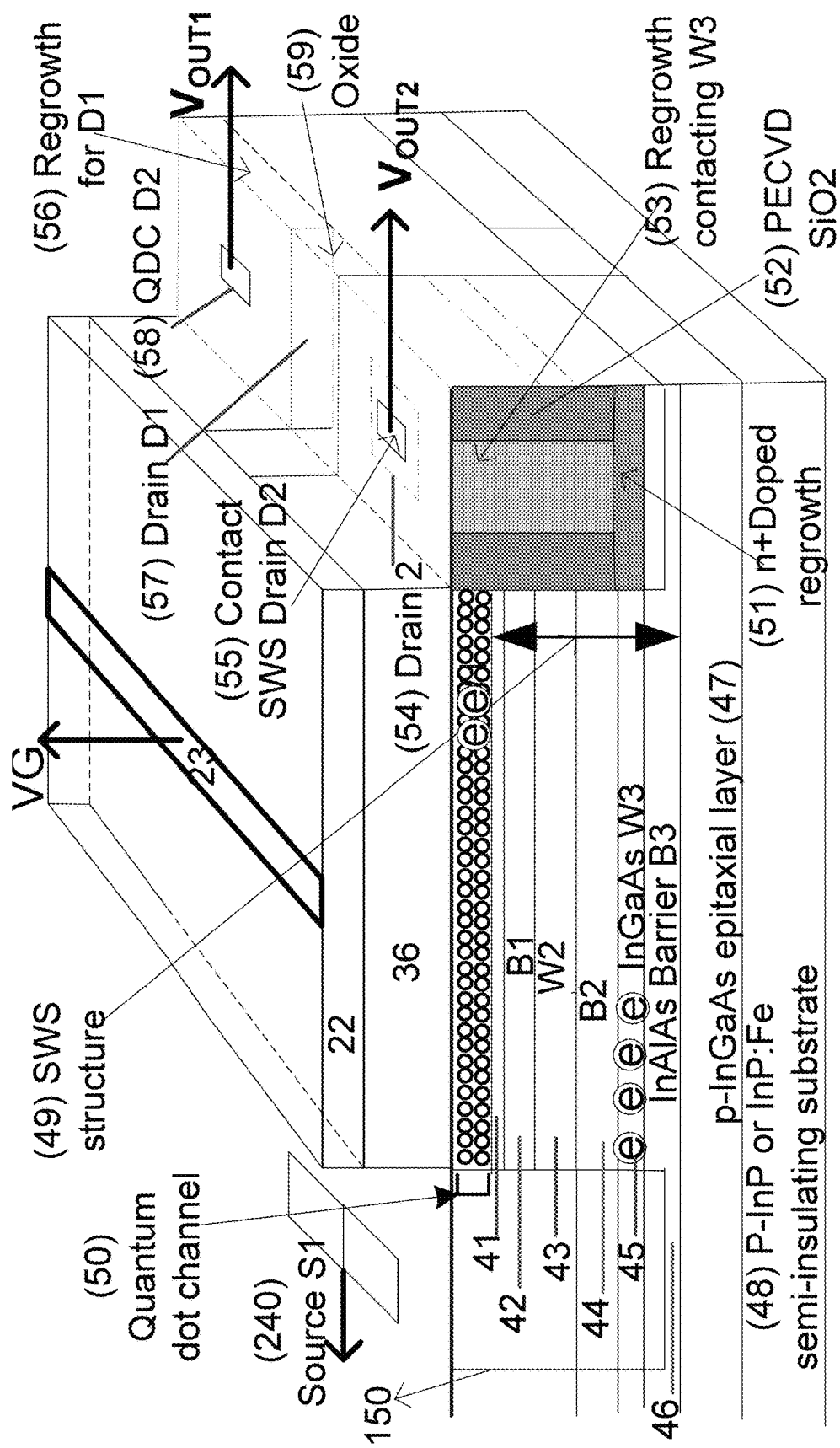
FIG. 6 is a 3-D schematic block diagram of a QDC channel combined with 3-InGaAs quantum well SWS structure, in accordance with the present invention.

FIG. 6 shows a 3-D view of a device having a QDC channel combined with 3-quantum well SWS structures that use InGaAs wells. In this case, well W1 41 is sandwiched between QDC layer 50 and barrier B1 42, well W2 43 is between two barrier layers 42 and 44, and well W3 45 is sandwiched between barrier 44 and barrier B3 46. The SWS structure 49 is grown on a p-InGaAs epitaxial layer 47 which is grown on a substrate 48 (comprised of p-InP, Fe-doped simi-insulating InP, and p-InGaAs on Si). It is contemplated that other suitable materials may be used. The SWS structure 49 can be realized by having a quantum dot channel (QDC) 50 which uses site-specific self-assembly of GeO$_x$-cladded Ge quantum dots (like layers 30 and 31 in FIG. 4*a*) on SWS quantum well structures. In one embodiment, the QDC-SWS structure may have one source region 150 (e.g. which may be an n+InGaAs layer achieved by re-growth technique) and its contact 240. Additionally, there may be two drains 57, 54, where one of the drains 54 (drain 2) contacts the lowest quantum well 45 and the other drain 57 (drain 1) contacts one or both of the quantum dot layers forming the QDC 50. The drain 54 (drain D2) has a contact 55 which is shown to be implemented using n+ regrowth 54, oxide isolation 53, and n+ regrowth 53. The drain 57 (drain D1) is realized by having regrowth region 56 in a manner that it is isolated from the other drain 54 (drain D2) by an insulating region 59. Drain D1 region 57 is contacted by contact 58 which forms one of the two outputs ($V_{out1}$ and $V_{out2}$) that are isolated. The gate insulator 36 is deposited on the top quantum dot layer of the QDC 50. The gate material is shown as 22 and the gate contact is shown as 23. In another embodiment, one could realize twin drain structure wherein each quantum dot layer is contacted separately without having a SWS structure.

Figure 7A:
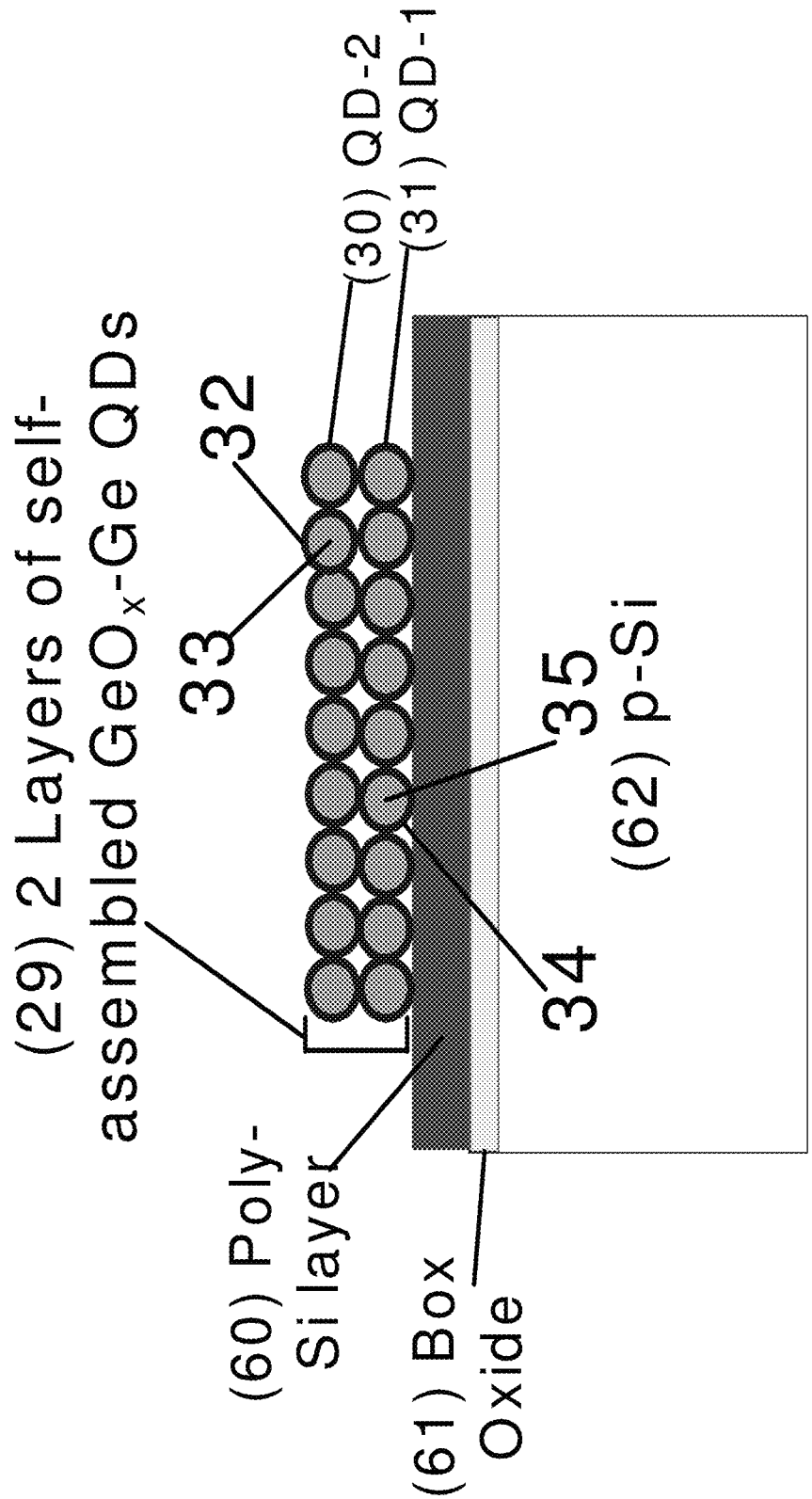
FIG. 7a schematic block diagram showing self-assembly of cladded GeOx-ge dots on p-poly Si, in accordance with the present invention.

FIG. 7*a* shows the deposition of GeO$_x$-cladded Ge quantum dot layers 30, 31, (respectively labeled as QD-2 and QD-1) on p-poly-Si 60. In this case, poly-Si is deposited on a silicon oxide layer 61 which is grown on a Si substrate or other suitable substrate material. This shows that cladded quantum dots can be deposited and a QDC FET can be fabricated on a poly-Si layer. In one embodiment, a stack of quantum dot layers, sandwiched between appropriate electrodes, can be used to fabricate ultrahigh value capacitors using series and parallel interconnects.

Figure 7B:
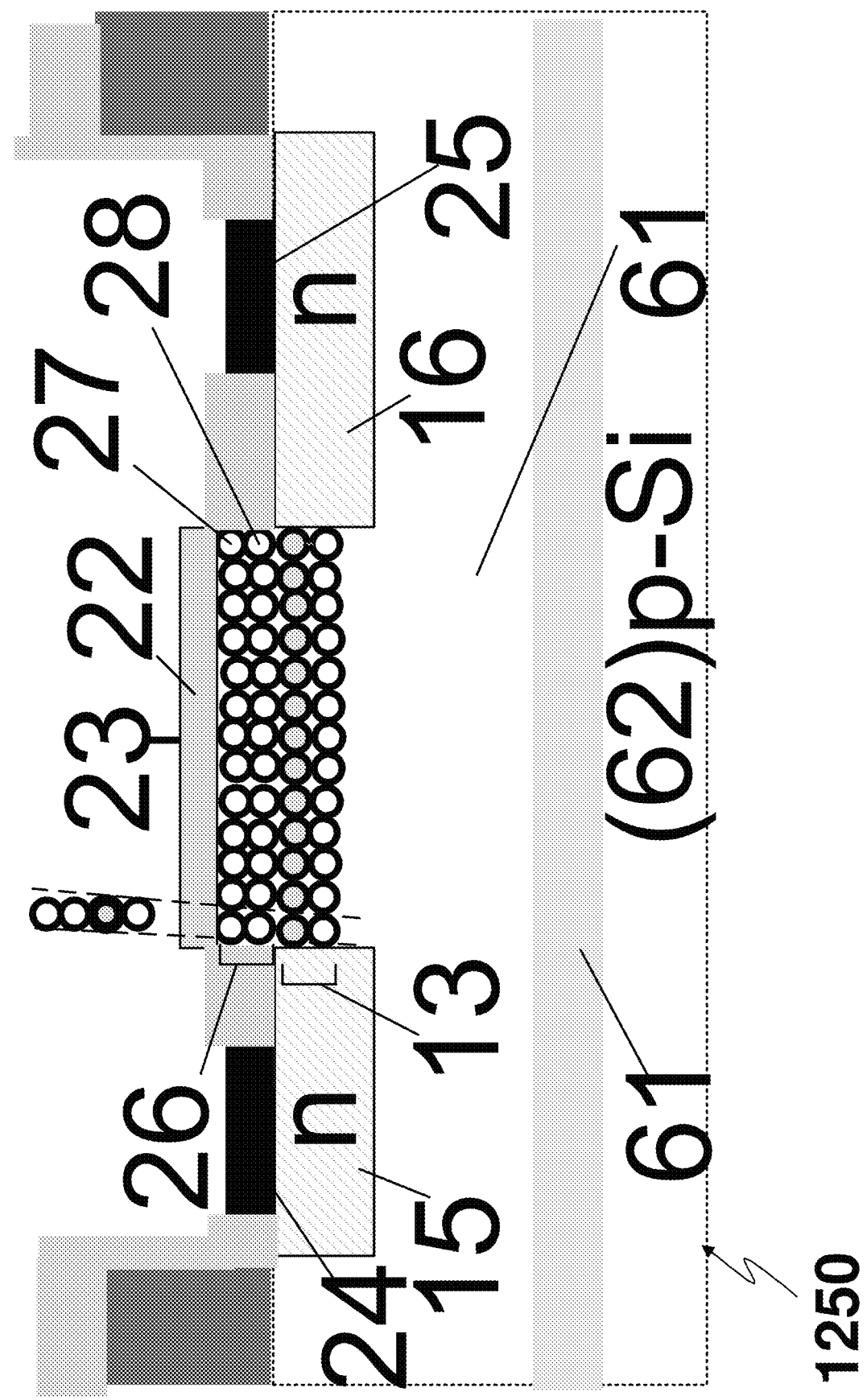
FIG. 7b is a schematic block diagram of a QDC FET in thin film transistor (TFT) configuration shown on a p-poly-Si layer, in accordance with the present invention.

FIG. 7*b* shows the schematic cross-section of a QDC-FET 1250, using SiO$_x$—Si quantum dot channel 13 self-assembled on a p-type poly-Si thin film. These quantum dot layers are similar to those shown in FIG. 3*b* and FIG. 3*c* where they were assembled on crystalline Si. In this case, the QDC dot layer is like 13 (See FIG. 3*b*) which have two layers of dots 110 and 12. It also has another set 26 of SiO$_x$—Si quantum dots which include a quantum dot top layer 27 and a quantum dot bottom layer 28.

Figure 7C:
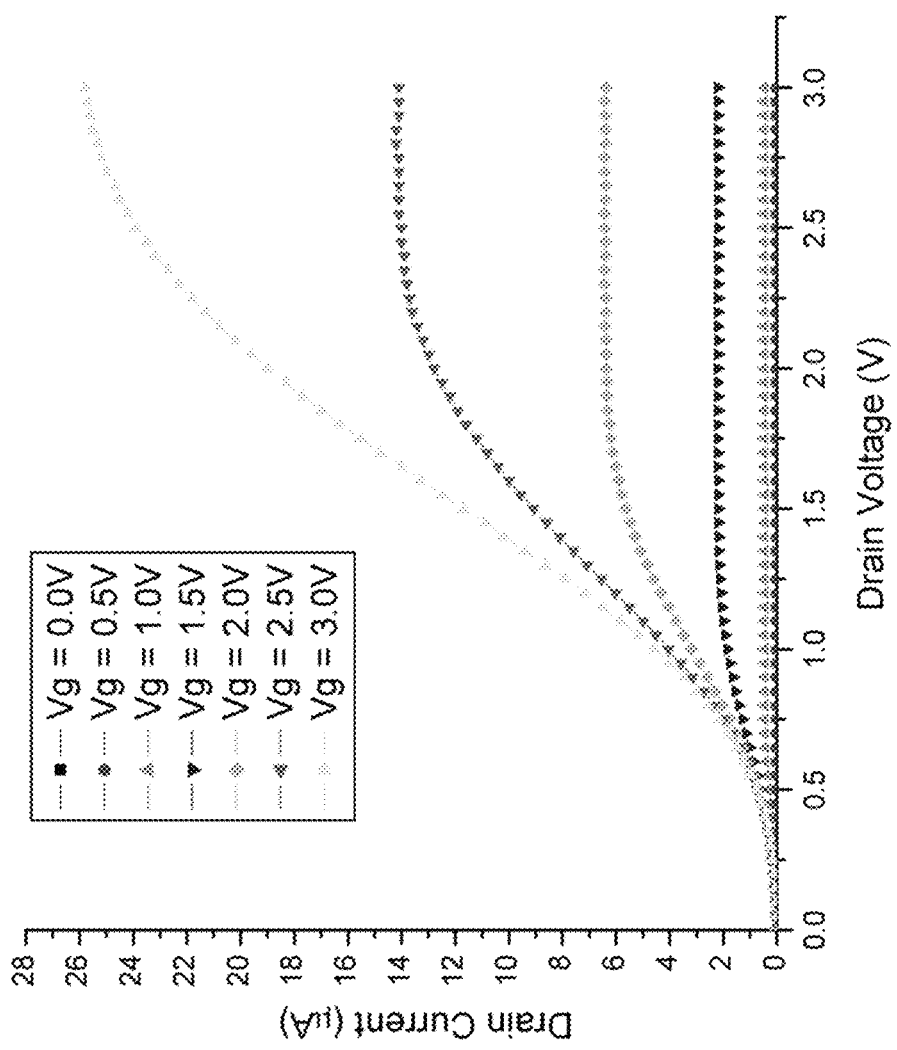
FIG. 7c is a graph illustrating the Id-Vd characteristics of the QDC-FET of FIG. 7b for varying gate voltages.
Figure 7D:
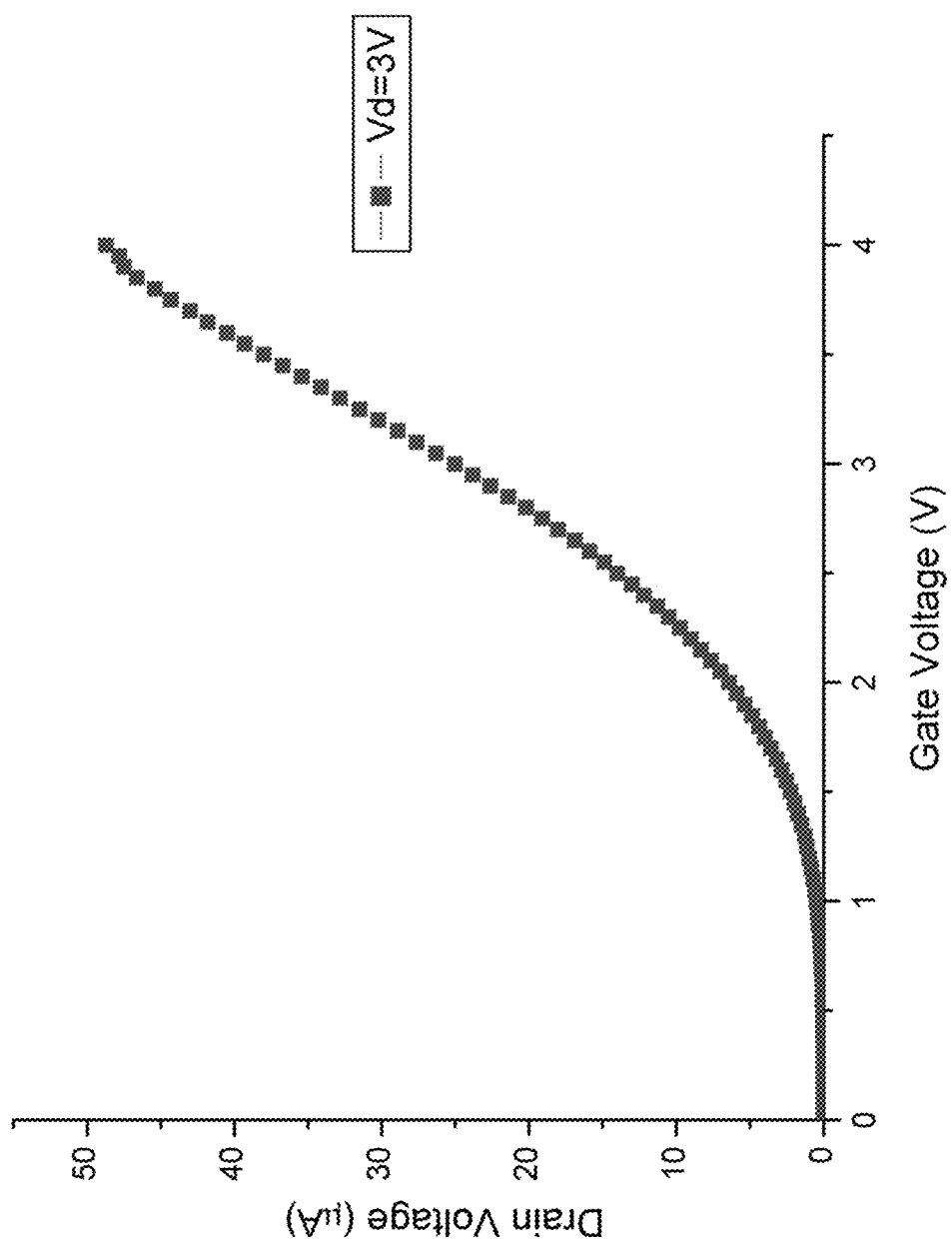
FIG. 7d is a graph illustrating the Current voltage transfer characteristics of a fabricated device shown in FIG. 7b.

FIG. 7*c* and FIG. 7*d* show the drain current-drain voltage and drain current and gate voltage characteristics, respectively of the QDC-FET 1250. It should be appreciated that QDC-FETs having higher channel mobility can thus be envisioned in materials which are poly-crystalline. They can also be used as thin film transistors (TFTs) for display and other applications.

FIG. 8*a* shows a device 1300 having a two layer (a quantum dot upper layer 64 and a quantum dot bottom layer 65) quantum dot channel 63 with three quantum dots. In this case, part of the upper layer quantum dot core 67 (which may be comprised of Si, Ge) is partially cladded with oxide 66 (SiOx for Si and GeOx for Ge) and the upper part 68 is cladded with other semiconductor layer (which may be comprised of II-VI, III-V, ternary and quaternary semiconductors). In the case of two or more layers quantum dot channel QDC, the oxide cladding (such as SiOx or GeOx as the case may be) from the top layer of QDots is removed to expose the semiconductor core. This is followed by growth of a lattice matched semiconductor layer 68 which may be comprised of Si, Ge, II-VI (such as ZnS, ZnMgSSe etc), III-V layer. This layer having a smaller barrier would modify the characteristics of the FET. In one embodiment, this would enhance mobility of the carriers in the quantum dot channel, where an inversion layer is formed. The layer 68 is deposited with a gate material 71 which may be comprised of lattice-matched semiconductors, HfO2, and/or other oxides. Finally, the gate material 72 is deposited and gate interconnect 23 is formed along with the source contact 24 and the drain contact 25.

Figure 9A:
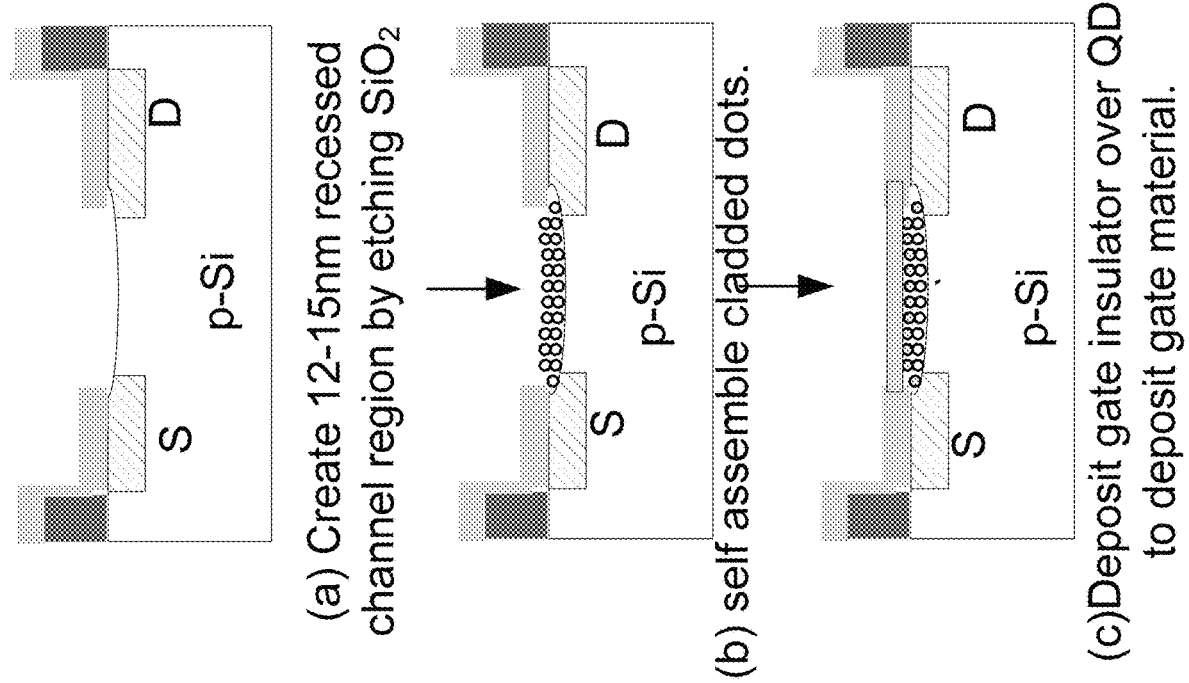
FIG. 9a is a schematic block diagram that illustrates an overall method of fabricating a quantum dot channel device, in accordance with the present invention.
Figure 9B:
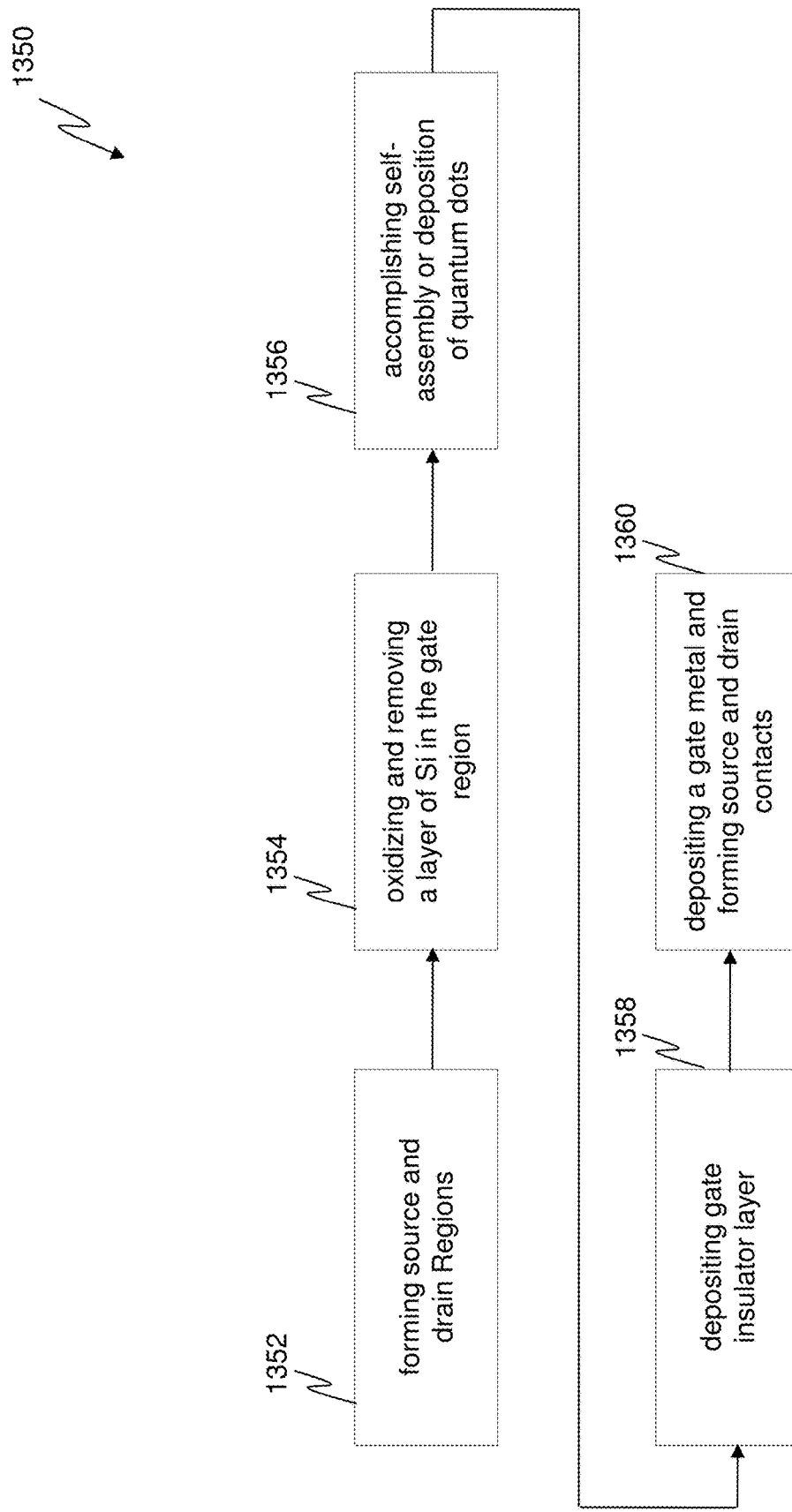
FIG. 9b is an operational block diagram that illustrates an overall method of fabricating a quantum dot channel device, in accordance with one embodiment of the present invention.

Referring to FIG. 9*a* and FIG. 9*b*, an operational block diagram 1350 illustrating a method of fabricating a quantum dot channel device is shown in accordance with one embodiment of the invention. Source and drain regions may be formed (this step may be at the end as well particularly when ion implants are used; we describe formation of long channel QDC-FETs) as shown in operational block 1352. A layer of Si is oxidized in the gate region and removed (forming a recessed region as shown in the FIG. 9*a* of the three cross-sectional schematics), as shown in operational block 1354. The self-assembly of cladded quantum dots or deposition of quantum dots is accomplished, as shown in operational block 1356 (depending on the application). A gate insulator layer is then deposited, as shown in operational block 1358. It should be appreciated that oxidizing part of SiOx cladding in the top QD layer can also be used and/or a combination of HfO2 and SiOx cladding can serve as the gate insulator. A gate metal is deposited and source and drain contacts are formed, as shown in operational block 1360. The procedure would vary in sub 22 nm FETs where source and drain extensions having low source and drain resistance are formed (for example, in smaller channels such as 22-nm FETs, the FETs have source and drain regions with n+ regions as well as n– extension (the n– extensions contact the QDC channel or inversion layer)). The structure may vary if FinFETs type structures are configured as QDC FETs. For example, FinFETs typically use a wrap around gate (from three sides) over the channel. In this case, the gate layer wraps around the QDC channel from three sides (only the substrate side is left without wrapping).

Figure 9C:
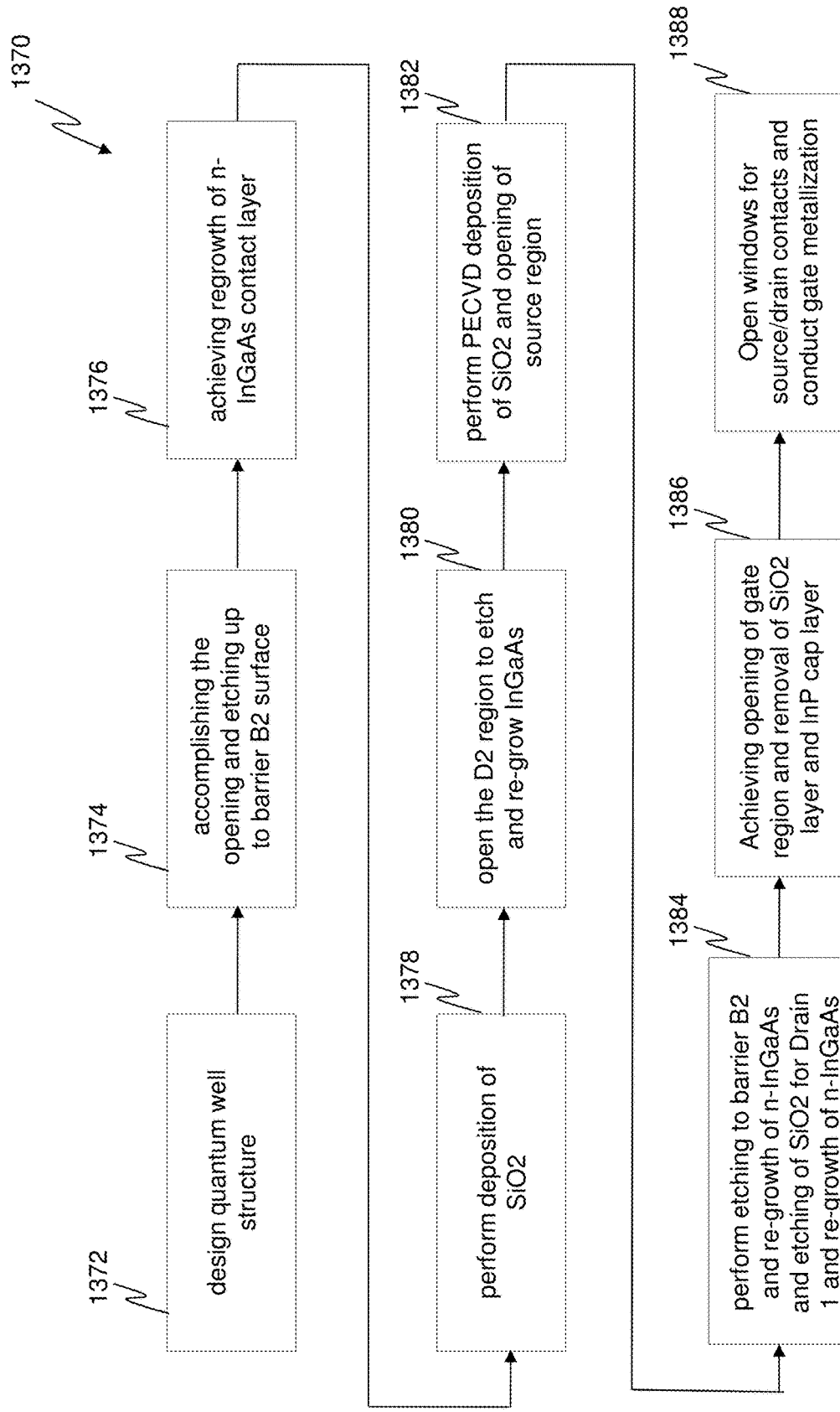
FIG. 9c is an operational block diagram illustrating a method of fabricating a quantum dot channel device with integrated SWS-channels and having twin drains, in accordance with one embodiment of the present invention.

It should be appreciated that for a QDC device with integrated SWS-channels and having twin drains (like FIG. 6), the process is little bit more involved. Referring to FIG. 9*c*, an operational block diagram 1370 illustrating a method of fabricating a quantum dot channel device with integrated SWS-channels and having twin drains is shown in accordance with one embodiment of the invention. The quantum well structure is designed, as shown in operational block 1372. The opening of drain D2 and etching up to the barrier B2 surface is then accomplished, as shown in operational block 1374. The regrowth of n-InGaAs contact layer is achieved, as shown in operational block 1376 and the deposition of SiO2 (via plasma enhanced chemical vapor deposition, PECVD) is performed, as shown in operational block 1378. Another mask is used to open the D2 region to etch SiO2 and re-grow InGaAs, as shown in operational block 1380, and PECVD deposition of SiO2 and opening of the source region is performed, as shown in operational block 1382. Etching to barrier B2 and regrowth of n-InGaAs is performed and etching of SiO2 for drain D1 and re-growth of n-InGaAs is accomplished, as shown in operational block 1384. Opening of the gate region and removal of the SiO2 layer and InP cap layer, followed by MOCVD growth of II-VI and/or another gate insulator layer is achieved, as shown in operational block 1386. At this point, the growth of II-VI (wide energy gap ~4 eV) gate insulators may be followed by opening the windows for the source/drain contacts (which involves wet or dry etching of the II-VI insulator, and deposition of source/drain Ohmic contacts), and the gate metallization may be conducted, as shown in operational block 1388. These masks may be used to fabricate SWS-FETs as desired (with asymmetric 3-coupled quantum wells on Si/SiGe and InGaAs-AlInAs epitaxial wafers).

Referring to FIG. 10a to FIG. 10e a nonvolatile memory is provided showing quantum dot set #1 forming the floating gate (G1) and quantum dot set #2 forming a channel that can facilitate charge removal from quantum dots in the floating gate region (over thin oxide) during the erase cycle.

Figure 10A:
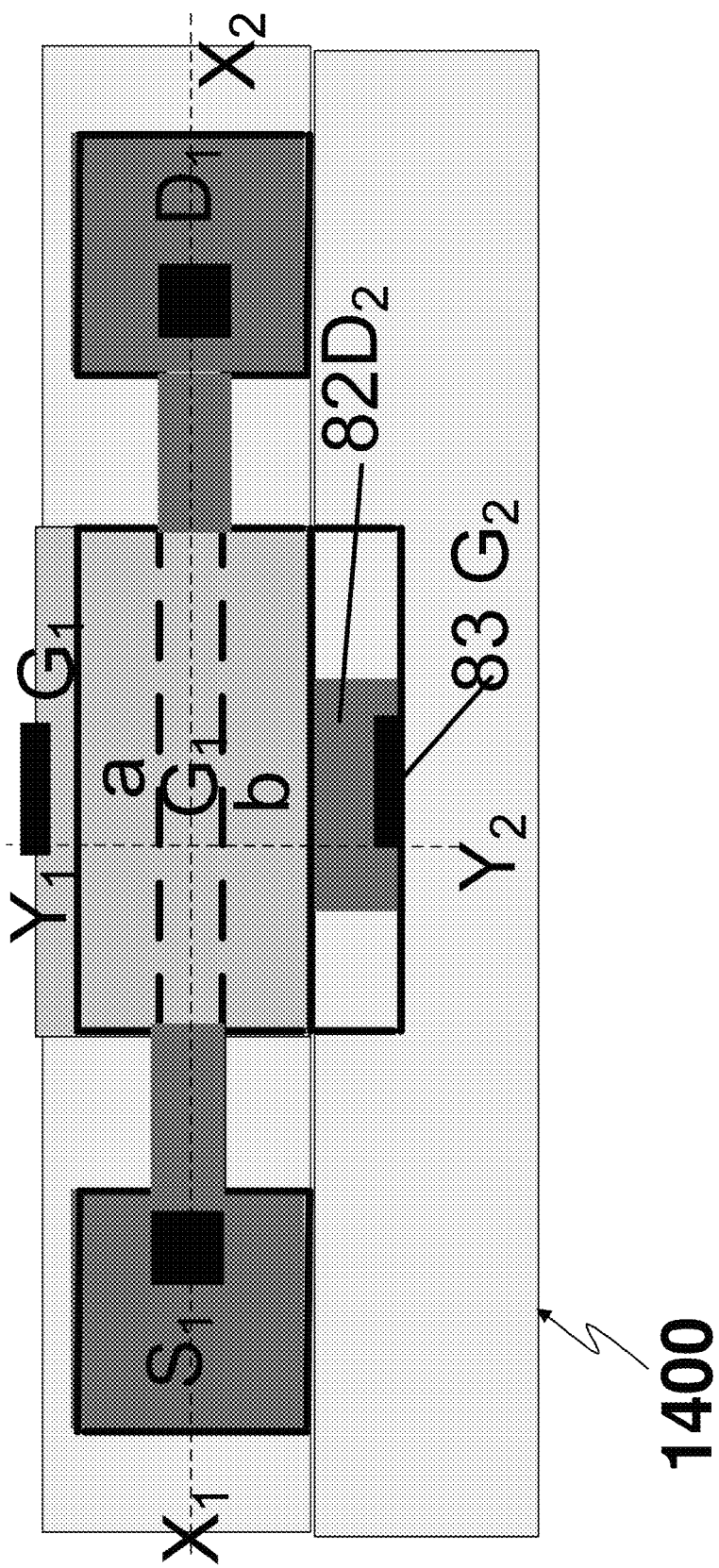
FIG. 10a is a schematic block diagram showing the top view of a nonvolatile random access memory, in accordance with the present invention.
Figure 10B:
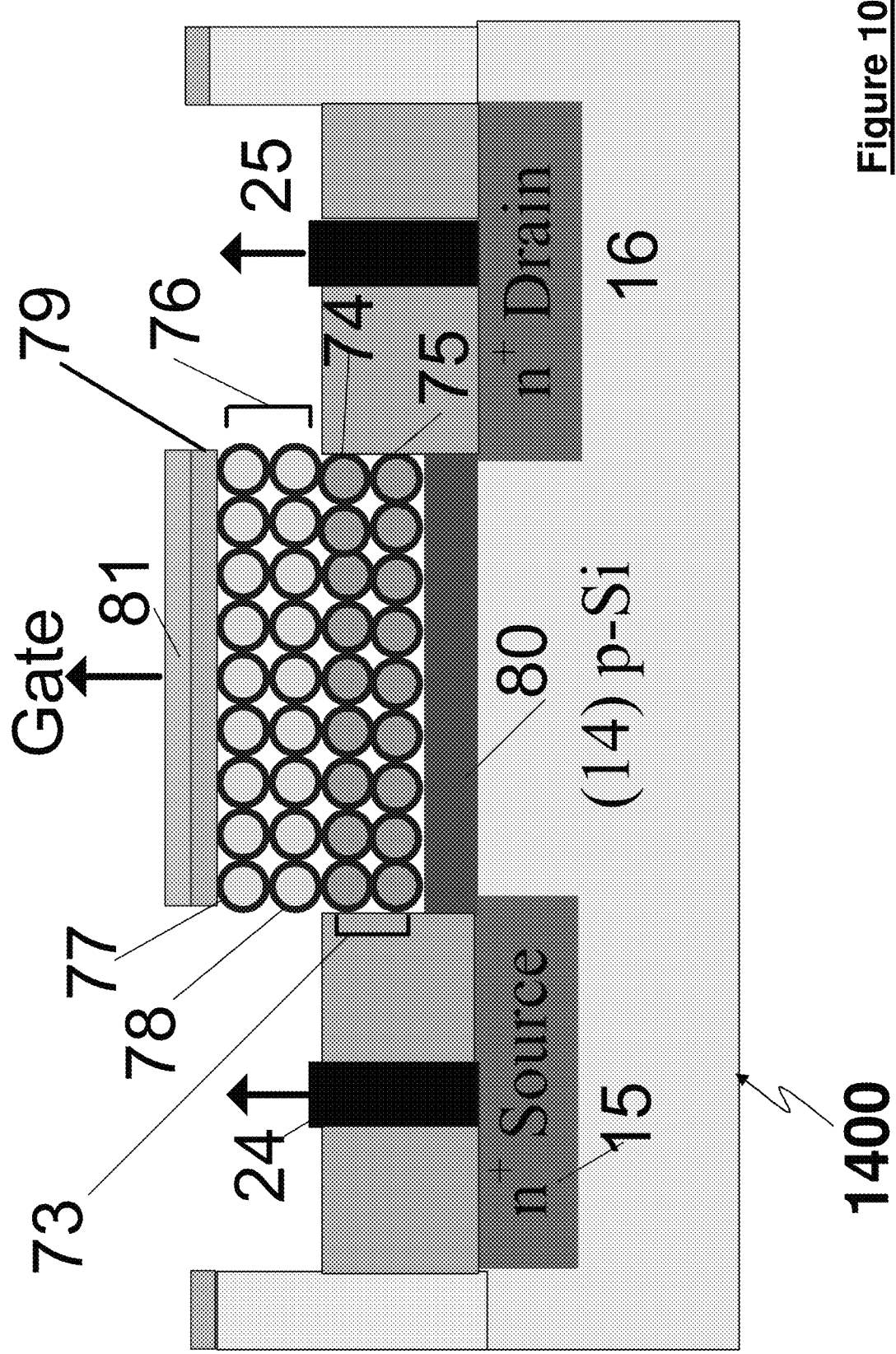
Figure 10C:
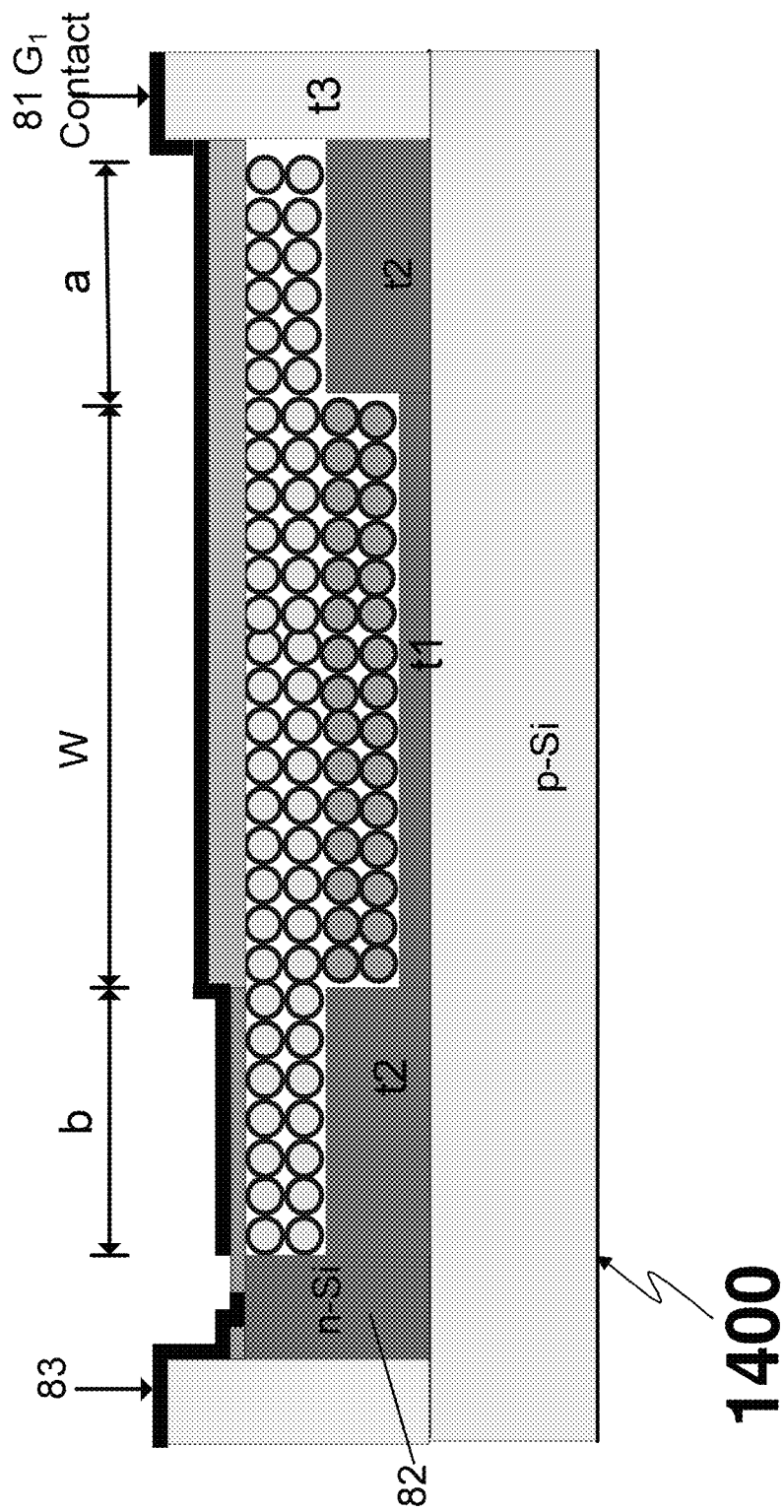

One embodiment of a nonvolatile random access memory (NVRAM) cell 1400 is shown in FIG. 10a, FIG. 10b and FIG. 10c and integrates features of a floating quantum dot gate (QDG) FET and a quantum dot channel FET. FIG. 10a shows the topological view of the NVRAM cell 1400, whereas FIG. 10b and FIG. 10c, respectively, show a cross-sectional schematic view across the $X_1$-$X_2$ and the $Y_1$-$Y_2$ axes. The floating quantum dot gate transistor is formed by source 15, source contact 24, drain 16, drain contact 25, floating gate 73 (which may be comprised of cladded quantum dot layers 74 (top) and 75 (bottom)), another set 76 of quantum dot array (two layers shown as 77 and 78), a control gate insulator 79, a tunnel gate insulator 80, and a control gate material 81 (which may be comprised of metal or poly-Si, poly Ge and which is shown to have a width W and length L). The gate 81 over the FET channel region is comprised of a thin tunnel insulator 80 having a thickness t1, a first set of quantum dot layer 73 (shown as having two layers 74, 75) and a second set of quantum dots 76 (shown as two quantum dot layers 77, 78) forming the quantum dot channel. A portion of these second set of quantum dots are deposited on thicker oxide (thickness t2 in regions labeled as "a" and "b", see FIG. 10c) outside the gate G1 81 along the $Y_1$-$Y_2$ axis. That is, the QDC-FET has channel dimension of W'×L (where W'=W+a+b). Here, the n-region is labeled as 82 (D2) and acts as the electrical contact to the inversion layer produced in the second set 76 of quantum dots when an above threshold voltage is applied to the W'×L gate of QDC-FET (using G1 81 contact). Contact to the n-region 82 is shown as G2 83. In another embodiment, the charge deposited on the quantum dot set 73 forming the floating gate of the nonvolatile memory is extracted by applying a voltage between G1 81 and source contact 24.

Figure 10D:
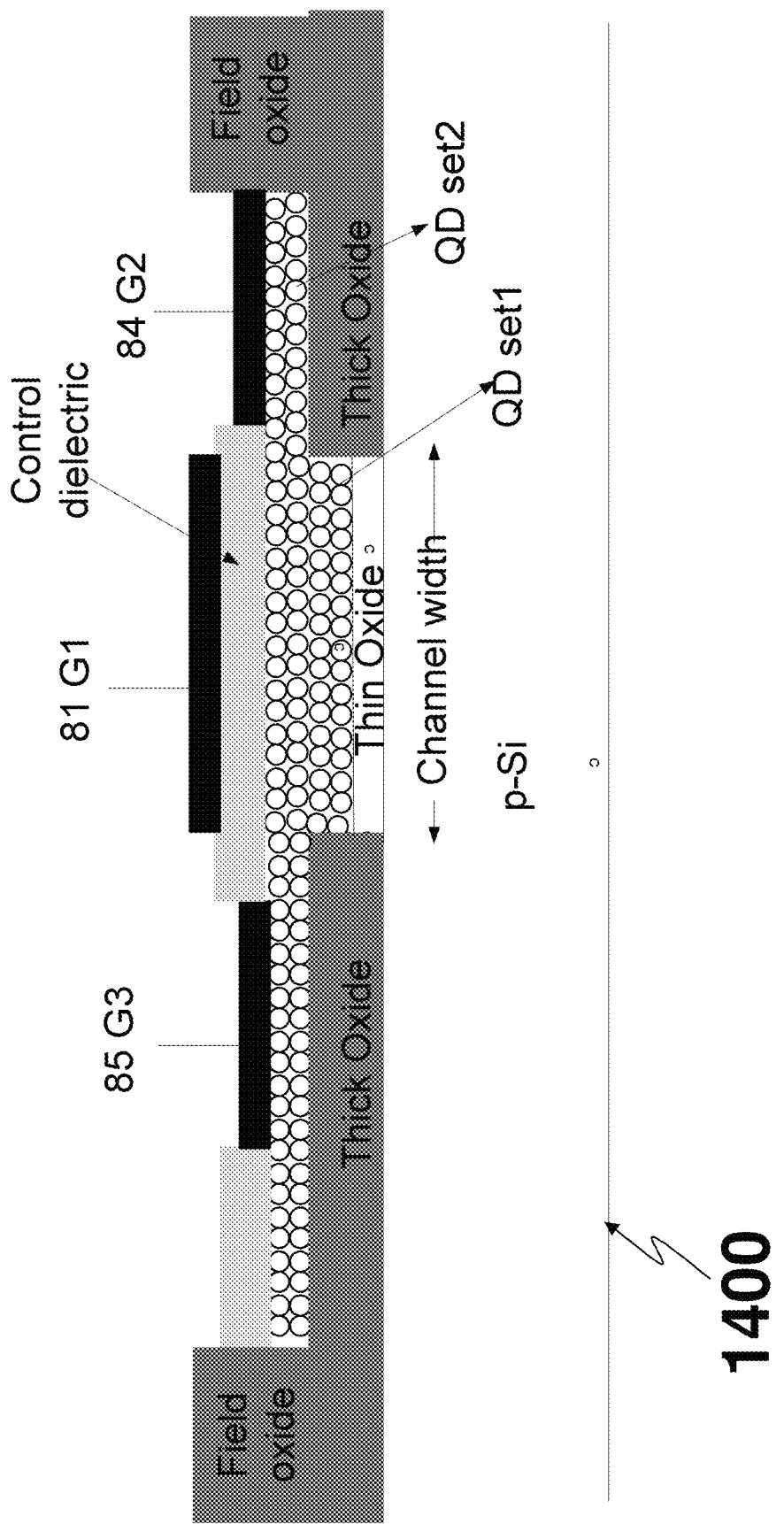
FIG. 10d is a schematic block diagram showing the cross-section along $Y_1$-$Y_2$ of the nonvolatile random access memory of FIG. 10a showing separate gates for erasing.

Referring to FIG. 10d, another embodiment of the NVRAM cell 1500 is shown, where FIG. 10d shows the lateral view illustrating the formation of two contacts to the QDC gates G2 84 and G3 85. In this embodiment, the formation of a quantum dot channel over the quantum dot floating gate enables charge transfer from floating gate dots via the source terminal (such as that shown in FIG. 1b). At least two schemes can be used to facilitate erasing. For example, use two gates G2 84 and G3 85 or connect G2 84 to G1 81 and applying a positive voltage to source or negative voltage to the gate with respect to source. This will facilitate faster erasing. For example, in one embodiment the gate 81 and gate 84 can be connected when the insulator layer is thicker in the region identified as "a" in FIG. 10c. In another embodiment, as shown in FIG. 10d the channel can be contacted using two independent contacts. This takes more real estate on Si. As a result, the two gates can be consolidated.

Figure 10E:
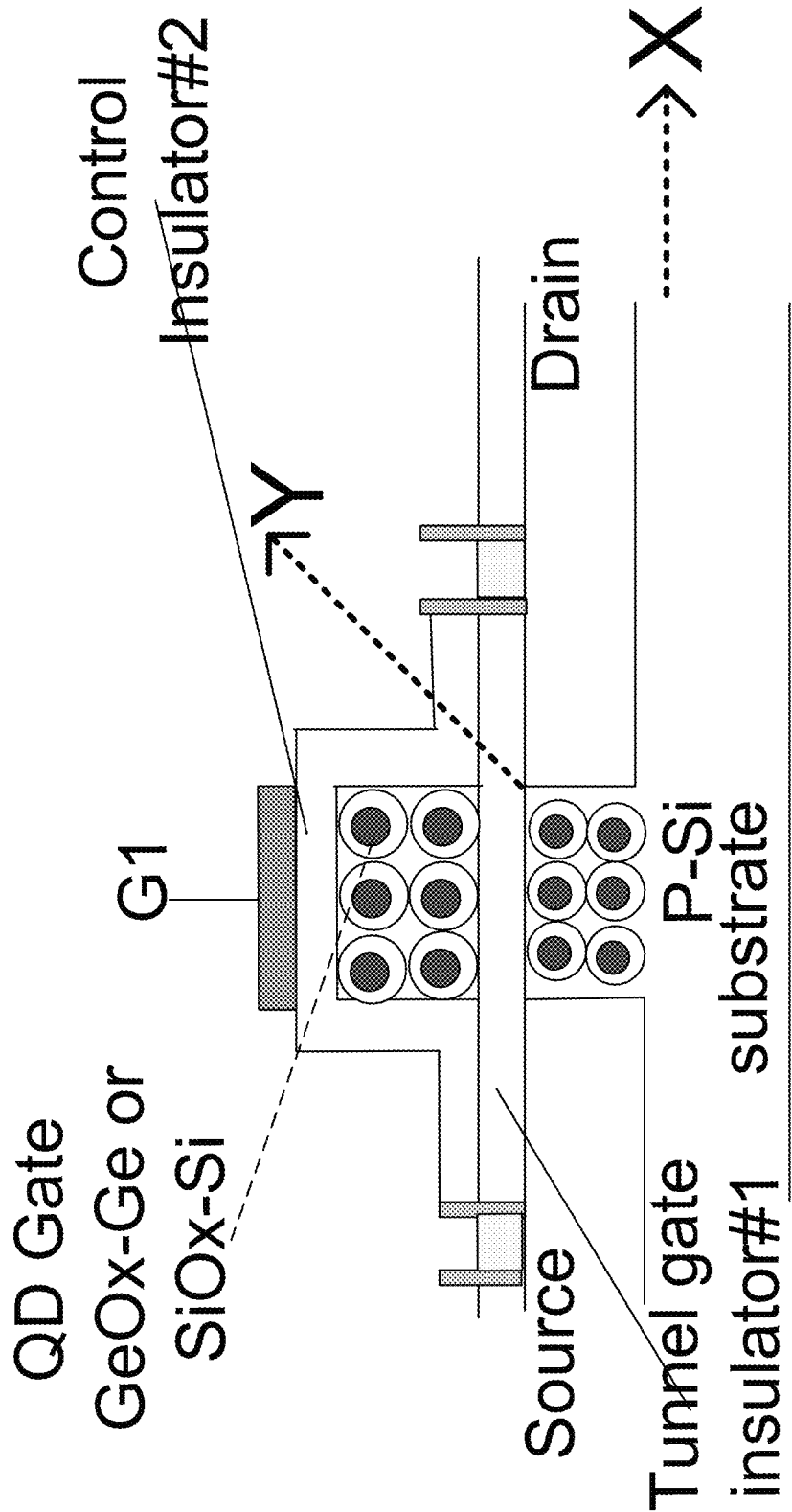
FIG. 10e is a schematic block diagram of a cross section of a sub-22 nm memory device with only 3×3 dots (i.e. 9 dots per layer).

FIG. 10e shows an embodiment where the memory device is sub 22 nm and only two layers of 3 cladded dots are shown as forming the floating gate. Here, the QDC channel accessing the floating gate is not shown.

Figure 11A:
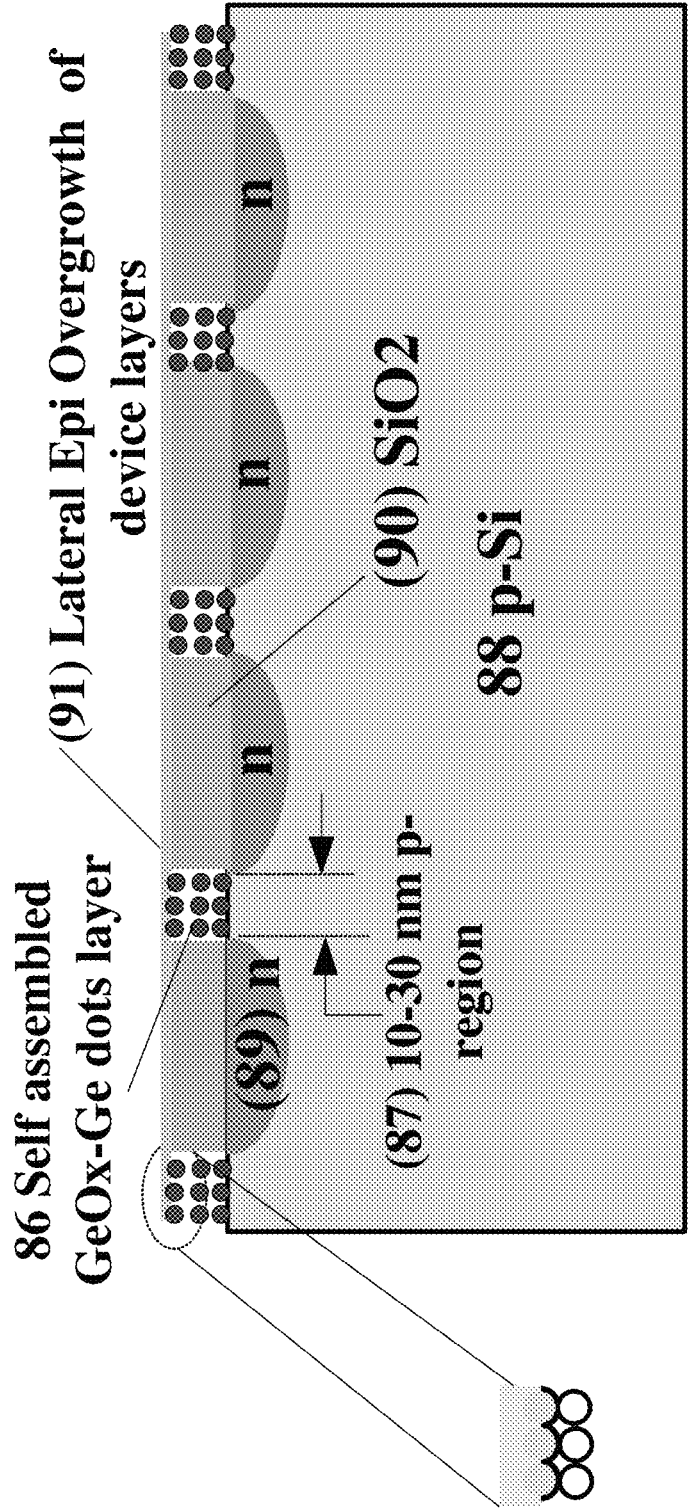
FIG. 11a is a cross-sectional schematic block diagram of a lattice mismatched epitaxial growth over Si where self assembled Ge quantum dots are used to seed epitaxial growth which laterally overgrows over SiO2 nanoislands resulting in nanodot mediated defect minimized heteroepitaxial growth.
Figure 11B:
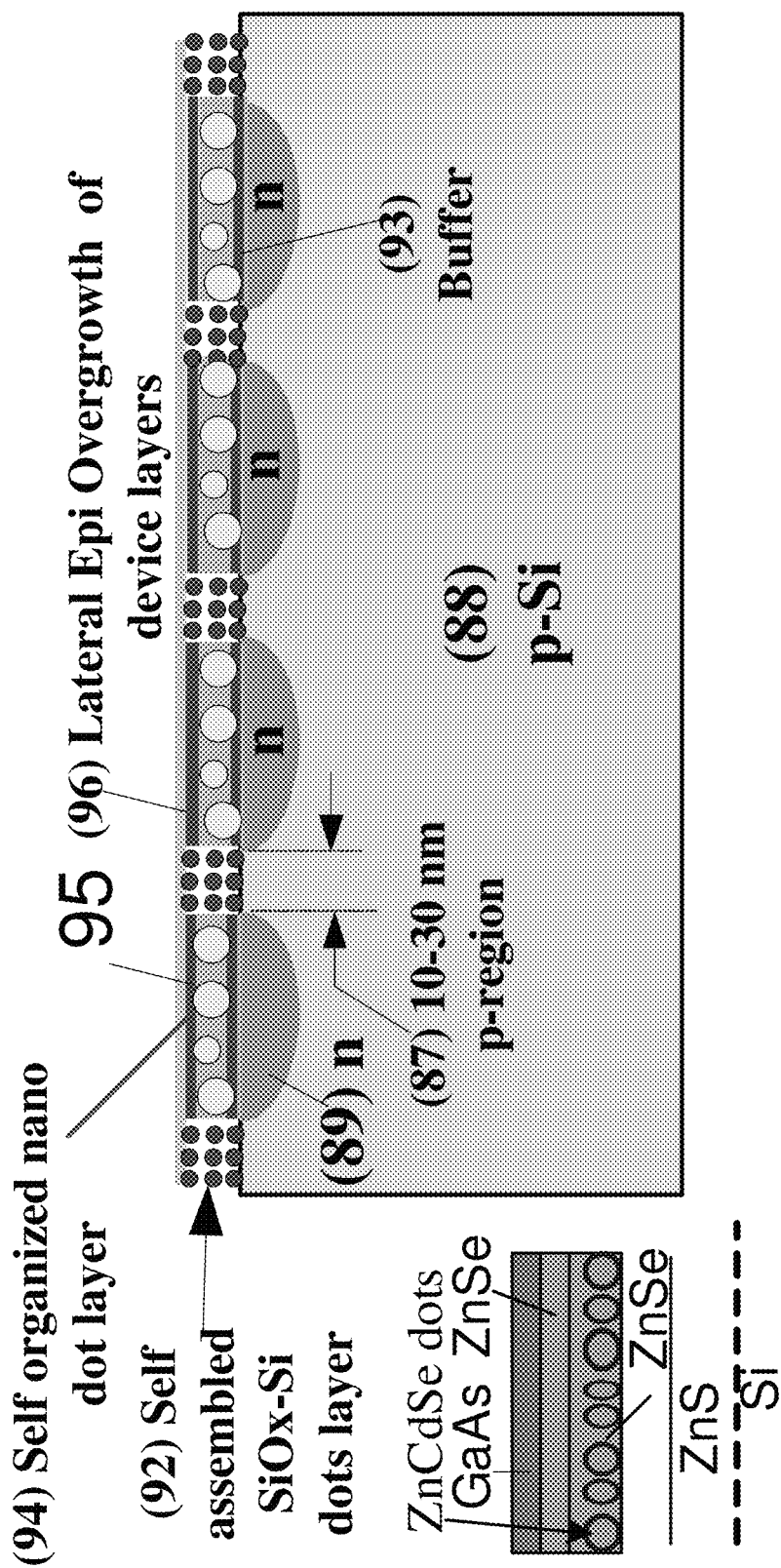
FIG. 11b is a schematic block diagram showing self-organized quantum dot mediated growth of lattice-mismatched heteroepitaxy of III-V and II-VI device layers on Si substrates.

Referring to FIG. 11a and FIG. 11b, quantum dot mediated growth of lattice-mismatched heteroepitaxy of III-V and II-VI device layers on Si substrates are shown. The use of self-assembled and self-organized nanodots is described to grow mismatched layers on Si substrate with reduced defect density. FIG. 11a shows the methodology of first forming a layer of cladded quantum dots 86 (selected from SiOx-Si and GeOx-Ge) on p-type nanopatterned regions 87 on 88 p-Si layer or substrate, where the nanopatterns may be created by n-doping 89. It should be appreciated that other method for creating nanopatterns may be used. For example, nanopatterns may be created by using lithography. It should be appreciated that, as shown in FIG. 11a, the self-assembled Ge quantum dots are used to seed epitaxial layers which are having little mismatch with Ge such as GaAs or ZnSe or ZnSSe and/or another suitable material.

The quantum dot regions 86 are separated by oxide, such as $SiO_2$ 90. However, other materials may be used to separate the quantum dot regions 86. This is followed by the removal of part of the thin oxide cladding from the top layer of the Ge quantum dots (such as shown in the inset, see also FIG. 8). One method to remove GeOx cladding involves exposing these quantum dots to a germane gas (such as $GeH_4$) at 400-600 C range for a desired duration depending on the ambient and vacuum conditions. This is because the germane gas reacts with oxides, such as GeOx and SiOx, around about 400-575 C where it slowly removes the cladding. Once the Ge or Si quantum dot is exposed, it can be used to grow a ZnSe layer which can laterally grow over the region 89. The epitaxial layer 91 of material selected from II-VI (ZnSe or ZnSSe) and III-V (such as GaAs) can now be nucleated on an exposed surface of the top layer of Ge quantum dots. The lateral overgrowth on SiO2 regions 89 of this layer results in epitaxial layers. Referring to Figure lib, a methodology for forming an epitaxial layer when self-organized quantum dots are used is discussed. In this case, the Si substrate 88 is patterned to create an n-region 89 and a p-region 87 to realize the self-assembly of SiOx-cladded Si nanodots 92 (on p-regions). The nanoislands 89 are subsequently used to realize self-organized quantum dots 94, which require the growth of a buffer layer 93 (which may be comprised of ZnS, ZnMgS layer). Details are shown in the inset. The buffer layer 93 is deposited with mismatched layers such as ZnSe and CdSe which form self-organized nanodots 94 (shown as ZnCdSe) due to strain. Subsequently, a layer 95 which has a lattice constant in between the ZnCdSe quantum dots and Si is grown. The structure is annealed to glide dislocations created due to lattice mismatch. Since the island is small, the number of dislocations is very small and they are also annihilated due to annealing. Now a device layer, such as ZnSe or ZnSSe and/or GaAs (other suitable materials may be used) is grown. This lateral epitaxial overgrowth takes place over the self-assembled SiOx-Si quantum dots as well, yielding a planar structure. This can be used to realize solar cells, GaAs-on-Si or with appropriate changes InGaAs-on-Si FETs.

Figure 12A:
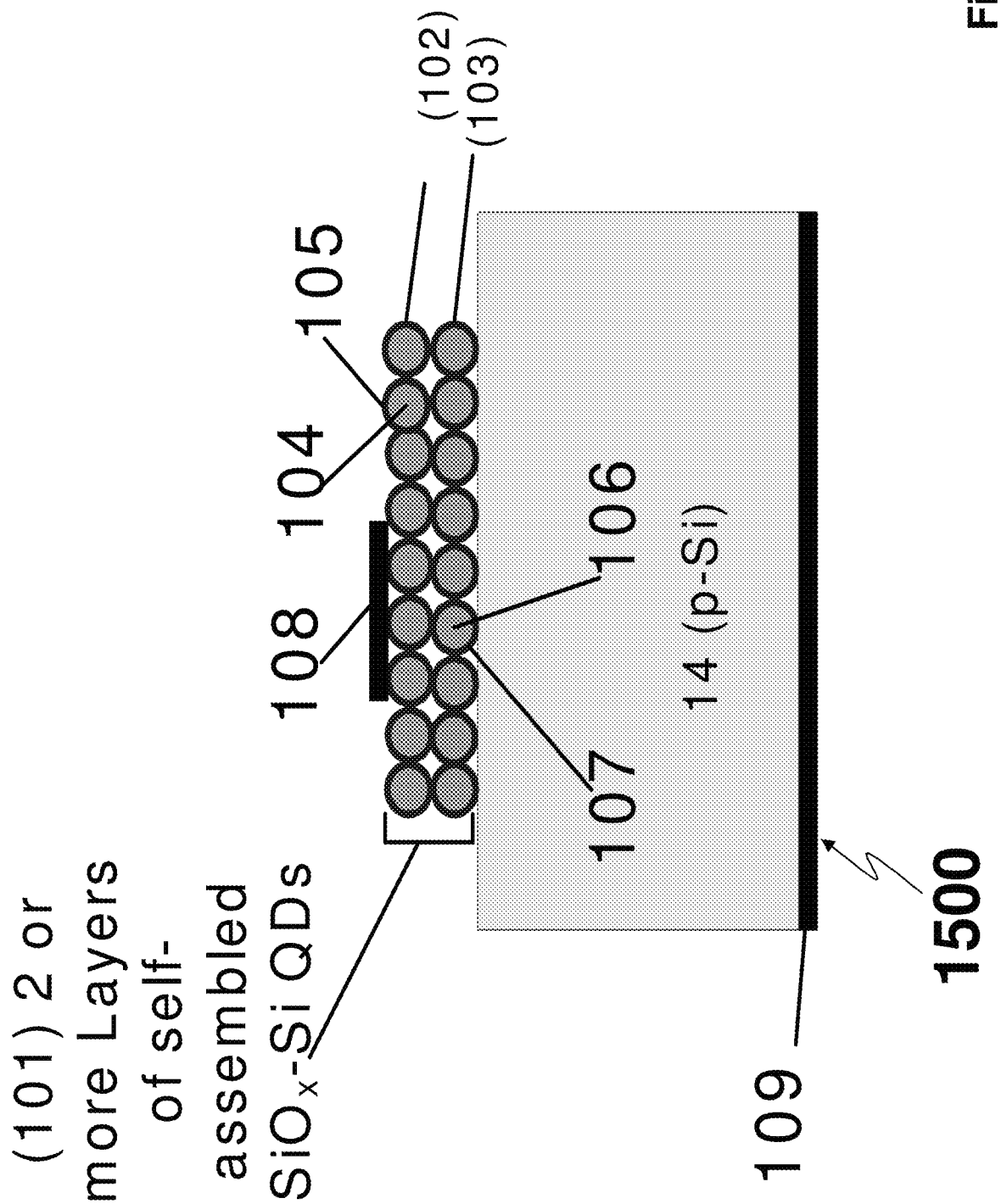
FIG. 12a is a schematic block diagram of a p-n junction diode which has an n-layer of Quantum Dot Superlattice (QDSL) and p-layer of a conventional semiconductor material, in accordance with the present invention.

It should be appreciated that a 2-dimensional or 3-dimensional array of cladded quantum dots can be employed as a layer which behaves like a quantum dot superlattice (QDSL). Unlike conventional one-dimensional superlattice which form energy minibands along one axis, the QDSL is formed along three axes for multiple quantum dot arrays (if there is only one array of quantum dots then a 2-dimensional superlattice can be formed). The proof of concept includes a basic n-QDSL/p-cSi diode (see FIG. 12b). It should be appreciated that other solar cells can be fabricated using n-QDSL/p-aSi cells. FIG. 12a shows a schematic block diagram of a SiOx-Si QDSL 1500 which behaves as a wider energy gap layer having an energy gap greater than Si. FIG.

Figure 12B:
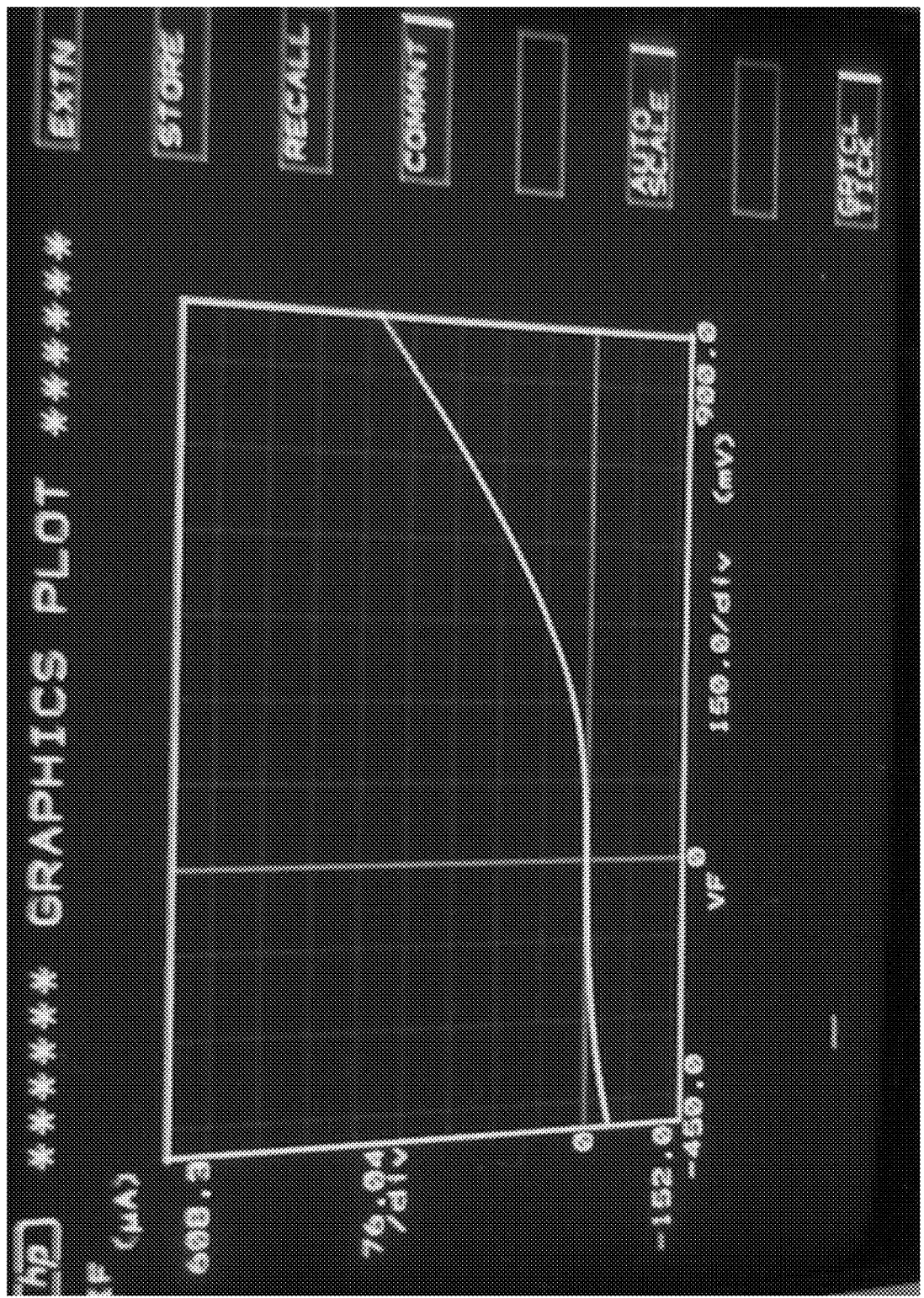
FIG. 12b is a screen printout of a graphic plot illustrating the voltage-current characteristics of the fabricated diode of FIG. 12a, in accordance with the present invention.

12a shows a set of quantum dots 101 (two layers shown as 102 and 103) self-assembled on a p-Si substrate or p-type thin film 14. The quantum dots 101 have thin cladding 105 and 107 and cores 104 and 106, respectively, for the top and bottom QD layers 102, 103. More layers could also be used depending on the thickness of the QDSL required. A bottom Ohmic contact 109 is formed on pSi and a metal layer is deposited to form the upper contact 108. This upper contact 108 could be a metal-thin insulator (SiOx cladding)-semiconductor (n-Si dot core) interface. FIG. 12b shows V-I plot of a fabricated n-QDSL/p-Si diode. This could be improved by adjusting the cladding layer as well the processing and/or annealing time.

Figure 12C:
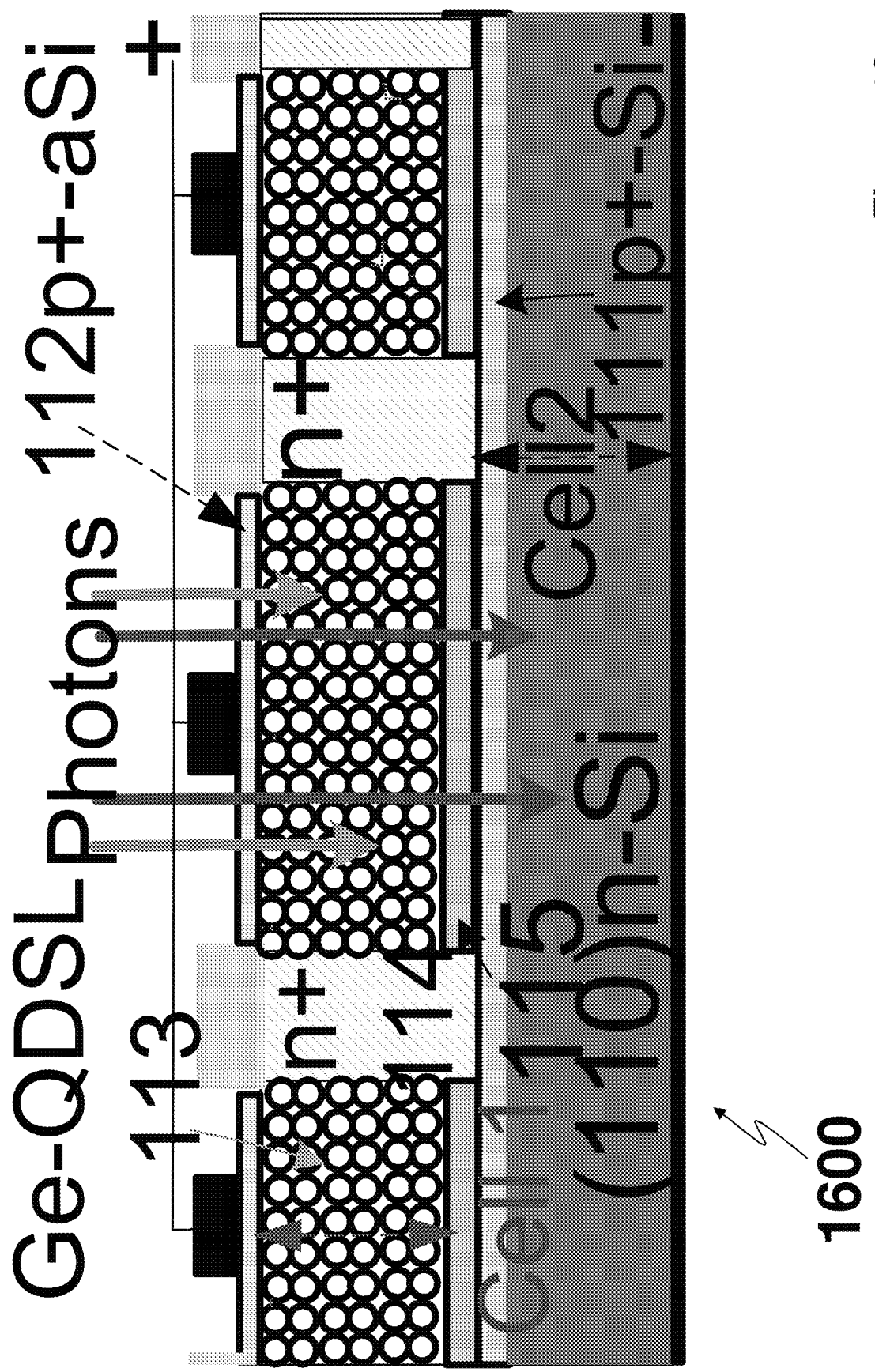
FIG. 12c is a schematic block diagram of a two cell tandem solar device using GeOx-Ge QDSL layer as an absorber for one cell (i.e. cell 1) where the other cell (i.e. cell 2) is a conventional Si cell, in accordance with the present invention.
Figure 12D:
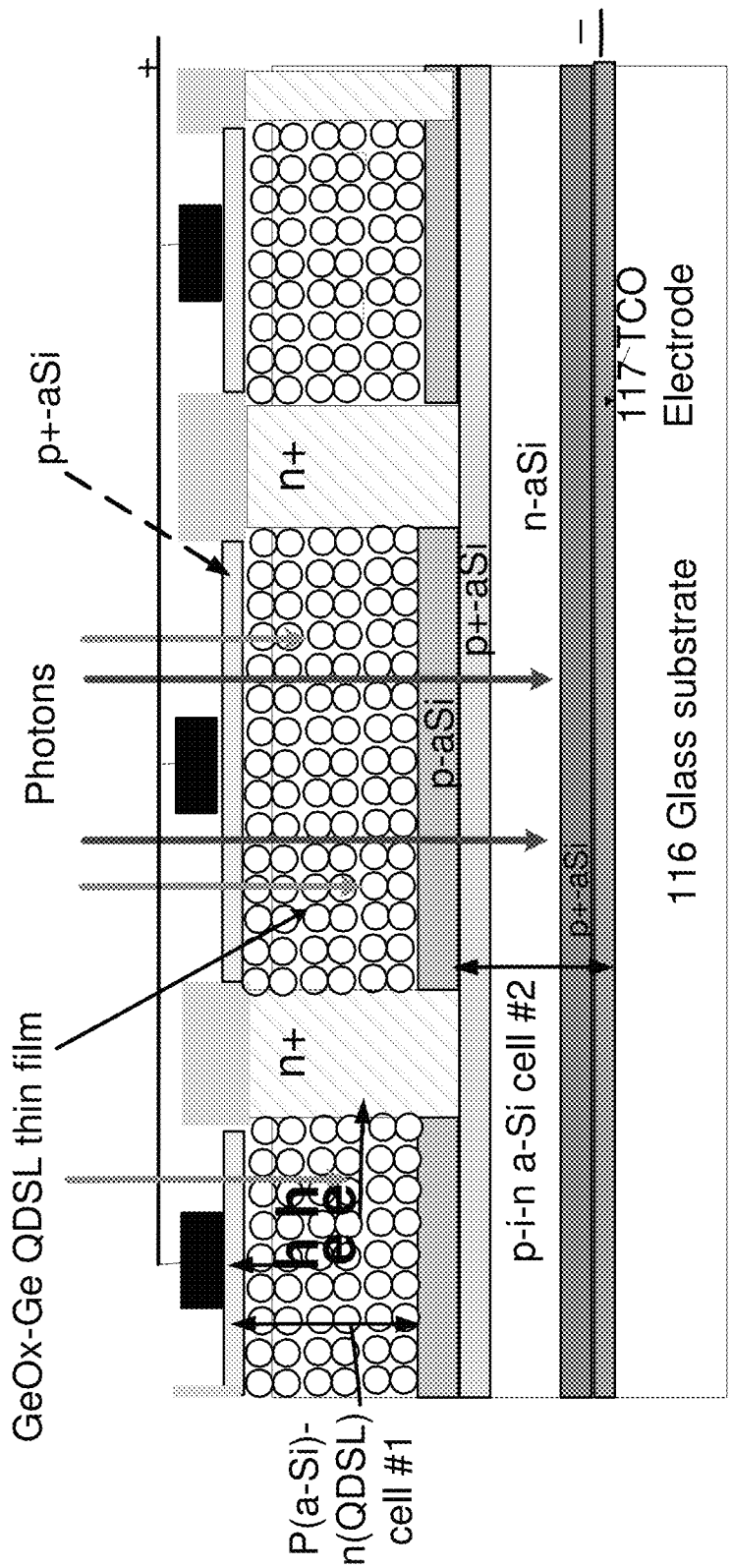
FIG. 12d is a schematic block diagram of a two cell tandem solar device using a QDSL layer as an absorber for one cell (i.e. cell 1) where the other cell (i.e. cell 2) is a conventional amorphous Si cell realized on a glass substrate, in accordance with the present invention.

FIG. 12c shows a tandem solar cell structure 1600 where the QDSL layer 113 is formed (by site specific self assembly on p-Si layer 115) using GeOx-Ge quantum dots as the absorber layer. FIG. 12c shows a 2-cell tandem structure incorporating GeOx-Ge QDSL based cell #1 and Cell #2 (which is a conventional Si cell having a p+Si 111/nSi 110 device). Cell #1 comprises a p+aSi layer 112 and a GeOx-nGe QDSL 112 layer forming p+-n heterojunctions cell. The n+ regions 114 facilitate the collection of photogenerated carriers, and they also form a tunnel junction with a p+Si layer 111. Since the quantum dot arrays have been site-specifically assembled on a variety of single crystals (Si, Ge, InGaAs) as well as nano/poly-Si substrates, we do not envision any problems in regards to their deposition on amorphous thin films. Accordingly, they could be deposited on amorphous thin films, as shown in FIG. 12d, where this structure is similar to that of FIG. 12c with the difference that here amorphous Si thin films are used on a glass substrate 116 coated with transparent conducting oxide (TCO) 117. Cell 2 is a p-i-n amorphous Si cell and cell 1 is a p-amorphous Si (top layer) and GeOx-Ge QDSL absorber layer.

Figure 13:
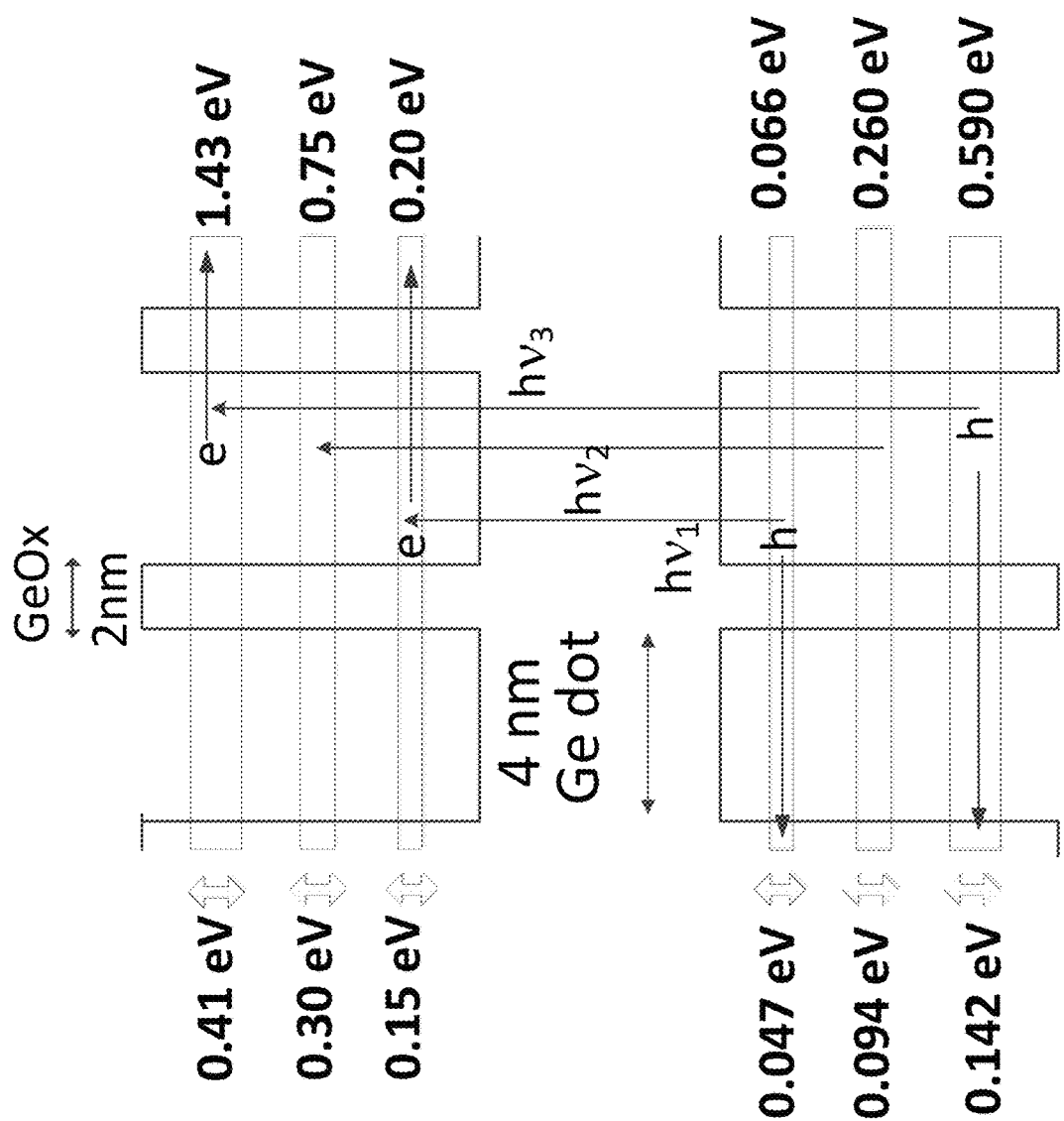
FIG. 13 is a illustration of GeOx-Ge quantum dot superlattice energy minibands formed when the barrier layer thickness between to adjacent dots is small (about 2 nm).

Quantum Dot Superlattice (QDSL):

FIG. 13 shows schematically the computed energy minibands (using one-dimensional model) for self-assembled GeO$_x$-cladded-Ge QDSL, where the dots (4 nm) are coupled via a thin barrier (2 nm). Here, we show the formation of the mini-energy bands which are similar to those formed in quantum well superlattices. These energy bands are above the bulk energy gap in the conduction and valence bands. In FETs, minibands in the conduction band or valence band are relevant to current conduction. In the case of p-n diodes or solar cells using at least one layer of QDSL, minibands in the conduction as well valence band are important. For example, the photogenerated carriers are collected via transport using mini-bands.

Figure 14:
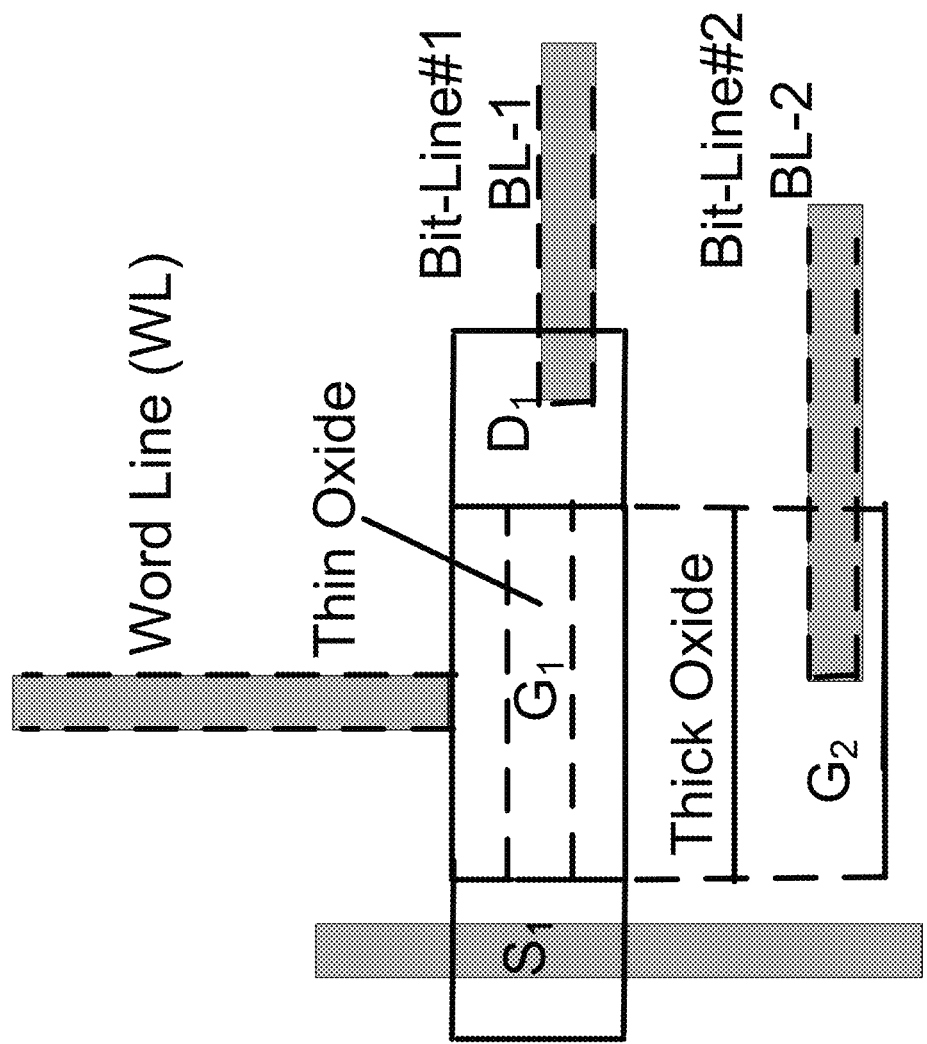
FIG. 14 is schematic block diagram of a memory cell or device addressing scheme when memory is used as a non-volatile random access memory (with two bit lines).

NVRAM Cell:

It should be appreciated that the electron charge on the floating quantum dots (i.e. first set of QDs) is stored (Write) or retrieved (Erase) via transport through the QDC channel. Referring to FIG. 14, on embodiment of the electrical interface of the QDG-QDC nonvolatile random access memory cell with word line (WL) and two bit lines (BL-1 and BL-2) is shown. In contrast to the conventional floating gate nonvolatile memory cells, this includes two bit lines. As a result the cell footprint is a little bit larger than the NOR flash cell. In this architecture, the 'Write' and 'Erase operations are accomplished by activating the quantum dot channel (by creating an inversion channel in the second set of dots by applying gate voltage to G1 which is above the threshold ($V_{T,QDC}$) of the QDC-FET). For example, in this embodiment, the QDC layer 76 is located on top of the floating quantum dot layer 73 under gate G1. A charge can be introduced in these floating dots layer 73 (See FIG. 10b and FIG. 10d). Thus, in this embodiment the QDC layer can take out charge from layer 73 (to perform erase operation for writing "0"). In another embodiment, the QDC layer is not used as a FET, but rather as a channel to remove charge or introduce charge in floating gate QDs 73.

Erase:

Again referring to FIG. 14, it should be appreciated that one way to accomplish the retrieval of electrons stored on the floating QDG (first set of quantum dot) involves the outflow of electrons from the floating gate through the tunnel insulator (t1) via the source S1. In this case a negative voltage is applied to G2 and positive voltage to S1. Another way to accomplish the retrieval of electrons stored on the floating QDG (first set of quantum dot) involves the outflow of electrons via QDC via gate G2 (and D2). Here, a positive bias is applied at G2 (via D2 n-Si region). It should be appreciated that the Erase time is expected to be ~50 ns and read time of ~10 ns. These times can be reduced by increasing the mobility of the QDC layer.

Write:

Again referring to FIG. 14, it should be appreciated that during a 'Write' state, electrons are transferred to the floating quantum dot gate G1 by making BL-2 negative and BL-1 either 0 or >0 (positive). When BL-2 is negative D2 acts as an effective source supplying electrons to the floating gate, using the inversion channel formed in QDC as an interconnect. When the source S1 is made positive, there is some tunneling, and the writing will be somewhat faster. The retention time and writing cycles for QDG-QDC nonvolatile random access memory is estimated to be better than conventional devices.

Also, the device can be used as a functional nonvolatile RAM having a matrix of access FETs. The gate of which is connected to a Word line. In addition, use of SW/QDC FET structure, configured as a NVRAM is envisioned to address processing of multiple bits.

In one embodiment, the quantum dots, forming the floating gate of a nonvolatile memory device, are accessed to remove charge from the floating gate and accomplish a faster erase operation. Such a device is also presented. In another embodiment, stacks of quantum dots are formed to realize high value ultra large capacitors. This utilizes the high dielectric constant of cladded quantum dots such as SiOx-cladded Si quantum dots and GeOx-cladded Ge quantum dots with a higher effective dielectric constant than SiOx or GeOx. In still yet another embodiment, a layer of quantum dots may be used to serve as a mediator layer, reducing dislocations, to achieve growth of mismatched epitaxial layer on a substrate. In still yet another embodiment, an array of cladded (thin layer but high band gap) quantum dots may serve as a quantum dot superlattice (having mini-energy bands that are separated in energy and having certain miniband width), wherein the quantum dot superlattice may function as an n-type semiconductor having an energy band higher than the energy gap of the semiconducting quantum dot. This layer, say of conductivity n may be used to form a p-n diode using another p-type layer. This device may also function as a solar cell.

In another embodiment of the invention, a quantum dot channel (QDC) field-effect transistor device is provided and may include a substrate which hosts a source region, a gate region, and a drain region. A transport channel is located between the source and drain regions and includes an array of cladded quantum dots, where the quantum dots have a thin cladding (about 1-2 nm) layer which may be selected from SiOx, GeOx on semiconductor dots that may be selected from Si and/or Ge. The array of cladded dots include at least one and preferably two or more layers. The array of dots is assembled on a semiconductor substrate of p-type conductivity and is constructed from a material that may be selected from semiconductors that include Si, Ge, InGaAs, GaAs, and/or GaN (or other suitable material). The array of dots may be deposited in a region between the n-type source and drain regions, and the cladding layer of the top cladded dot array is deposited with a thin gate insulator layer. The thin insulator layer is deposited with a gate material selected from a metallic and/or semiconducting material that results in a desired threshold voltage for the field-effect transistor.

Moreover, in another embodiment a field effect transistor configured as a nonvolatile random access memory, is provided and includes a source region, a gate region, and a drain region, wherein the gate region includes a first thin gate insulator layer. The first thin gate insulator layer is deposited with the first set of cladded quantum dots over the transport channel region located between the source and drain. The first set of cladded quantum dot layer is deposited with a second set of cladded quantum dot layer with thin cladding layer, the first set of dots forming the floating gate which stores the charge when the memory is written, the second set of dots may have a thin barrier and having a small core such that it transports charge, the top part of the second set of cladded dot layer is deposited with a second gate insulator serving as control gate insulator over the transport channel region. Additionally, a first gate may be formed over the two sets of quantum dots, wherein the first gate is over the entire transport channel formed between the source and drain region. The second set of quantum dot layer may be contacted by a separate second gate which may be located differently from the first gate, the second gate may be formed in a region where the gate insulator is relatively thicker then the first gate insulator, wherein the second gate may be used to extract electrons deposited on the quantum dot floating gate during erase cycle, and the electrons may be removed by biasing the second gate and the source region appropriately.

It should be appreciated that in one embodiment, the substrate is a thin film that is constructed from a material that may be selected from poly-crystalline, microcrystalline, nanocrystalline, and/or amorphous material, the transistor has a channel which may be comprised of cladded quantum dots, where the cladded dots are self-assembled on the poly-Si, microcrystalline semiconductor, and nanocrystalline semiconductor, and wherein the cladded dots form the transport channel that conducts current when a gate voltage above threshold is applied and drain and source regions are biased.

In still yet another embodiment, a method of fabricating a quantum dot channel FET and nonvolatile random access memory, where the channel region may be created in a Si substrate under the gate region between the source and drain is provided. The channel region may be recessed, where the recessed region is deposited with cladded quantum dot array, and wherein the cladded quantum dots may have another set of dots for realizing nonvolatile memory with a fast erase time. In still yet another embodiment, a FET comprising a transport channel combining quantum dot channel (QDC) and spatially switched wavefunction features is provided. The FET includes a quantum dot array to form a quantum dot channel and is incorporated on top of a coupled quantum well structure between the source and drain regions. The combined FET structure exhibiting characteristics of spatial wavefunction switched transistor and QDC type multi-state behavior, and the transport channel may have more than one drain region.

In still yet another embodiment, a method of depositing low defect density epitaxial layer on a substrate selected from the list of Si, Ge, GaAs is provided where the epitaxial layer may comprise a multiplicity of layers forming a device. The epitaxial layer may be selected from one (or more) of InGaAs, InP, CdTe, HgCdTe, GaAs, (or other suitable material). The substrate and the low defect density epitaxial layer is sandwiching between them, a thin buffer layer and a quantum dot nanostructure layer, where the buffer layer may be grown on the substrate and may be very thin ranging from about 1-2 nm to about 10-20 nm, and where the quantum dot layer may have self-organized quantum dots which may be realized using strain mismatch. The self-organized quantum dots creating (or may have) regions between them, where the regions between the quantum dots may be used to nucleate buffer layers that have lattice constant similar to the epitaxial layers. The buffer layers may be heat treated to anneal defects and dislocations and the epitaxial layers may be grown following the annealing of any defects.

In still yet another embodiment, a QDC FET is provided where a quantum dot array is used to form a transport channel which includes three or more quantum dot layers, where the quantum dot layers are electrically connected separately in the drain region to form two or more drains, wherein the transport channel is contacting more than 2 source regions, such that the FET structure exhibits characteristics of spatial wavefunction switched transistor.

In still yet another embodiment, a QDC FET of is provided having a quantum dot channel that is deposited with a second set of quantum dot array forming the quantum dot gate FET with a QDC transport channel. Also included is a device as described hereinabove which may incorporate quantum dot gate region(s) on top of the quantum dot channel implementing a FET which may have multiple states. Moreover, in still yet another embodiment, a p-n junction diode including at least one layer of quantum dot superlattice is provided, wherein the quantum dot superlattice includes two or more layers of cladded quantum dots, wherein the cladding is thin and is comprised of higher energy gap oxide than the gap of the semiconductor dot, and wherein the other layer forming the diode is of opposite conductivity than that of the quantum dot superlattice.

In still yet another embodiment, a p-n junction diode functioning as a solar cell is provided, wherein the diode includes at least one layer of quantum dot superlattice. The quantum dot superlattice includes two or more layers of cladded quantum dots, wherein the cladding is thin and is comprised of a higher energy gap oxide than the gap of the semiconductor dot, and the other layer forming the diode is of opposite conductivity than that of the quantum dot superlattice. In another embodiment, a field-effect transistor device having a transport channel comprising an array of cladded quantum dots is provided wherein the dots are cladded with a thin barrier and have a small core. The quantum dot layer is located between a source region and a drain region, and the top part of the cladded quantum dot layer has a thin insulator layer, where the insulator layer may be deposited with a gate material selected from metals and semiconductors. The charge in the quantum dot channel may be controlled by a gate electrode, where the magnitude of drain to source voltage determines the source-drain current voltage characteristics for a given gate voltage.

Additionally, in another embodiment a field effect transistor configured as a nonvolatile memory is provided where, the device may include a floating gate that may be realized using a first set of cladded quantum dots. The first set of cladded quantum dots may be deposited on a thin gate insulator over the transport channel region located between the source and the drain, wherein the first set of cladded quantum dots may form the floating gate and the device may include a second set of cladded quantum dots. The second set of cladded quantum dots may have a thin barrier and a small core, wherein a first gate may be formed over the two sets of cladded quantum dots. In the first gate region, the two sets of cladded quantum dots may be separated by an insulator serving as the control gate dielectric, where the first gate may be over the entire channel length formed between the source region and the drain region, the second set of cladded quantum dot layer may be contacted by a separate second gate which may be located differently from the first gate, the second gate may be formed in a region where the gate insulator is relatively thicker then the first gate insulator, the second gate may be used to extract electrons deposited on the quantum dot floating gate, and the electrons may be removed by biasing the second gate and the source region appropriately.

In still yet another embodiment, a thin film transistor is provided where the transistor has a channel which may be comprised of cladded quantum dots, where the dots may be assembled on a layer that may be selected from poly-Si, microcrystalline semiconductor, and nanocrystalline semiconductor (or other suitable material). The channel may be located between a source region and a drain region, the quantum dot channel may have an insulator, and the insulator may have a gate.

Furthermore, in still yet another embodiment a method of fabricating a quantum dot channel FET is provided, where the channel region may be created in a Si substrate in the gate region between the source and the drain. The channel region may be recessed, where the recessed region may host the cladded quantum dots and the cladded quantum dots may have another set of dots for realizing nonvolatile memory with a fast erase time. Additionally, in another embodiment a method of depositing low defect density epitaxial layer on a substrate selected from the list of Si, Ge, GaAs is provided, where the epitaxial layer may comprise a multiplicity of layers forming a device. It should be appreciated that the epitaxial layer may be selected from InGaAs, InP, CdTe, HgCdTe, GaAs, (or other suitable material), the substrate and the low defect density epitaxial layer sandwiching between them a thin buffer layer and a quantum dot nanostructure layer. The buffer layer may be grown on the substrate and may be very thin ranging from about 1-2 nm to about 10-20 nm, the quantum dot layer may have self-organized quantum dots which may be realized using strain mismatch, the self-organized quantum dots creating (or may have) regions between them, where the regions between the quantum dots may be used to nucleate buffer layers that have lattice constant similar to the epitaxial layers, and the buffer layers may be heat treated to anneal defects and dislocations. Moreover, the epitaxial layers may be grown following the annealing of any defects.

In yet another embodiment of the invention, a nonvolatile random access memory (NVRAM) device is provided and includes quantum dot access channel (QDAC) to facilitate erasing of stored charge in the floating gate and a quantum dot array serving as the carrier transport channel in the field-effect transistor (FET) which is configured as a memory cell. Quantum dot channel FETs and resultant nonvolatile random access memory cells can be implemented using amorphous semiconductors thin films which in turn can be deposited on support substrate selected from glass, polyimide, sapphire, and quartz. In one embodiment the quantum dot access channel in cooperation with its gate (G2 or $G_{QDAC}$) and drain (D2) are used to Erase as well as Write bits at faster speeds and lower voltages. The NVRAM cell structures are compatible with complementary metal oxide semiconductor (CMOS) FETs, logic, and static random access memory (SRAM) devices. Schemes showing dedicated erase and write lines, word line and supply line are illustrated for an array of NVRAM cells. An embodiment of NVRAM cell transforms a conventional SiN floating trap nonvolatile memory (NVM) is illustrated which integrates quantum dot access channel (QDAC) to enhance the Erase and/or Write time while providing random access.

Figure 15:
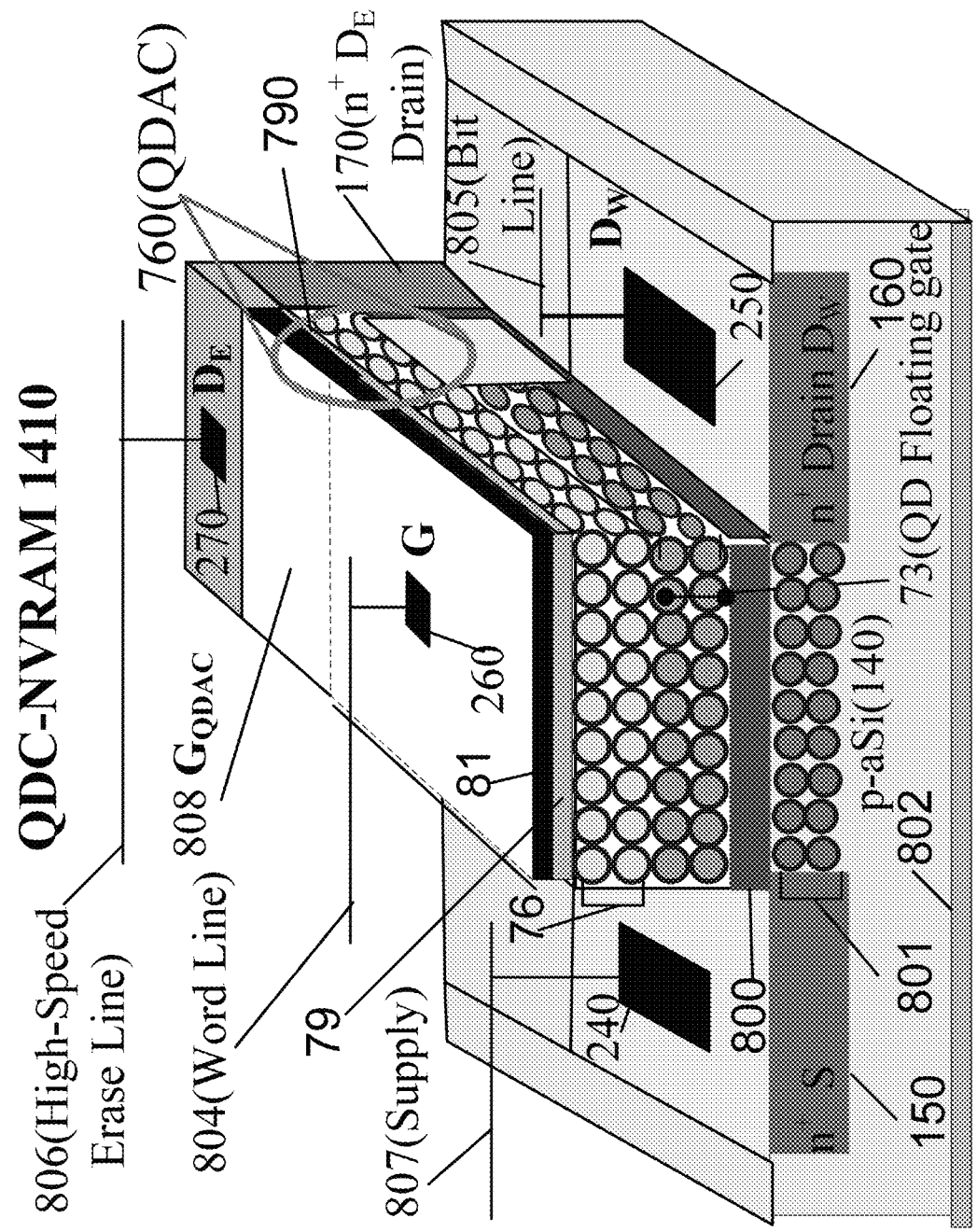
FIG. 15 is a schematic block diagram showing a three-dimensional view of quantum dot channel FET configured as a nonvolatile random access memory (QDC-NVRAM) showing source, drain 1 (D or drain $D_W$) and drain D2 (or $D_E$), and gate G.

Referring to FIG. 15, one embodiment of NVRAM cell 1410 is shown where a quantum dot channel 801 is used as a transport channel between source 150 and drain 160 (drain D1 or drain $D_W$). Also shown are the second drain 170 (drain 2 D2 or $D_E$), and gate G 81. The electrical contact for source is 240, drain 160 is 250, drain 170 is 270, gate 81 is 260. Quantum dot layers 801, serving as the transport channel, is deposited on amorphous p-Si substrate layer 140 which is in turn is deposited on a support substrate selected from glass, p-aSi on glass, p-aSi on polyimide, p-InGaZnO on glass or polyimide, p-aGe or p-aSiGe on glass or other material system substrate shown as 802.

The quantum dot floating gate 73 includes two layers of cladded quantum dots. The set of two quantum dot layers 76 serving as the quantum dot access channel (QDAC) is shown. The tunnel oxide 800 is shown along with control gate dielectric 79. The quantum dot access channel has its drain region 170 along with its electrical contact 270. In one embodiment, it may have its own gate 808 ($G_{QDAC}$ with thinner gate dielectric 790 than control gate dielectric 79 under floating gate 81 (in cross-sectional FIG. 18, we show gate as 85 or G3). The first set of quantum dots 73 are deposited on tunnel oxide layer 800. The second set 76 of quantum dot layers cover the quantum dot transport channel region as well as extends over region shown as QDAC 760. The control gate dielectric layer 79 may have different thicknesses in floating gate and QDAC regions.

The memory cell is connected via Word Line (WL) 804, bit line (BL) 805, erase line (EL) 806, and supply line (SL) 807. The Erase operation is done by using the dedicated Erase line 806.

Figure 16:
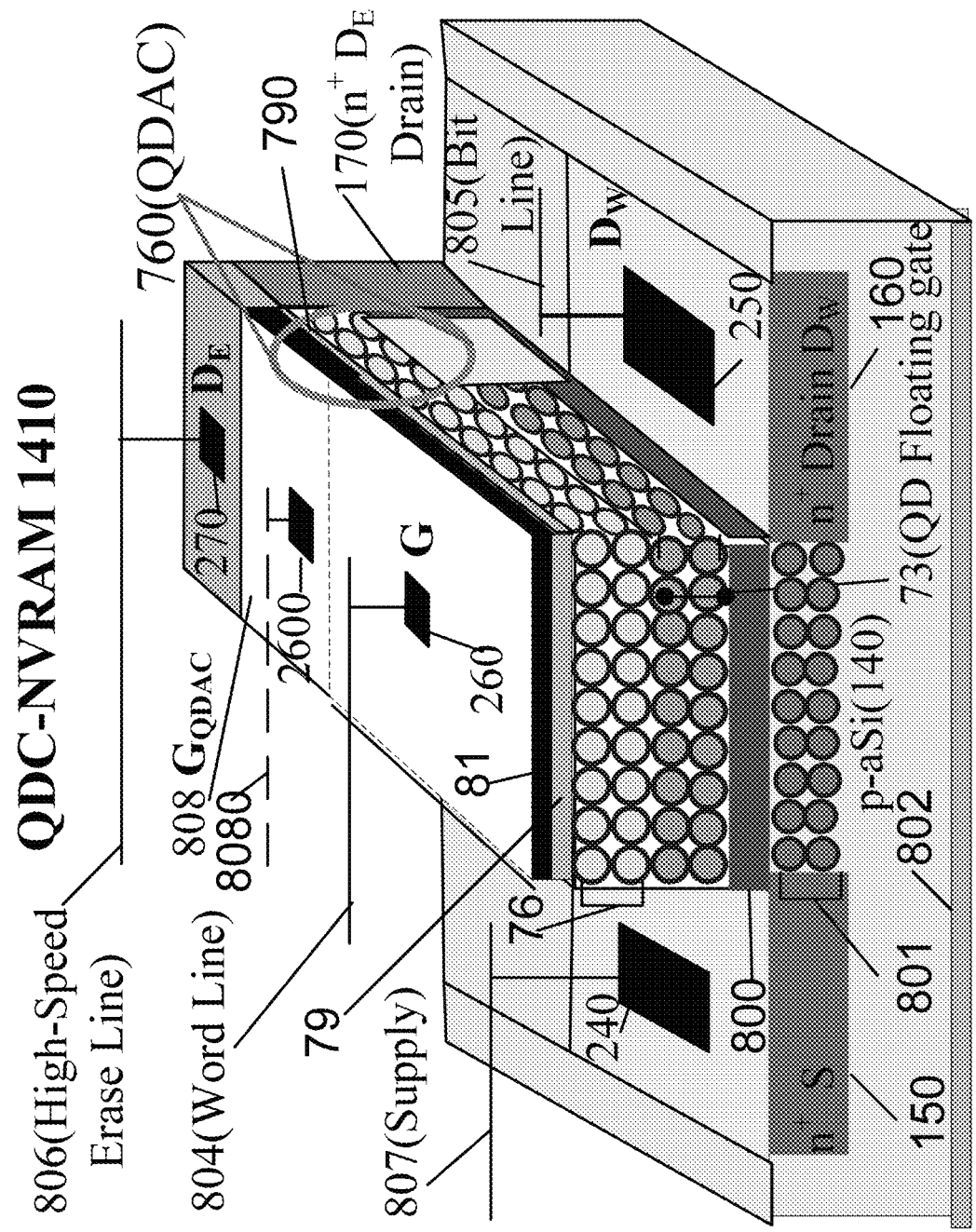
FIG. 16 is a schematic block diagram showing a three-dimensional view of quantum dot channel FET configured as a nonvolatile random access memory (QDC-NVRAM) showing source, drain 1 (D or drain $D_W$) and drain D2 (or $D_E$), and gate G. Also shown is the line 8080 accessing gate 808 via its contact 2600.

Referring to FIG. 16, one embodiment of the Writing operation is also envisioned using dedicated drain 170 ($D_E$) (via contact 27 and line 806) using the quantum dot access channel 760. Biasing may be facilitated using drain 160 (via contact 250 and bit line 805), gate 808 and gate 81 via their respective lines 804 and 8080. The access line to gate 808 is 8080. In one embodiment, gate 81 is connected to a bias line in place of serving as word line) and cell accessing is done via gate 808 (which is connected to a line 8080 serving as Word line). In this embodiment drain 16 ($D_W$) and its bit line 805 serves as biasing line. Here (unlike gate 81 and its contact 26), the contact of gate 808 is 2600.

In one embodiment of this NVRAM device 1410, the two gates 808 and 81 are connected to one contact (merging 260 and 2600) and merging 806 and 8080 access lines into one. Thus the combined gate and line will serve as the Word line. Line 806 (connected to 170 drain $D_E$ or D2) serves as the Erase and Write line depending on the biasing of Source 150

(via supply line 807). During Write 806 may serve as the bit line. The designated bit line 805 now may serve as the Read line with appropriate biasing.

Figure 17:
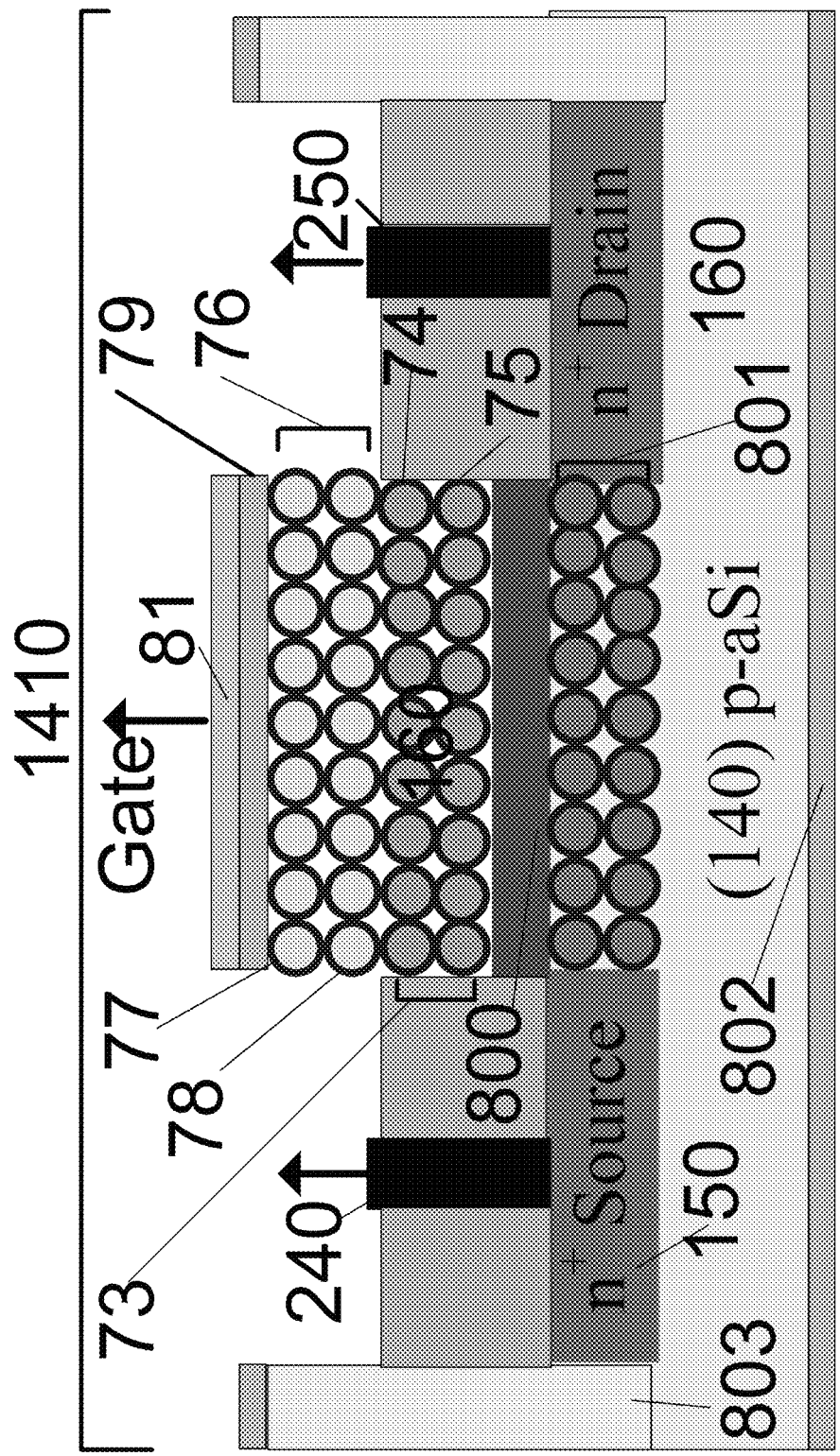
FIG. 17 is a schematic block diagram showing a cross-sectional view along source and drain showing quantum dot channel FET, which is configured as a nonvolatile random access memory.

Referring to FIG. 17, a cross-sectional view along source 150 and drain 160 showing quantum dot channel 801 serving as the transport channel for the QDC-FET is shown, which is configured as a nonvolatile random access memory 1410. The p-type amorphous or polycrystalline layer 140 is shown along with the support substrate 802. The memory cell is isolated by oxide or insulator layers 803. In this view the drain DE 170 and its contact 270 are not shown. The connecting word line, supply line, and bit line and dedicated erase lines are not shown.

Figure 18:
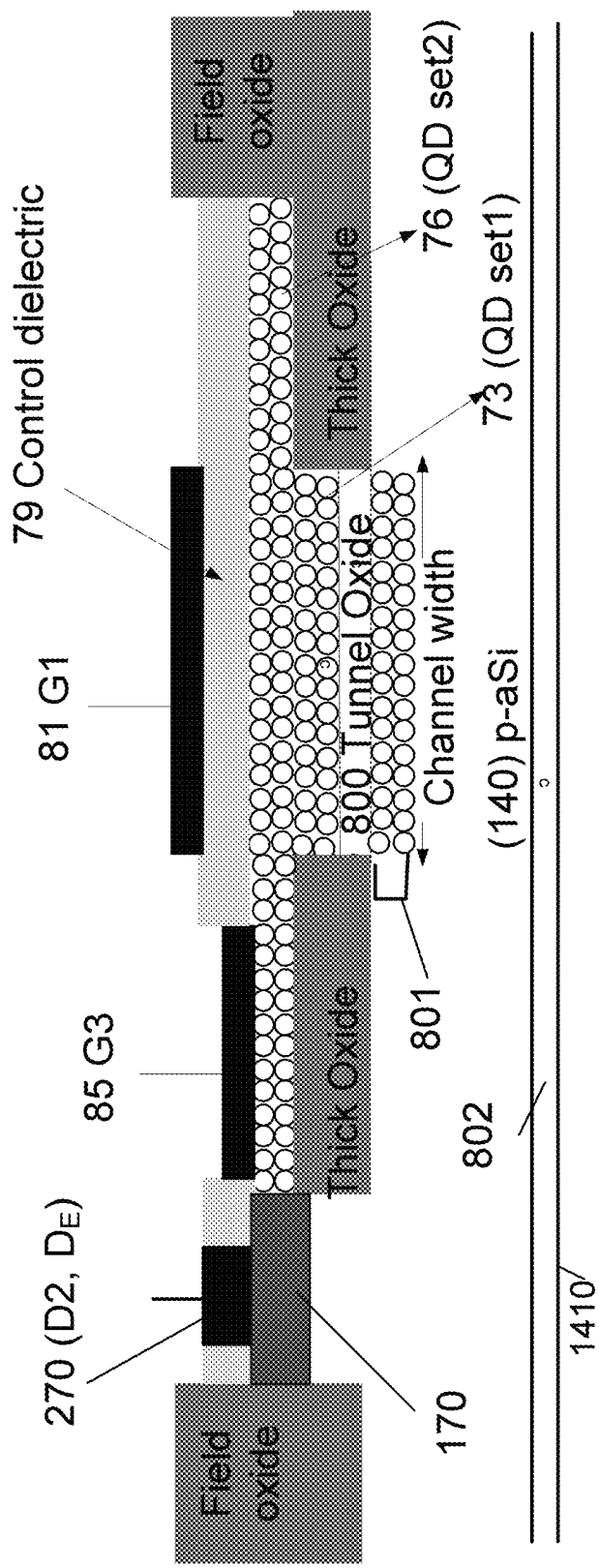
FIG. 18 is a schematic block diagram showing another cross-sectional view describing quantum dot channel FET configured as nonvolatile random access memory.

Referring to FIG. 18, another cross-sectional showing lateral view with the drain region D2 or DE 170 and its electrical contact 270 are shown. Here, quantum dot transport channel 801 is shown along with tunnel oxide 800, and two sets of quantum dot array which form the floating gate 73 and quantum dot access channel 76, respectively.

The lateral view illustrates the formation of gate contact 85 formed on a region identified as 808 in FIG. 15. In another embodiment 84 (gate contact on the other side of 85, not shown here) and 85 can be connected together. In this embodiment, the formation of a quantum dot channel over the quantum dot floating gate enables charge transfer from floating gate dots via the source region 150 via contact 240 (such as that shown in FIG. 17).

Figure 19:
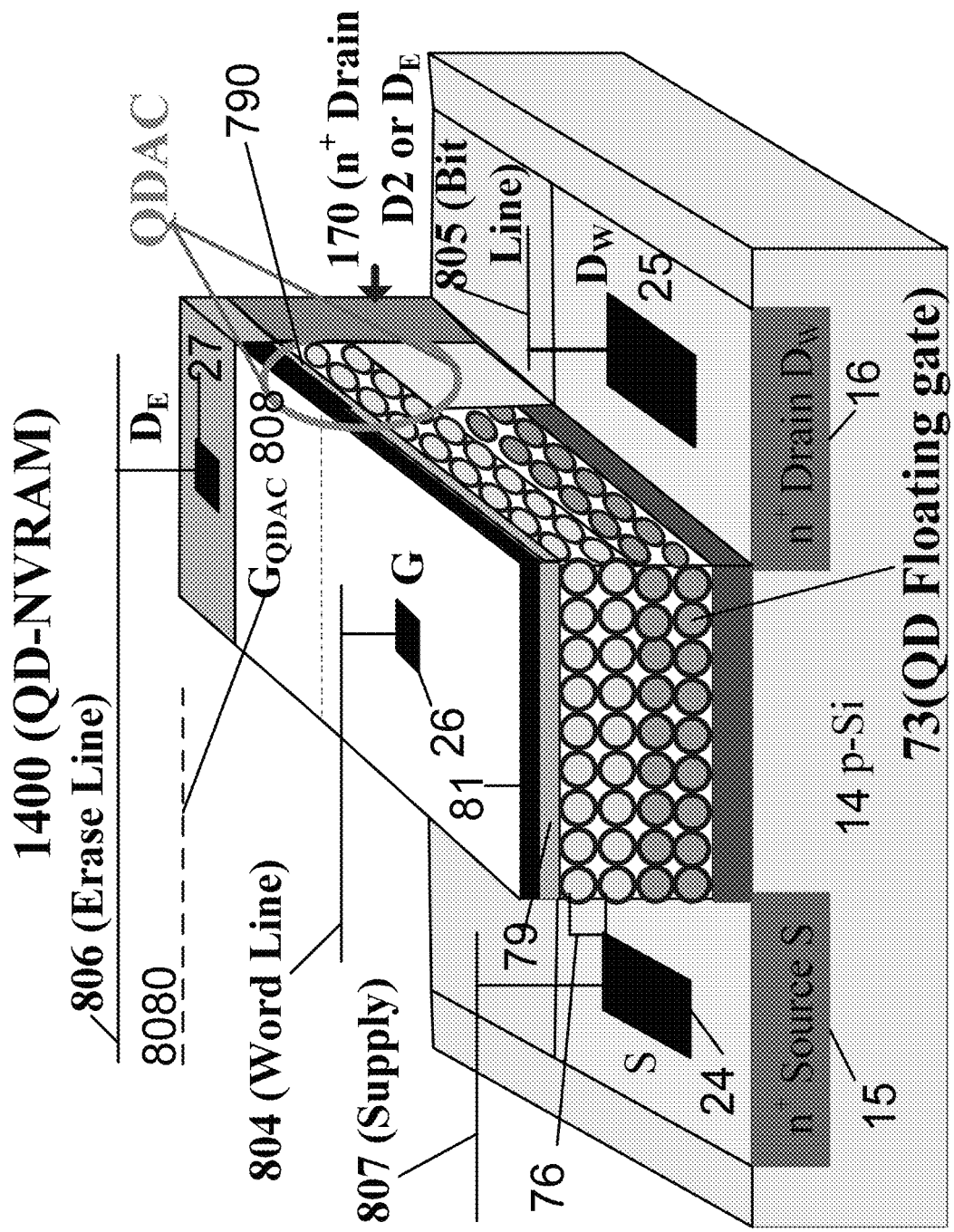
FIG. 19 is a schematic block diagram showing a three-dimensional view of a NVRAM cell showing Word, Bit, Supply and Erase lines.

FIG. 19 shows a three-dimensional view of a NVRAM cell 1400 showing Word line 804, Bit Line 805, Supply Line 807 and Erase Line 806. In this embodiment, the memory cell is realized on p-Si substrate.

In another embodiment the Writing operation is envisioned using dedicated drain 170 ($D_E$) using contact 27 via line 806. Biasing may be facilitated using drain 16 (via contact 25 and bit line 805), gate 808 and gate 81 via their respective lines. The access line to gate 808 is not shown.

In one embodiment, gate 81 is connected to a bias line in place of serving as word line) and cell accessing is done via gate 808 (which is connected to a line 8080 serving as Word line). In this embodiment drain 16 ($D_W$) and its bit line 805 serves as biasing line. Here (unlike gate 81 and its contact 26), the contact of gate 808 is not explicitly shown.

The schematic of a QDAC-NVRAM cell 1400 with two layers of cladded quantum dots 73 (shown in blue) serving as the floating gate is shown here. The quantum dot access channel (QDAC) includes two layers (76) of cladded quantum dots (shown in pink), which facilitates stored charge removal during the 'Erase' cycle from the floating gate. This is achieved by turning ON the QDAC only during the 'Erase' operation via drain 170 (D2 or DE), bypassing the thick control dielectric 79 and using thinner control dielectric 790, enabling low-voltage and high-speed erasing.

Similarly, we envision higher speed Writing using QDAC as pointed above for one embodiment.

In one embodiment, both gates 81 and 808 are connected to their respective "lines". Still in another embodiment, both gates are connected together with one word line 804. In this case the erase line 806 can function both as Erase and Write line using quantum dot access channel; in this embodiment, drain 16 and associated bit line 805 will serve as the dedicated Read line. Combination of other variations is also envisioned depending on the application. This embodiment is similar to FIG. 16.

Figure 20:
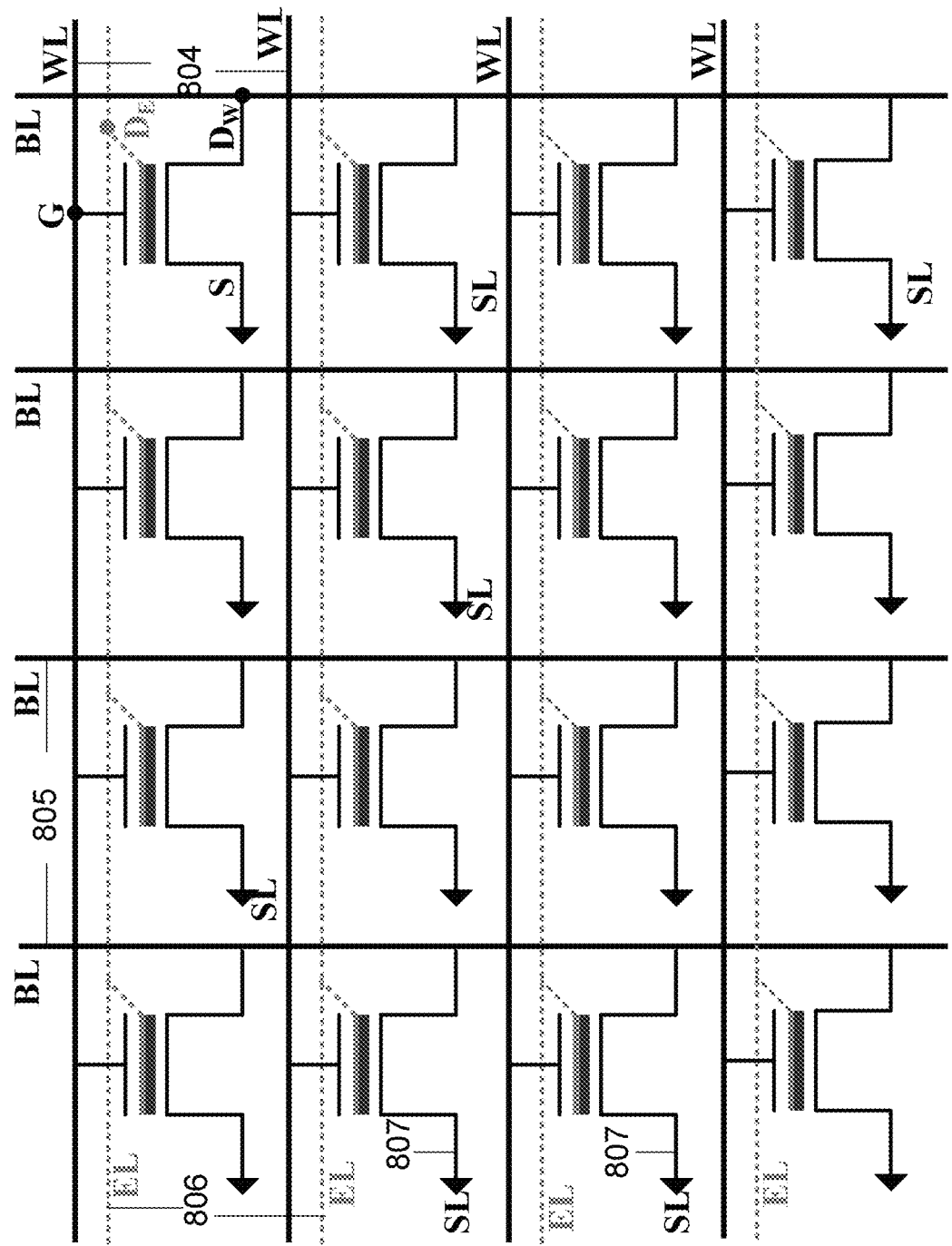
FIG. 20 is a schematic block diagram showing an NVRAM cell array (4×4) architecture showing Word line (WL), Bit Line (BL), Supply Line, and dedicated Erase Line (EL).

FIG. 20 shows a 4×4 array of NVRAM cells to test the architecture. The gates (G) of the memory cells on each row of the array are connected to a word line (WL) 804. The sources of the cells in array are connected to supply lines 807. The drains ($D_W$) of the cells on each row are connected to a bit line (BL) 805. Similarly, the drains ($D_E$) of the cells on each row are connected to a dedicated erase line (EL) 806.

In one embodiment, the array is connected differently particularly where NVRAM structure is as shown in FIG. 16.

Figure 21:
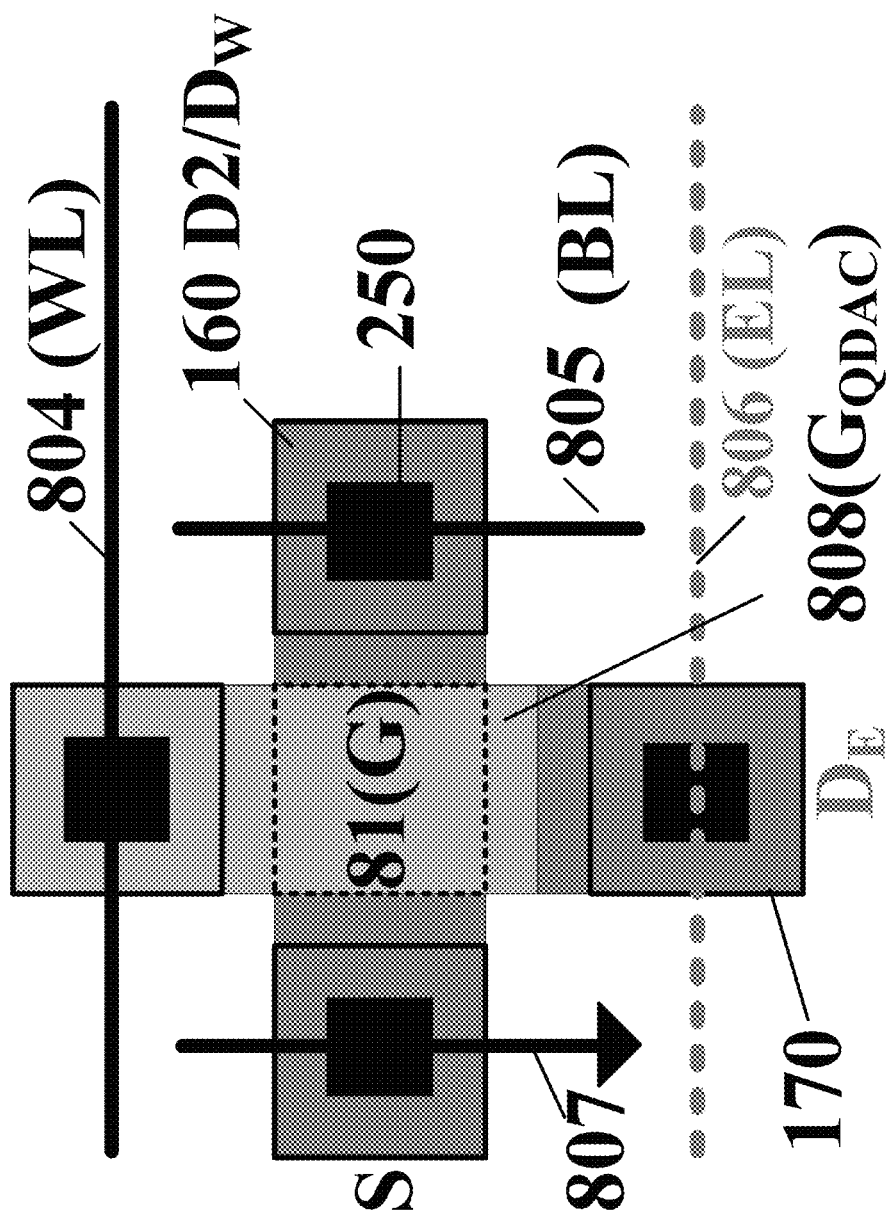
FIG. 21 is a schematic top view block diagram showing bit line, word line, supply line, and erase line in one cell of a NVRAM cell using quantum dot access channel to electrically contact floating gate stored charge.

FIG. 21 is a top view showing bit line 805, word line 804, supply line 807, and erase line 806 for one NVRAM cell. These lines are connected using respective electrical contacts shown as 250 (for drain $D_W$ 160), 260 (gate contact), contact 240 for source region 150, and contact 270 for drain region $D_E$ 170.

Also shown is the gate 808 over the QDAC. In one embodiment, both gates are connected to their respective "lines". Still in another embodiment, both gates are connected together with one word line 804. In this case the erase line 806 can function as Erase as well as Write line using quantum dot access channel; in this embodiment, drain 16 and associated bit line 805 will serve as the dedicated Read line. Combinations of other variations are also envisioned depending on the application.

Referring again to FIG. 19 and FIG. 20, during the 'Write' operation, individual cells are accessed by applying voltage pulses with given amplitudes but different widths (time duration) to WL and BL. During 'Read' operation, the individual cells are selected similar to 'Write' operation. However, the voltage pulses applied to the WL are lower in amplitude. If a selected memory cell stores a "0", its BL will be pulled down and read out by the sensing amplifier at the end of the bit line. Data "1" or "2" cannot be read by this narrow word line pulse due to their low drain currents; the bit line will only be pulled down slight but cannot be sensed by the amplifier. Then, a word line pulse with a wider width is applied to detect if the memory cell stores a "2" (data "2" has a larger drain current than data "1" but a smaller drain current than data "0"). If the sensing amplifier detects the sufficient pull-down on the bit line, the memory cell stores a "2"; otherwise it stores a "1". As a result, it needs two read cycles to read the possible three values in a memory cell.

During 'Erase' operation, the individual cells are selected similar to 'Write' operation. However, we have two methodologies for erasing. These are outlined in FIG. 5 and FIG. 6. The novelty of this approach is the dedicated 'Erase Line' which directly accesses the floating gate charge via QDAC and drain $D_E$ terminals. We will perform a comprehensive set of tests to determine the robustness and speed of this memory array.

Biasing of 'Erase Line EL' with respect to source S and gate G determines the charge removal mechanism. Even though we have an additional Erase line, this helps in high-speed erasing and thus transforming the nonvolatile memories to high-speed random access memories.

In one embodiment, faster Writing is carried out using gate 808 via line 8080 as the Word line and Erase line 806 also serving as faster bit line. The bit line 805 serves as bias line. In this embodiment, line 806 serves both Write (bit line) and Erase line, line 8080 connected to 808 serves as the Word line, and line 804 and 805 and 807 serve to provide biasing for Write, Erase and Read operations that can be achieve at faster speeds.

Still in one embodiment where NVRAM structure is FIG. 16, where gate 81 and gate 808 are connected together, and dedicated Erase line also serves as a Write line, we could use the bit line connected to drain D1 or DW as the dedicated Read line.

Figure 22:
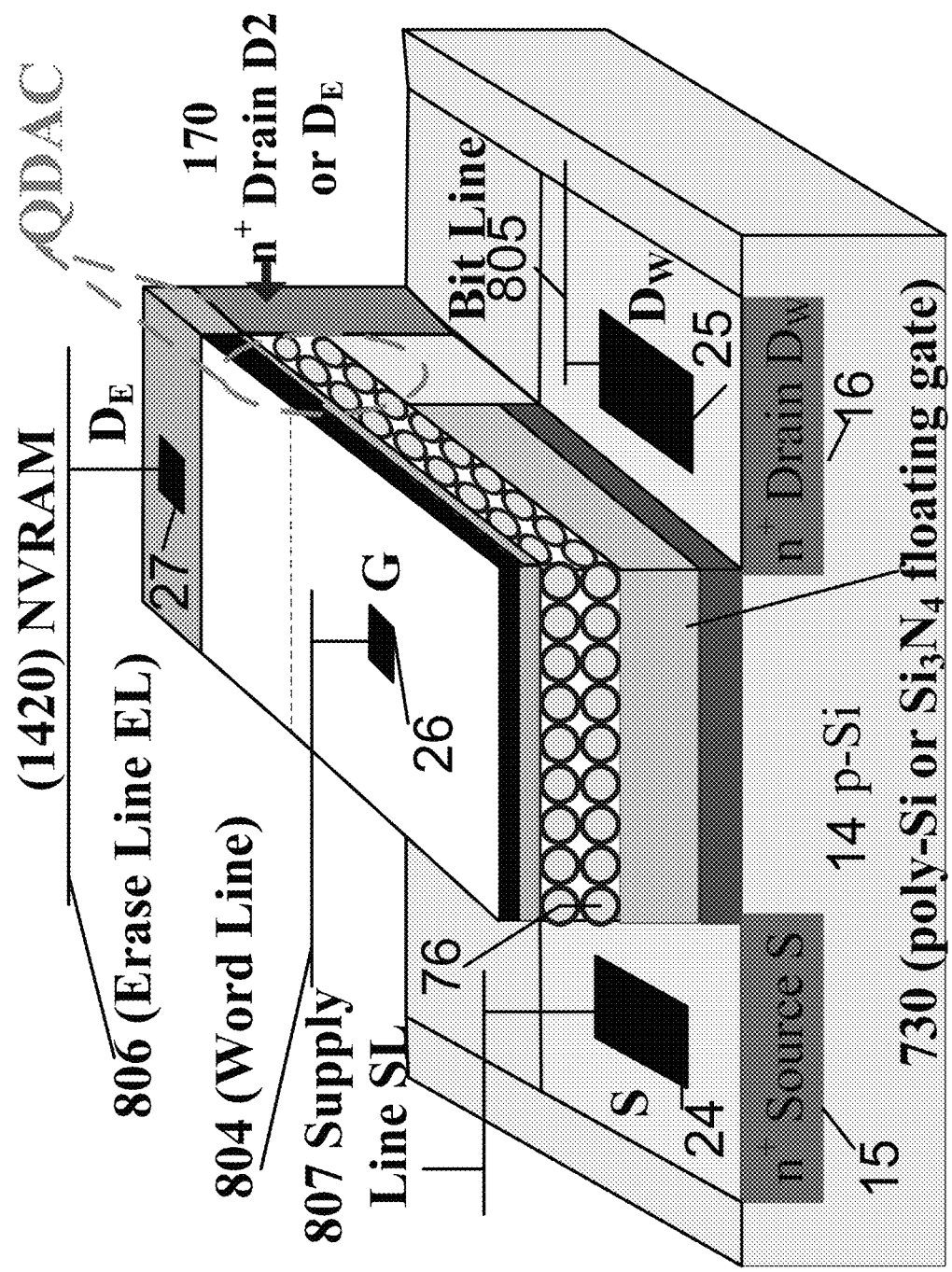
FIG. 22 is a schematic block diagram showing an array of quantum dots (serving as quantum dot access channel QDAC) deposited on a layer of Si3N4 serving as floating gate or floating trap layer to store charges.

FIG. 22 shows an array of quantum dots (serving as quantum dot access channel QDAC) deposited on SiN floating gate 730. This structure 1420 shows enhancing the erase time in a conventional nonvolatile memory cell using Si-oxide-nitride-oxide-Si (SONOS), and transforming it into a nonvolatile random access memory (NVRAM) cell. The quantum dot access channel layer 76 includes two layers of cladded quantum dots. These dots are deposited on the floating gate layer 730 which stores charges in the energy traps manifested in the SiN thin film.

Here, the bit line 805, word line 804, supply line 807, and erase line 806 are shown for one NVRAM cell An embodiment of floating gate trap memory using Si3N4 layer accessed by quantum dot access channel to enhance the erase speed can be implemented in the quantum dot transport channel structure as shown in FIGS. 15-18.

Figure 23:
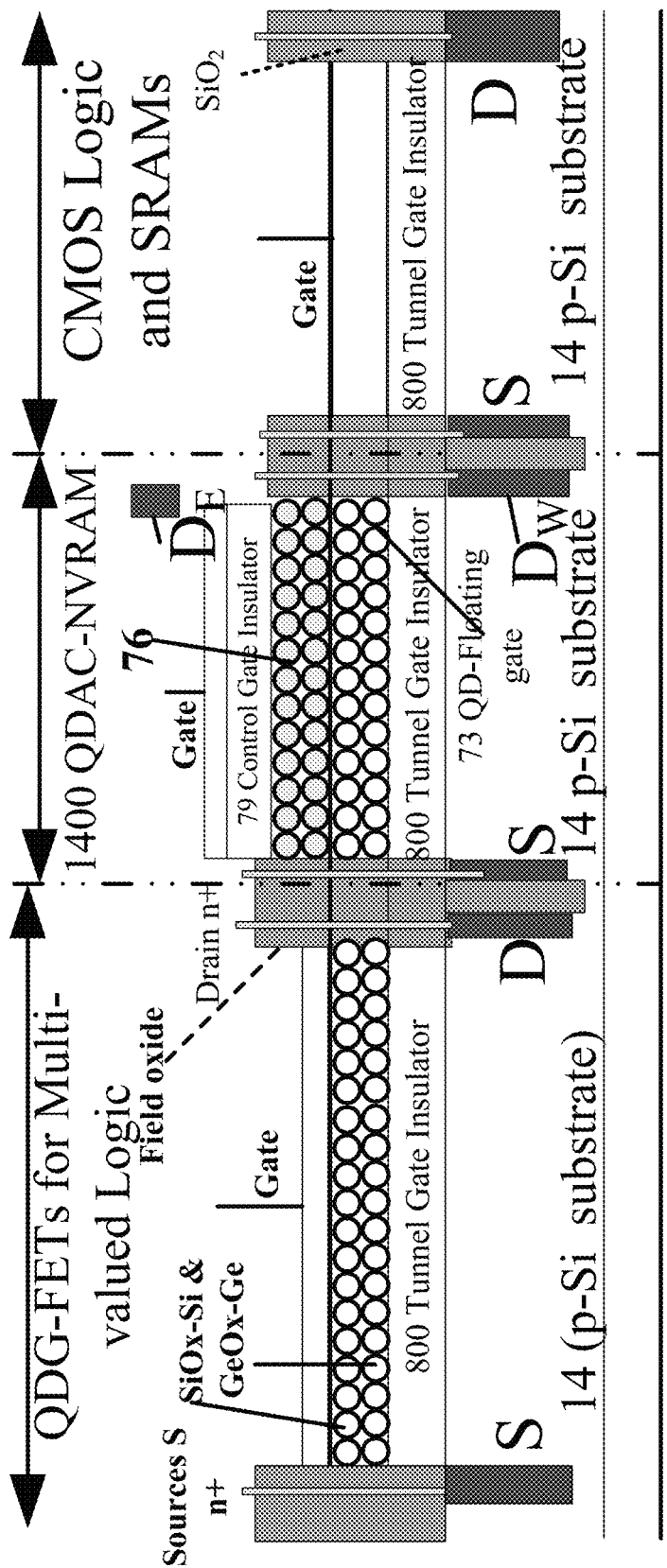
FIG. 23 is a schematic block diagram showing an integrated QDG-SRAM, QD-NVRAM, and a conventional CMOS n-FET.
Figure 24:
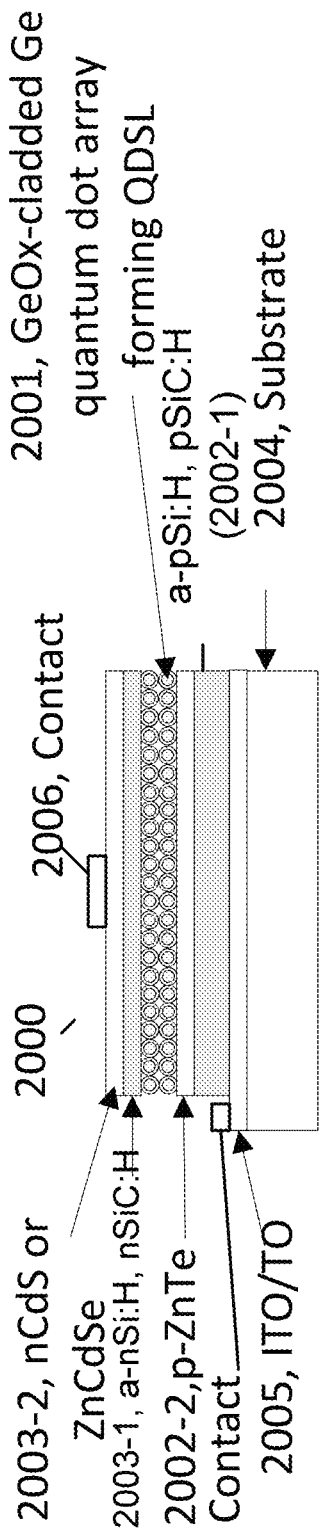
FIG. 24 shows a cross-sectional schematic Quantum dot Ge superlattice (QDSL) p-n diode as a light-emitting diode (LED).
Figure 25:
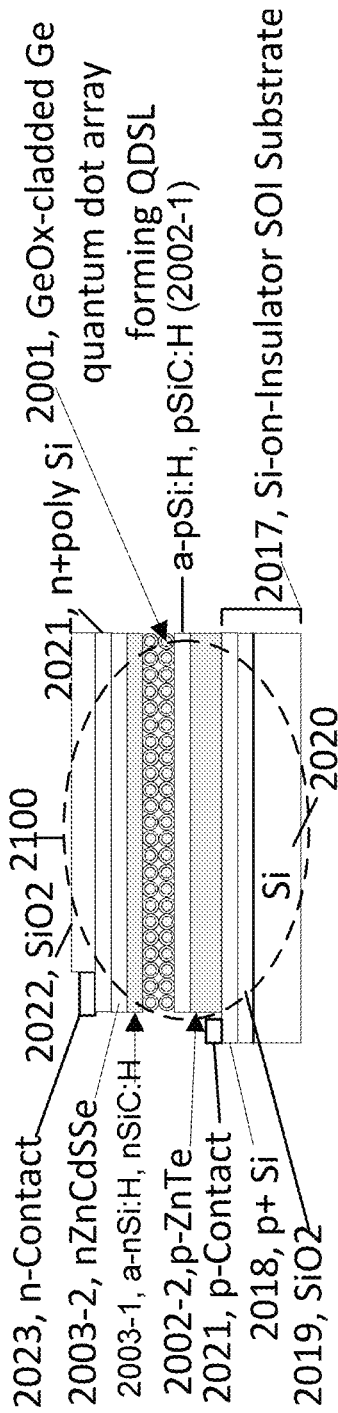
FIG. 25 shows a cross-sectional schematic of a quantum dot Ge superlattice (QDSL) p-n diode as an edge-emitting laser diode (LD).
Figure 26:
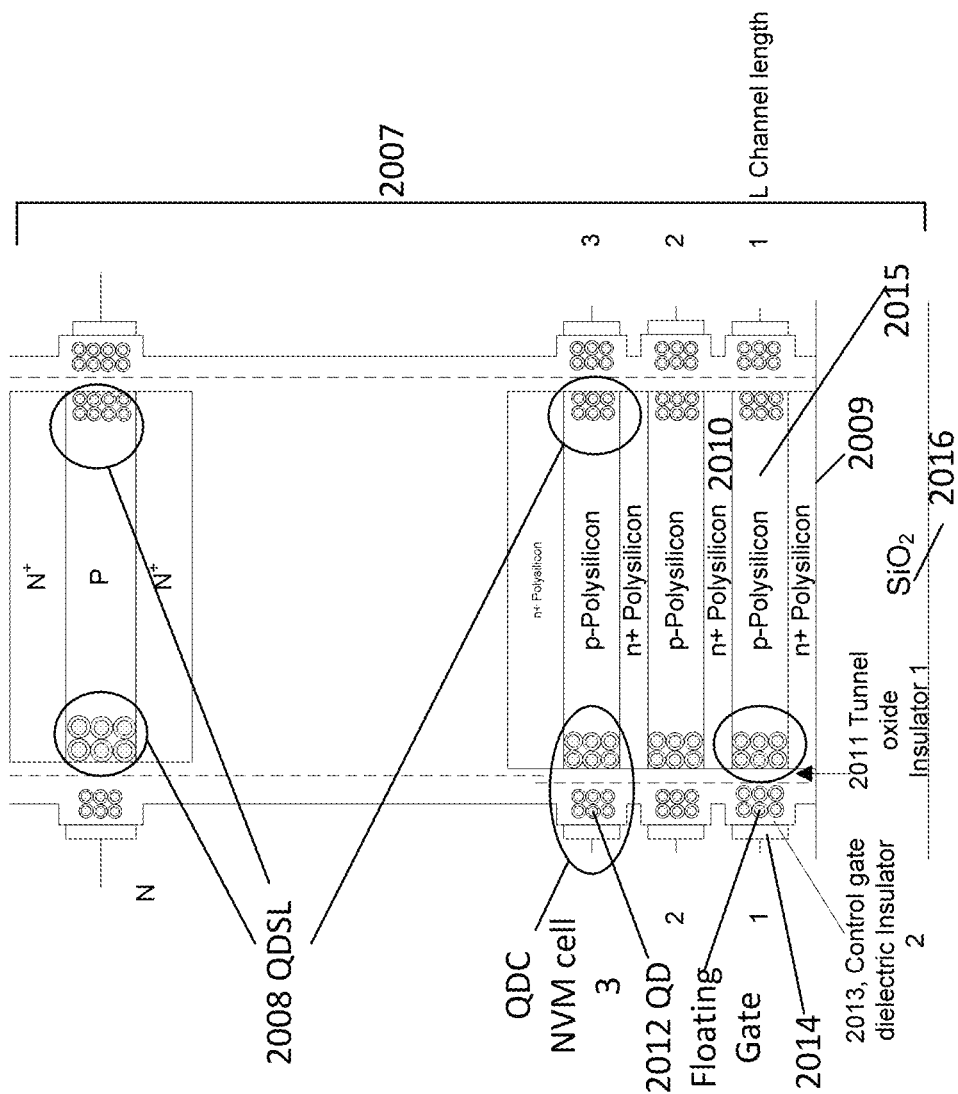
FIG. 26 shows a Quantum dot superlattice (QDSL) on poly-Si forming quantum dot channel (QDC) FET configured as a floating gate nonvolatile memory in vertical NAND format.
Figure 27:
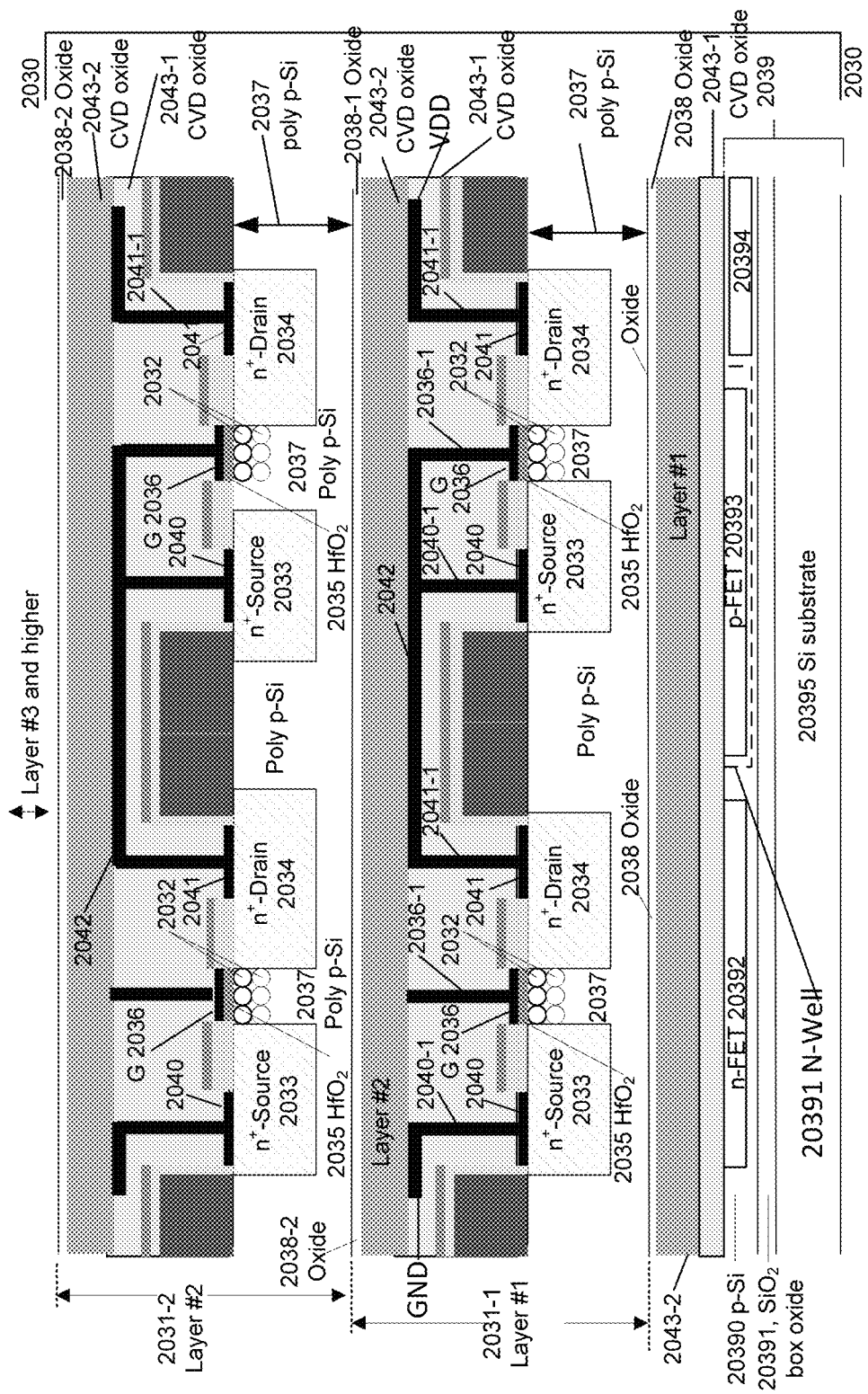
FIG. 27 shows a 3-dimensional vertical stack of layers integrated circuits comprising of electrical circuits using high mobility Ge QDSL n-channel QDC-FETs realized on poly-Si thin films sandwiched between oxide/insulating layers.
Figure 28:
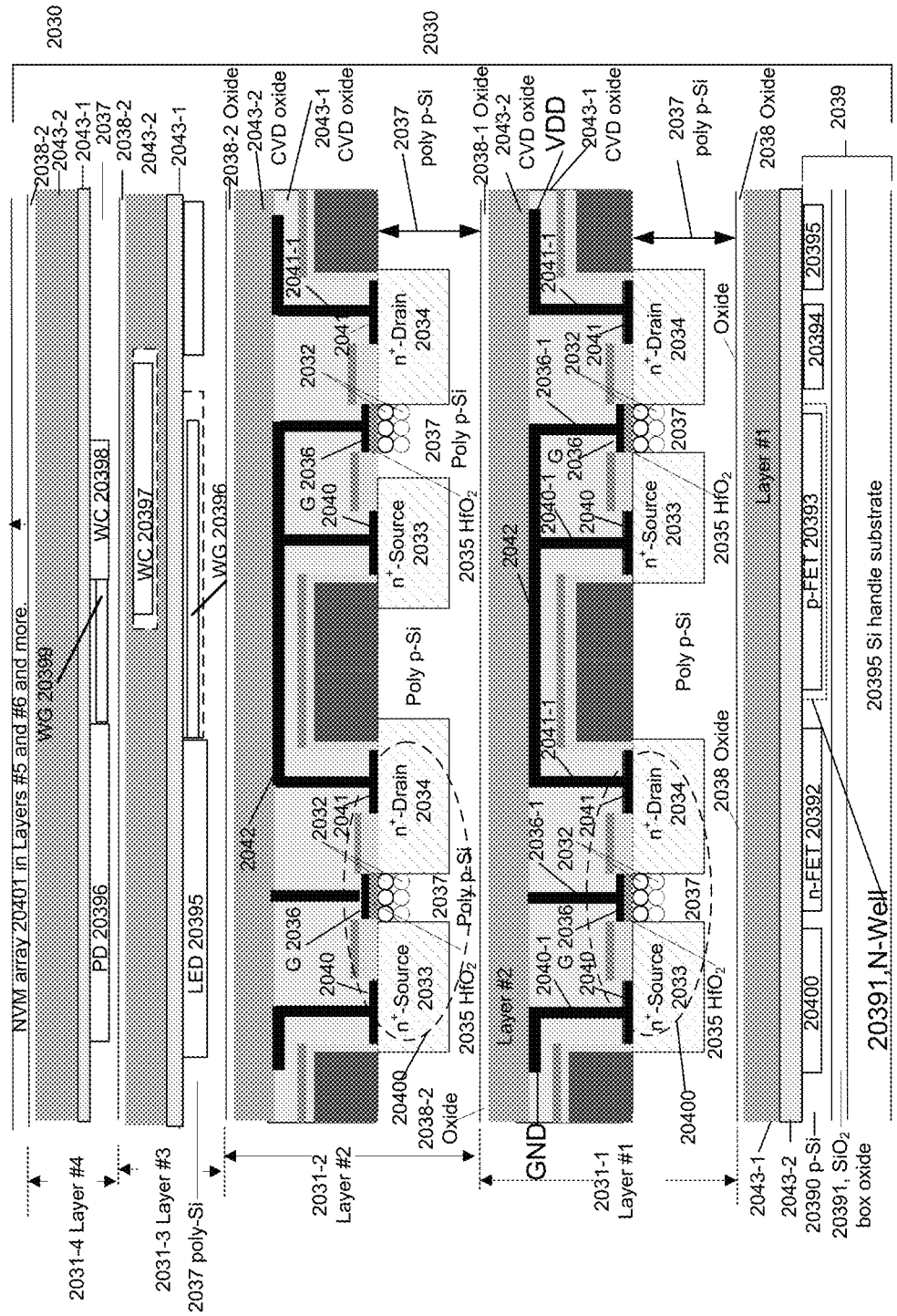
FIG. 28 shows a 3-dimensional vertical stack of layers integrated circuits comprising of electrical circuits using high mobility Ge QDSL n-channel QDC-FETs realized on poly-Si thin films sandwiched between oxide/insulating layers, whereas various functional blocks are connected via optical interconnects. The optical interconnects require the integration of LEDs and photodetectors.
Figure 29:
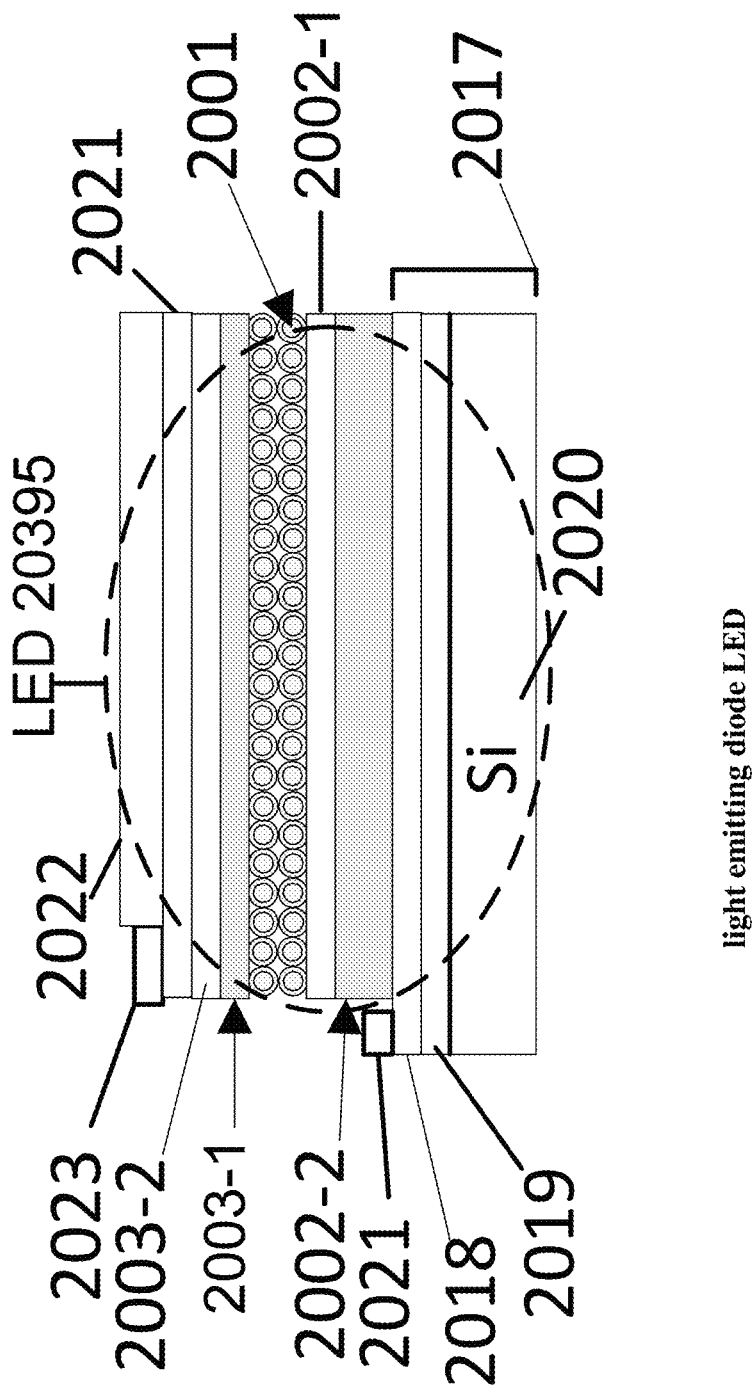
FIG. 29 shows cross-sectional details of a light-emitting diode (LED) shown in FIG. 3(b) in layer #3 (2031-3).
Figure 30:
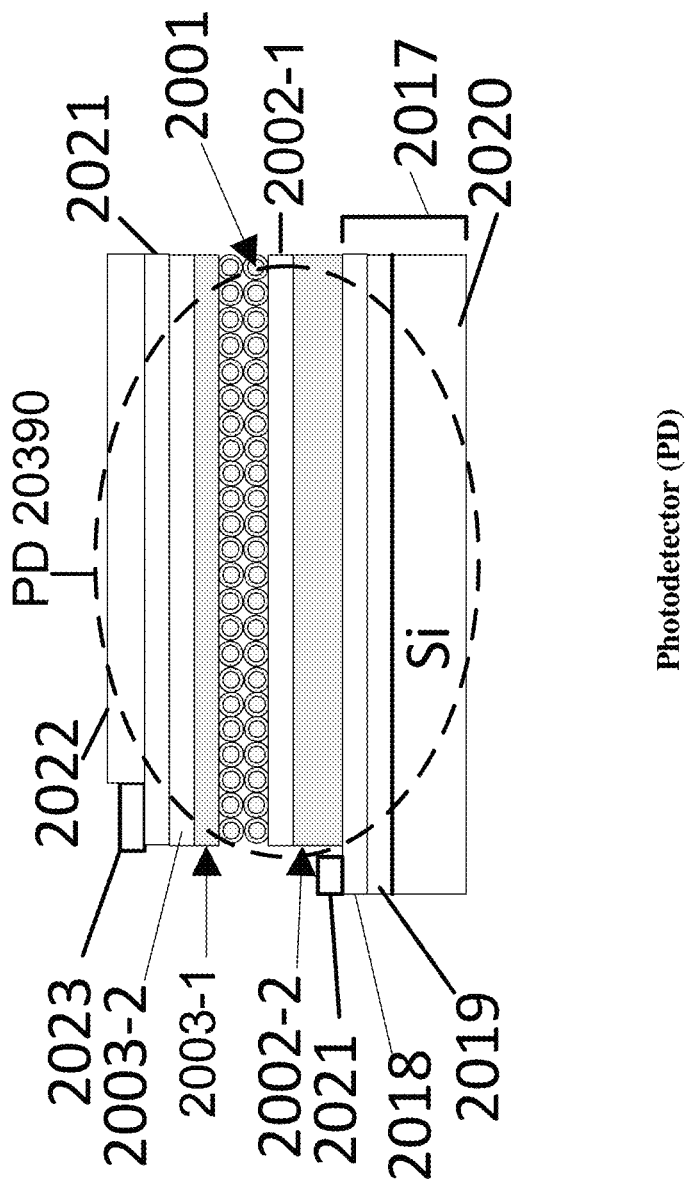
FIG. 30 shows the details of a photodetector (PD) shown in FIG. 3(b) in layer #4 (2031-4).
Figure 31:
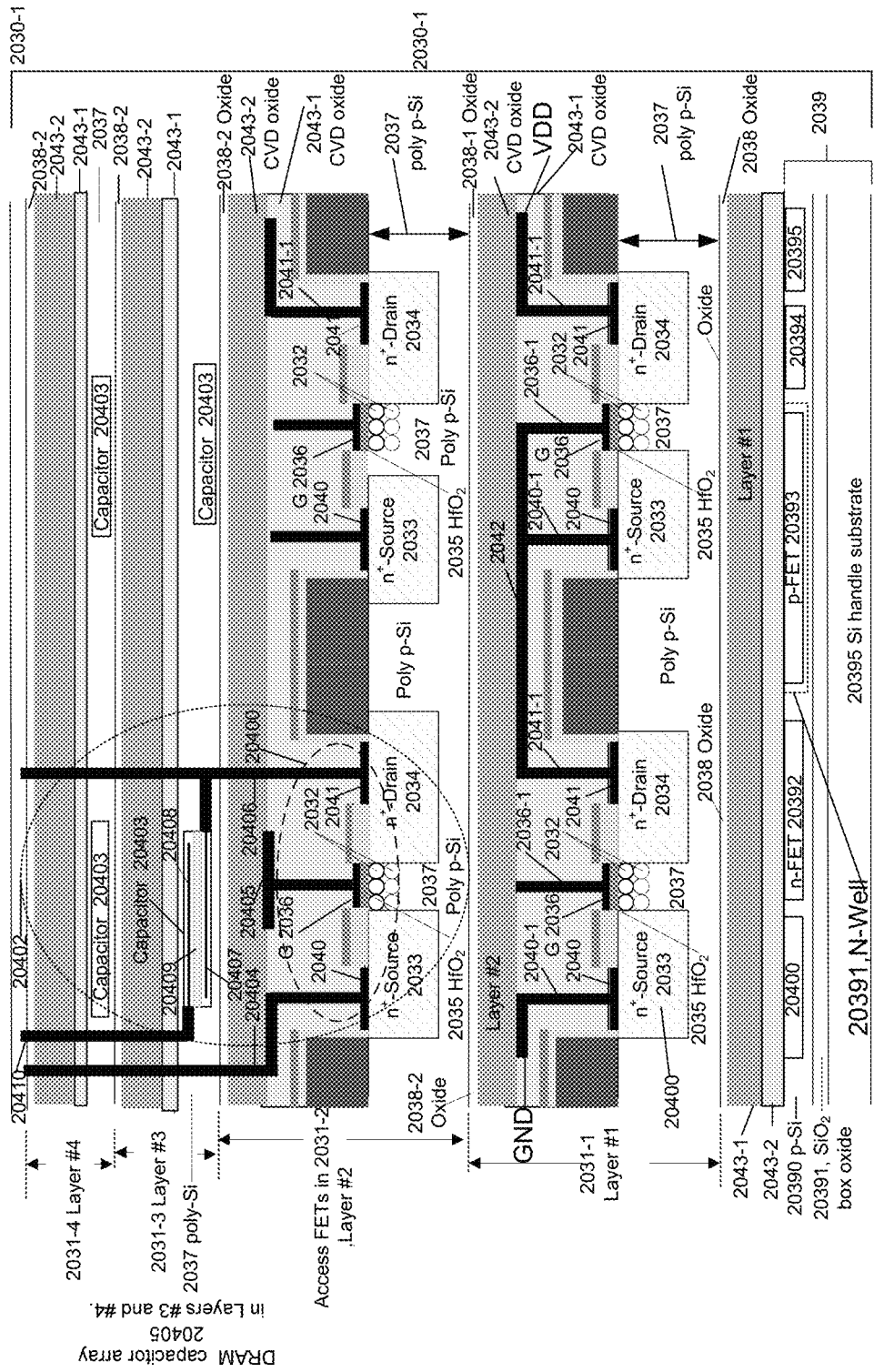
FIG. 31 shows the cross-sectional schematic of a vertically stacked 3-dimensional integrated circuit, comprising of dynamic random access memory (DRAM) cells in layers 2, 3 and 4. The access transistors are realized by QDC-FETs or CMOS FETs located in different layers. The storage capacitors are implemented in one or more layers.
Figure 32:
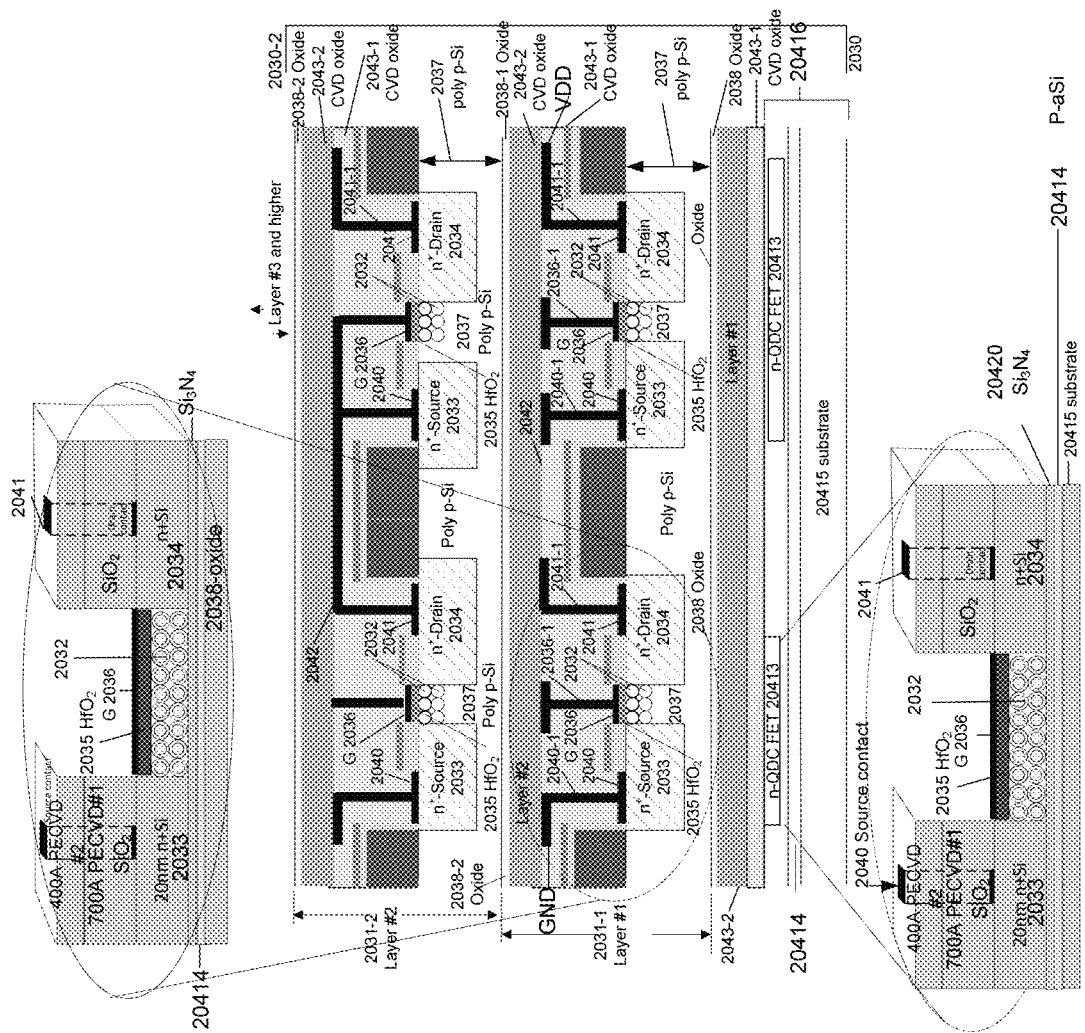
FIG. 32 shows a QDC-FET as thin film transistors (TFTs) for addressing pixels in flat panel displays (FPDs).
Figure 33:
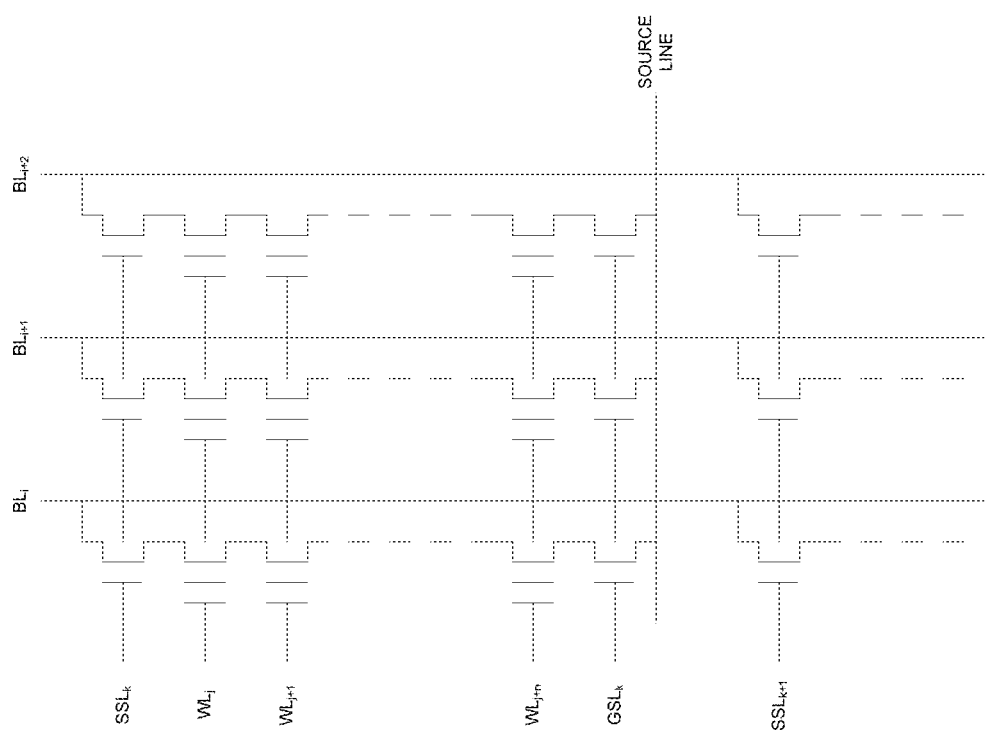
FIG. 33 shows a floating gate nonvolatile memory NAND architecture, in accordance with the prior art.
Figure 34:
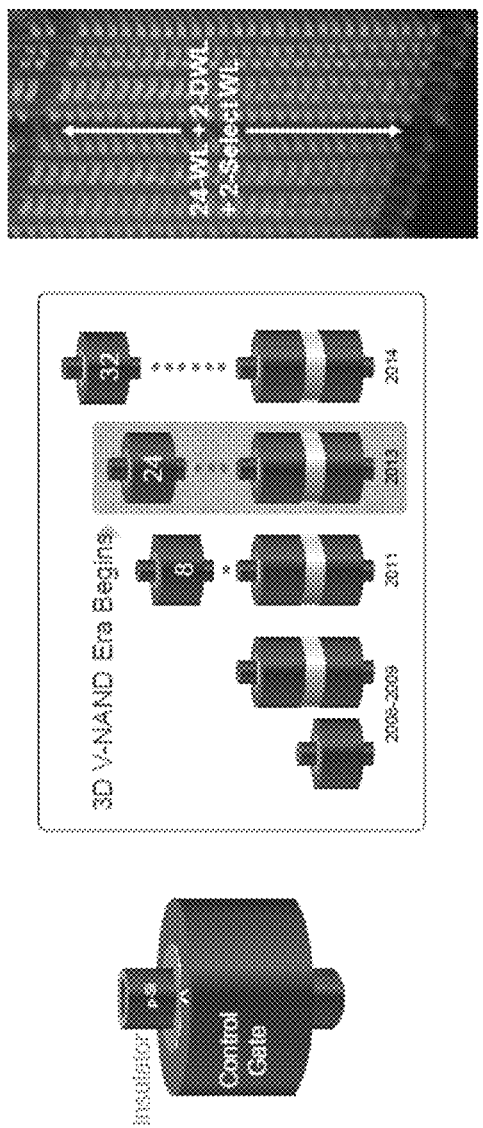
FIG. 34 shows a schematic diagram and cross-sectional view of 3D V-NAND array, in accordance with the prior art.
Figure 35:
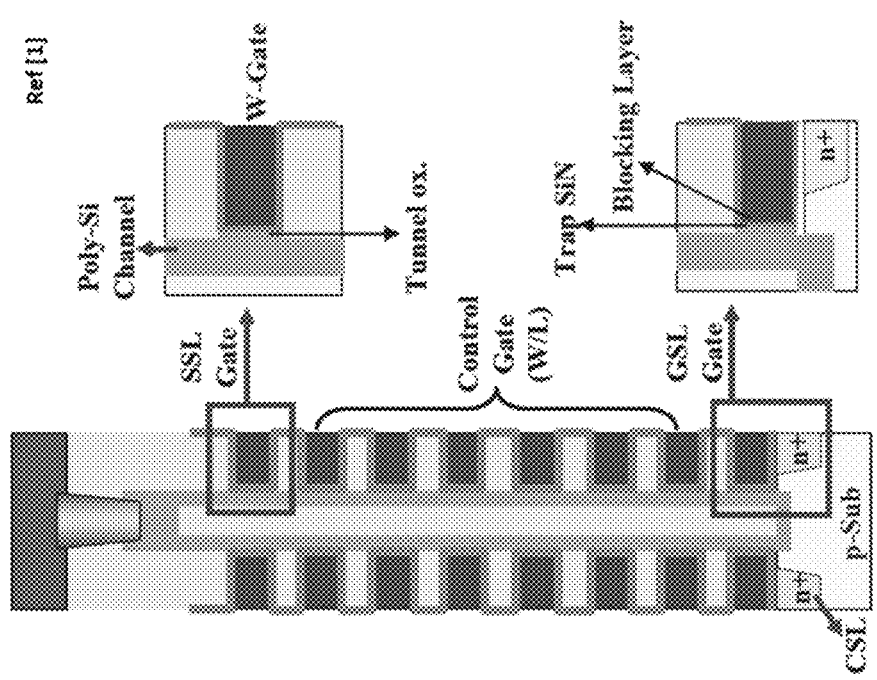
FIG. 35 shows a cross-sectional schematic showing silicon nitride trap layer and poly-Si channel in vertical stacked cells in a V-NAND array, in accordance with the prior art.
Figure 36:
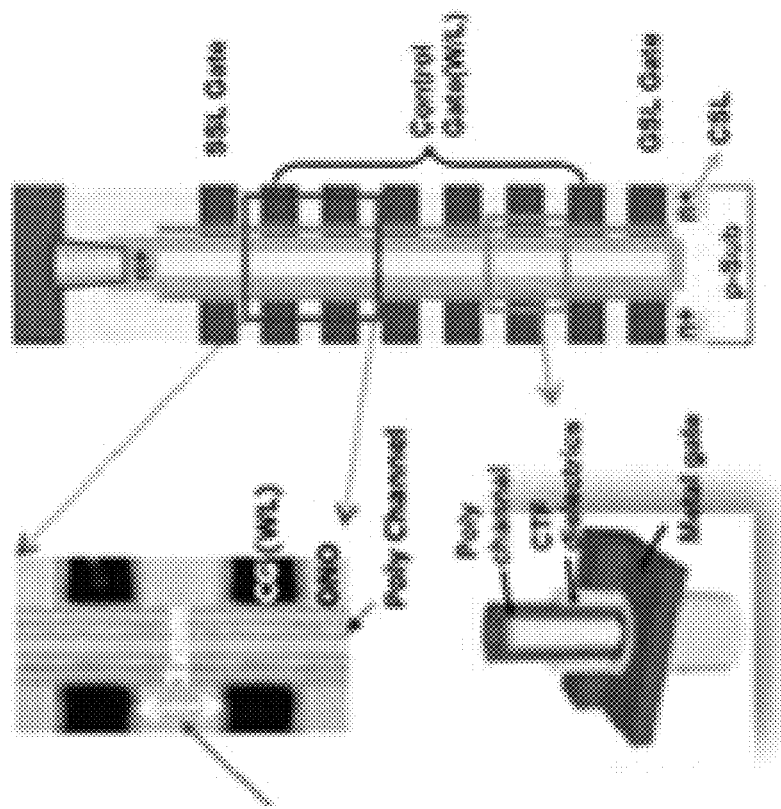
FIG. 36 provides additional details of V-NAND cell (charge trap flash, CTF) construction, in accordance with the prior art.
Figure 37A:
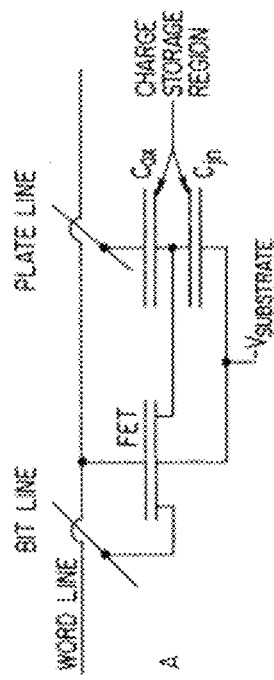
FIG. 37A shows schematically a one-transistor (FET) and one-capacitor cell ($C_{ox}$), in accordance with the prior art.
Figure 37B:
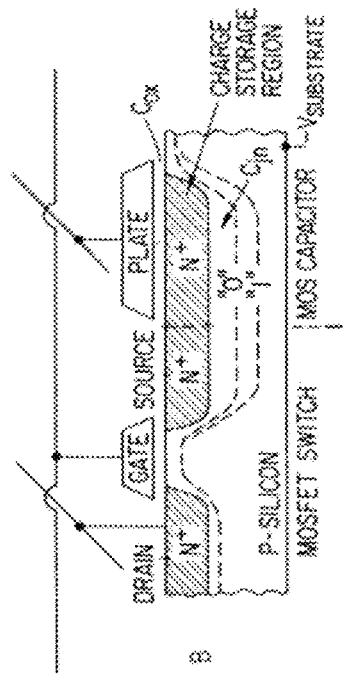
FIG. 37B shows the device cross-section with access FET on left and MOS capacitor on right, in accordance with the prior art.
Figure 37C:
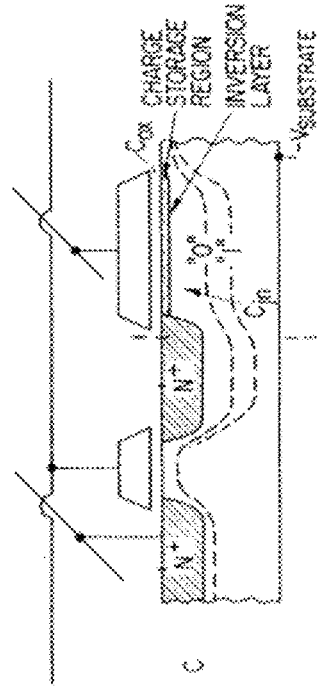
FIG. 37C shows the writing "1" and "0", in accordance with the prior art.
Figure 38:
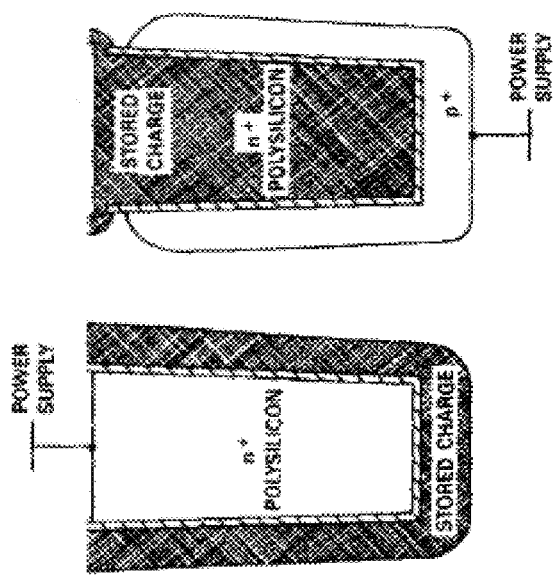
FIG. 38 shows a trench capacitor storing charge, in accordance with the prior art.
Figure 39:
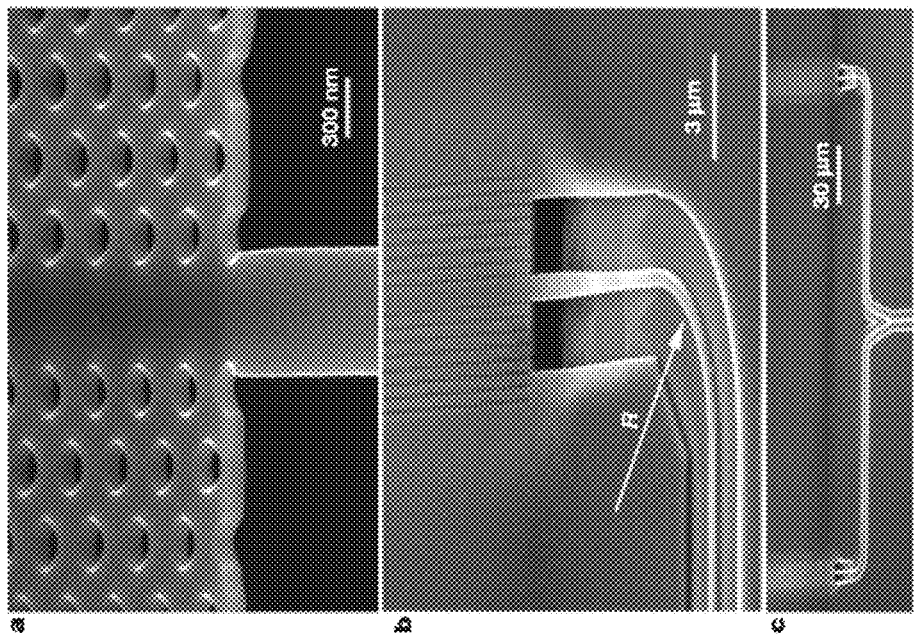
FIG. 39 shows optical waveguides that are used to waveguide light from light-emitting diodes (LEDs) to photodetectors (PDs), in accordance with the prior art.
Figure 42:
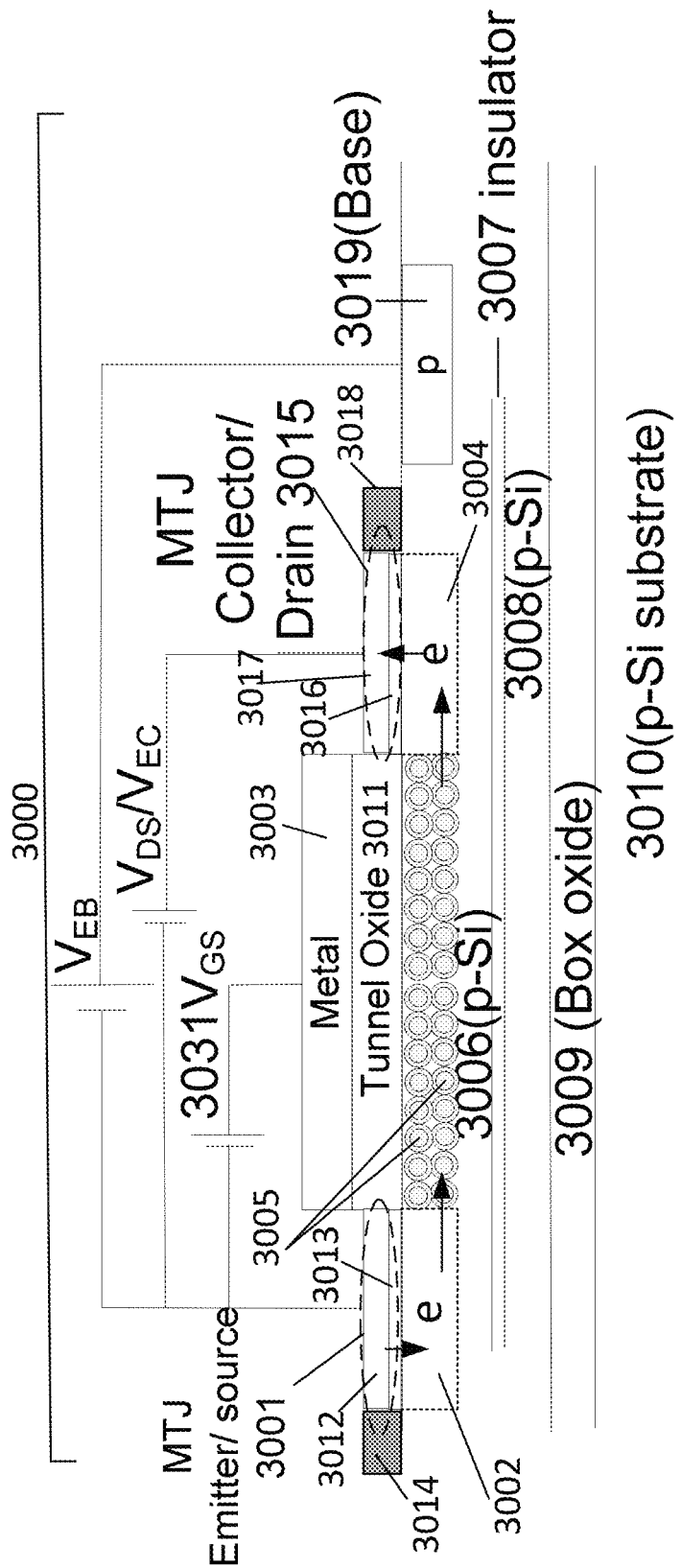
FIG. 42 shows a cross-section of a Ge or Si quantum dot channel (QDC) device introducing spin polarized electrons by magnetic tunnel junction in source region, transporting them under gate, and collecting them at the drain region.
Figure 43:
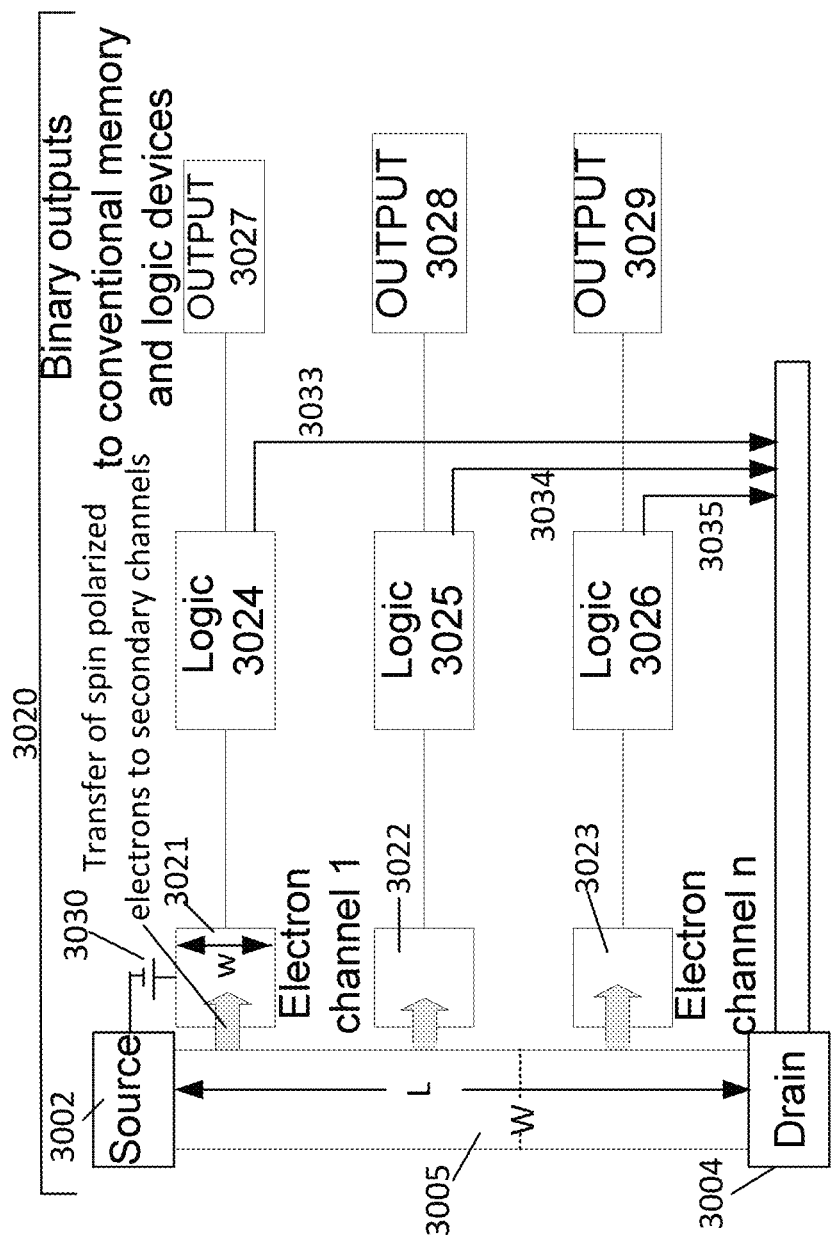
FIG. 43 shows a top view of transfer of spin polarized electrons from primary to various secondary quantum dot channels serving as electron waveguides. Also shown is the logic performed and binary output which is interfaced with conventional incoherent logic.
Figure 44:
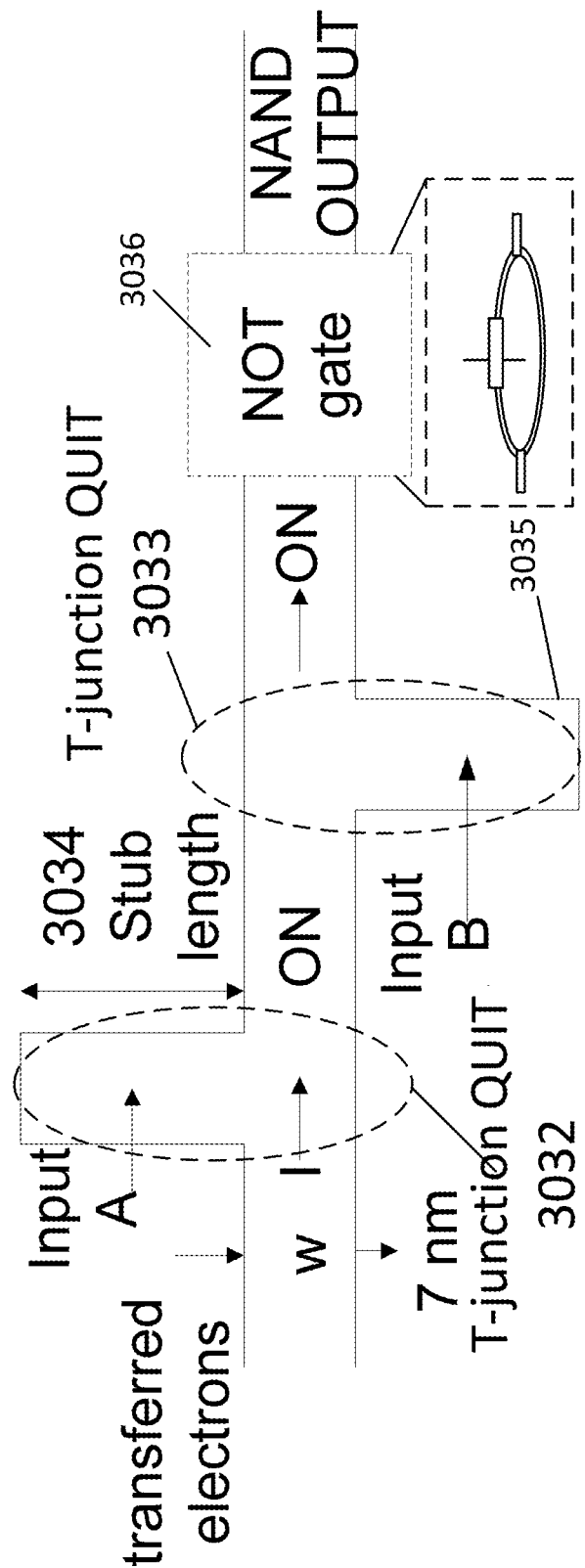
FIG. 44 shows a top view of quantum interference logic gates formed using T-junctions type quantum interference transistors (QUITs). Here, quantum dot channel serves as electron waveguides, using ballistic coherent electrons.

FIG. 23 shows an embodiment of integration showing an integrated quantum dot gate (QDG) static random access memory (SRAM) cell, a quantum dot access channel-NVRAM, and a conventional CMOS n-FET.

FIG. 23 shows integration of QDAC-NVRAM cell (in various embodiments selected from 1400, 1410, 1420) with conventional CMOS logic as well as multi-valued logic (MVL) using quantum dot gate (QDG) FETs.

The quantum dot layer 73 may serve as a floating gate in NVRAM and quantum dot gate layer in QDG-FET (shown in the left panel). The quantum dots need not be assembled in conventional FET or CMOS based circuits.

All the devices can be integrated on a common substrate 14. The tunnel oxide layer 800 could be same in one embodiment or varying for different devices. Since all the devices shown above use CMOS processing, we can selectively fabricate quantum dot based devices and conventional logic, which makes it easier to integrate with existing architectures.

Due to CMOS compatibility, has the potential of significantly reducing the overall power consumption in microprocessors.

Referring to FIG. 1(a), the light-emitting diode 2000 device is p-n junction diode using layers of GeOx-Ge cladded dots forming quantum dot superlattice (QDSL) 2001. The QDSL layer may have two or more layers of GeOx-cladded Ge quantum dots. The quantum dots are sandwiched between p-type (2002) and n-type (2003) semiconductor layers having larger band gap than the direct mini-energy band gap of the Ge QDSL. Here, p-type semiconductor layers (2002) are selected from hydrogenated amorphous Si:H, SiC:H layers, II-VI layers such as p-ZnSTe, p-ZnCdTe, p-ZnTe. While the n-type (2003) layer may be selected from SiC:H layers, II-VI layers such as ZnCdSe, ZnCdS, CdS, CdInGaSe. Two or more n-type layers with appropriate band gaps can be used as shown (2003-1, 2003-2). The layer should meet the energy band being higher than Ge QDSL layer (2001). The p-type semiconductor layers (2002-1, 2002-2) on which Ge QDSL is disposed is deposited on substrate (2004) selected from glass having a coating of transparent conducting oxides (2005), p-Si, p-Si on insulator, and Si-on-sapphire. The transparent conducting oxide (2005) may serve as an Ohmic contact to p-semiconductor layers. The top contact (2006) is made to n-type layer. The LED (2000) emits light from direct mini-energy band of Ge QDSL upon forward biasing. The light wavelength depend on the dot size and $GeO_x$ cladding thickness.

Figure 1B:
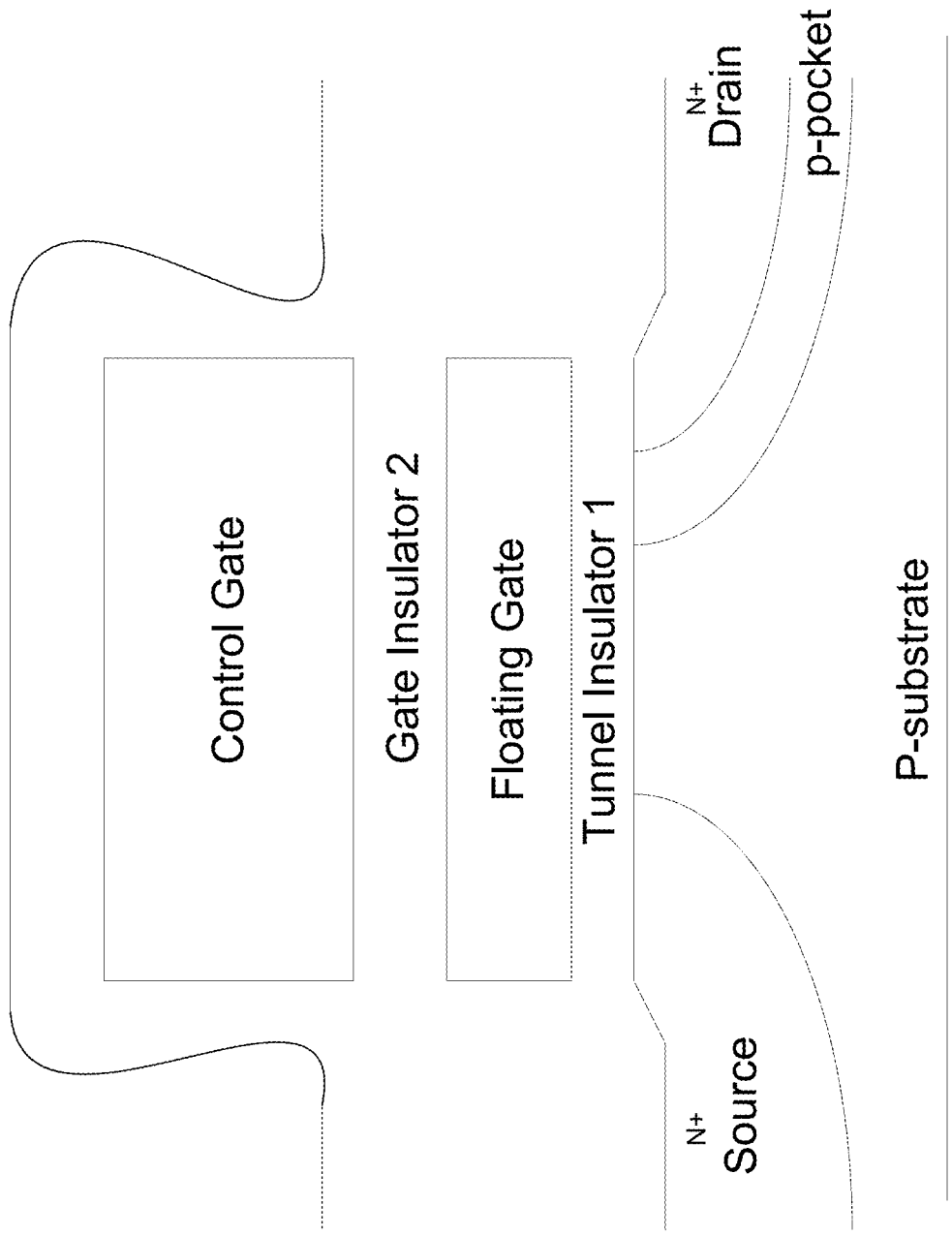
FIG. 1b is a schematic block diagram showing a floating gate memory cell with asymmetric source and drain, on the drain side, in accordance with the prior art.
Figure 1C:
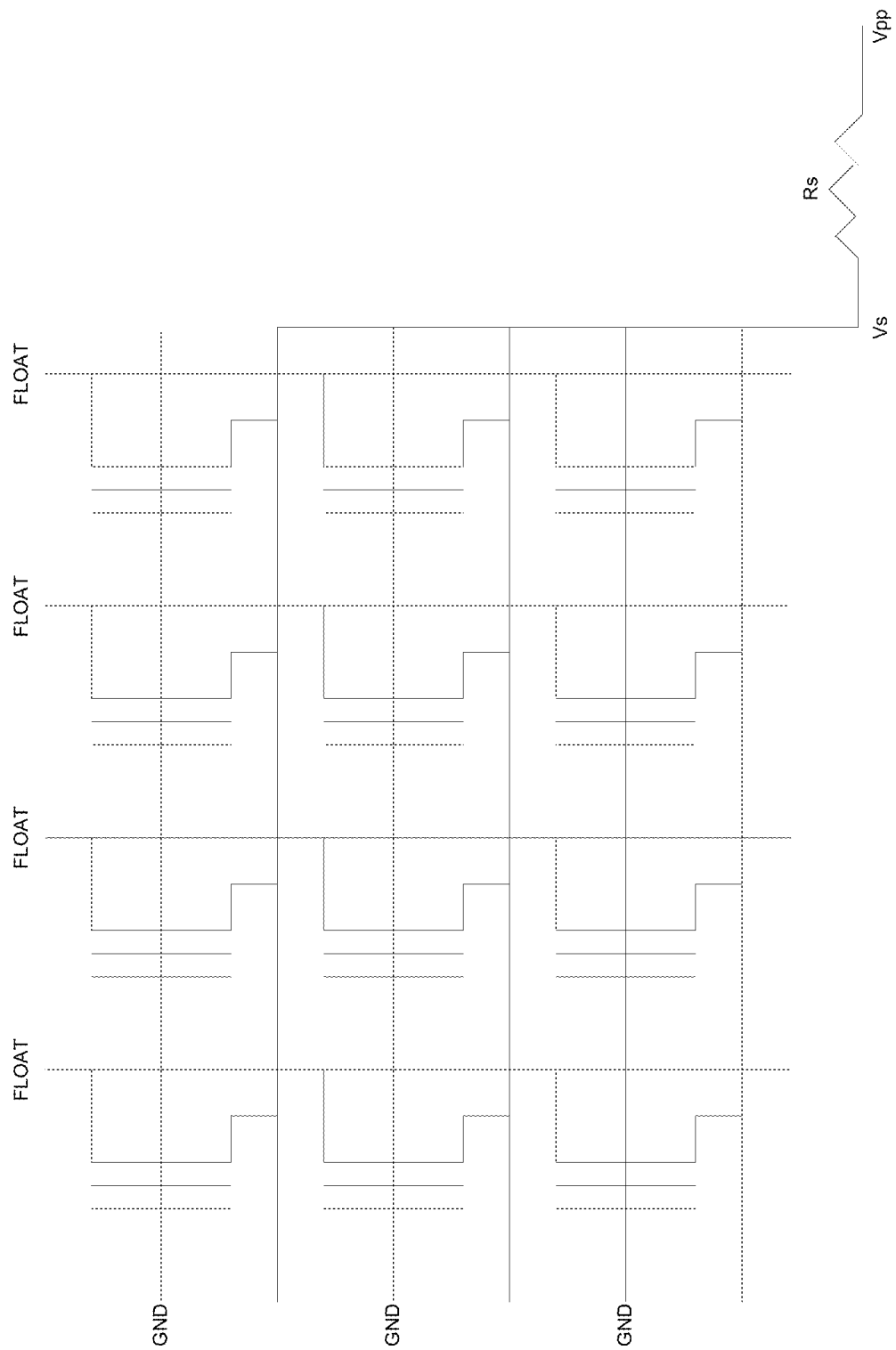
FIG. 1c is a schematic block diagram showing a floating gate memory cell with NOR array architecture illustrating erasing, in accordance with the prior art.
Figure 1D:
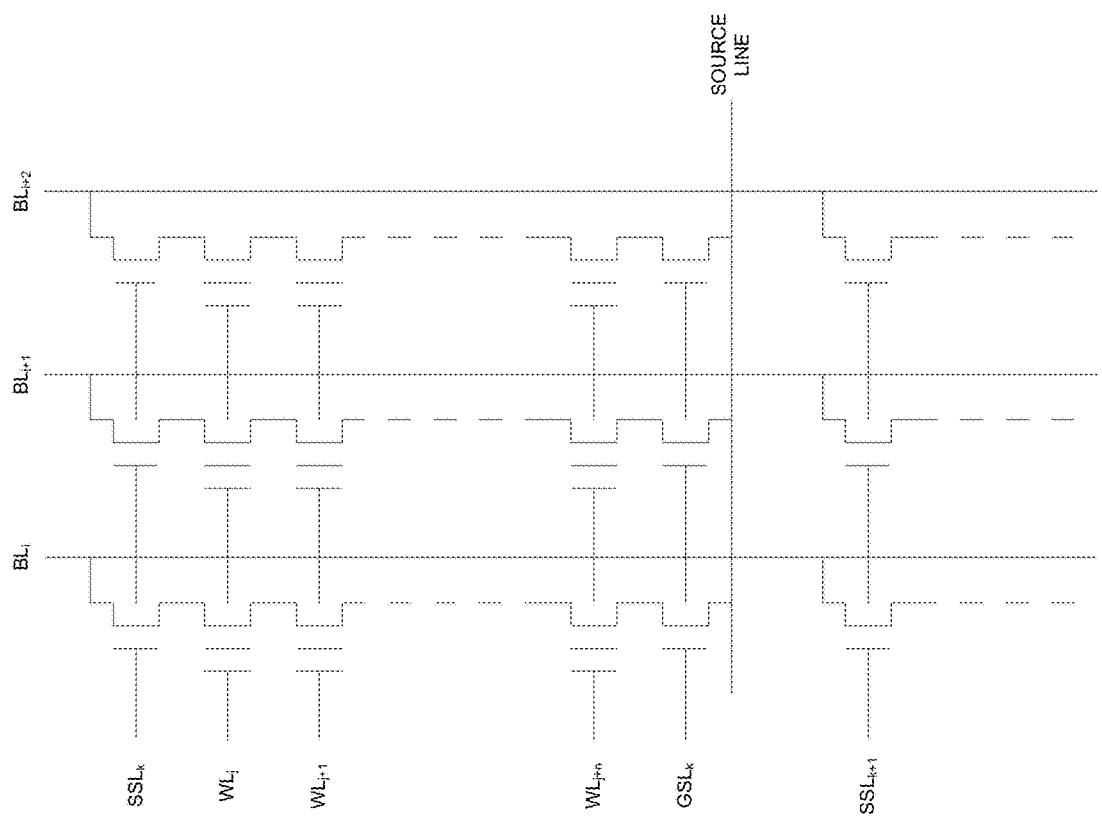
FIG. 1d is a schematic block diagram showing a floating gate memory cell with NAND array architecture, in accordance with the prior art.

Referring to FIG. 1(b), the edge-emitting laser diode 2100 using Ge quantum dot superlattice (QDSL) active layer 2001. The Ge QDSL is sandwiched between first (2002-1) and second (2002-2) p- and first (2003-1) and second (2003-2) n-semiconductor layers, serving as electronic barrier and photon confinement layers. The first p-semiconductor layer (2002-1) and first (2003-1) n-semiconductor layers are selected one from amorphous Si:H, SiC:H. These layers, disposed on either side of the Ge QDSL, serves the function of an electronic barrier layers confining injected holes and electrons in the Ge QDSL. The second (2002-2) p-layer is disposed on the bottom side of the first p-type layer and second n-layer is disposed on top of the first n-semiconductor layer. These layers function both as photon confinement and carrier confinement layers. The second (2002-2) p-semiconductor layer is selected from ZnTe, ZnSTe, ZnBeTe, ZnCdSeTe, and second n-semiconductor layer (2003-2) is selected from ZnCdSe, CdS, ZnCdSSe.

The second p-semiconductor layer (2002-2) is deposited on p+Si layer 2018), and $p^+$-Si is part of a silicon-on-insulator (SOI) substrate (2017) comprising of said p+-Si (2018), $SiO_2$ insulator (2019) layer and Si (2020) handle. The heavily doped $p^+$-Si layer (2018) is electrically contacted forming an Ohmic contact 2021). The second n-type semiconductor layer (2003-2) is deposited with a heavily doped n+ poly Si layer (2021) where an Ohmic contact (2023) is formed. The second n-type semiconductor layer and n+ poly Si layer (2021) is deposited with an oxide insulator layer (2022) selected from $SiO_2$, $Al_2O_3$, $Si_3N_4$. This layer serves as the cladding layer to confine photons. The same role is played by box oxide (2019) layer inherent in SOI substrate (2017). The laser diode (2100) emits light from direct mini-energy band of Ge QDSL upon forward biasing. The emission wavelength depend on the dot size and $GeO_x$ cladding thickness. The placement of top contact stripe (2023) is shown schematically. It could be in the middle of the structure. The laser bars can be obtained by cleaving the two end faces determining the cavity length.

Figure 2A:
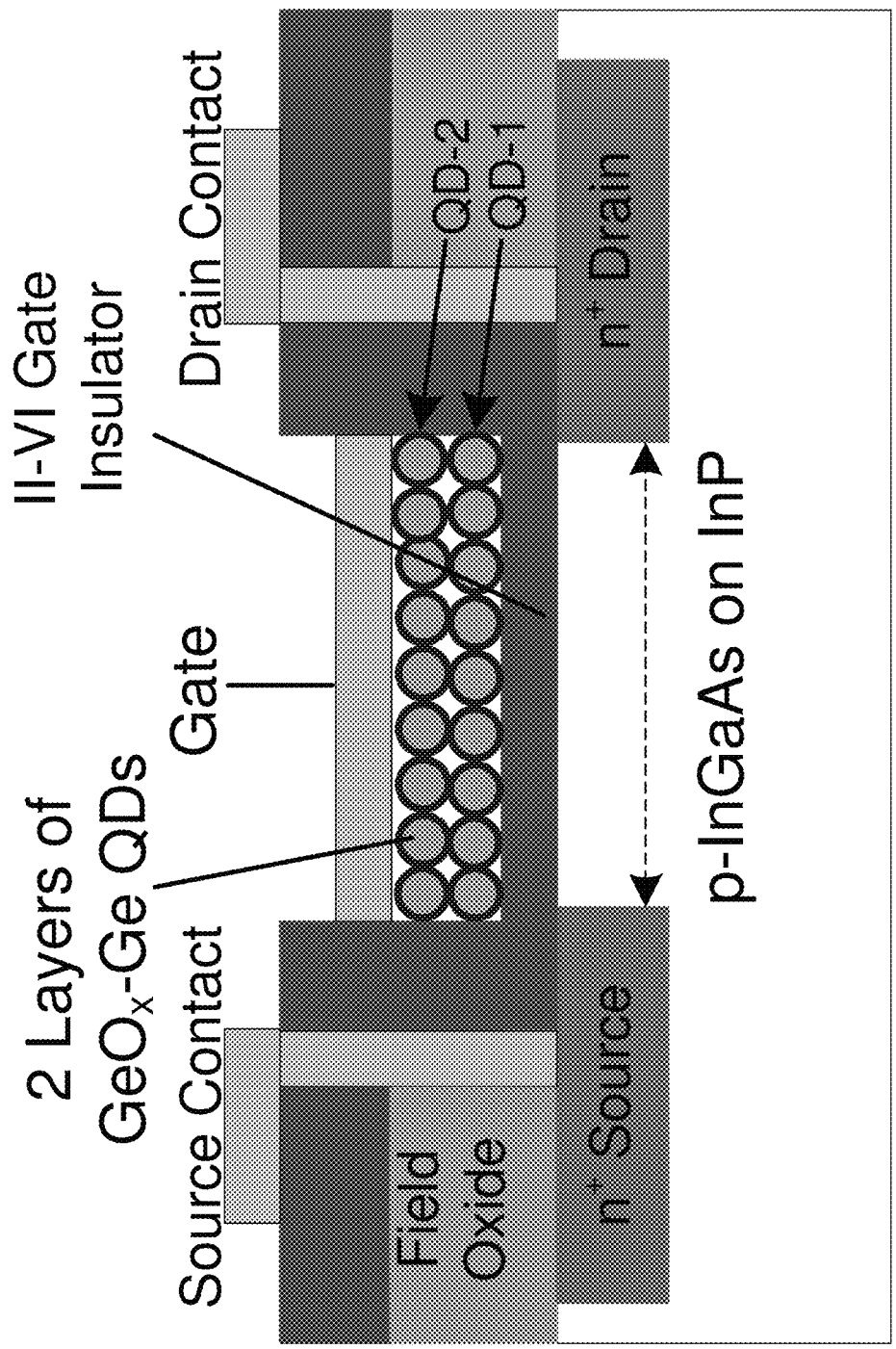
FIG. 2a is a schematic block diagram showing a quantum dot gate 3-state FET, in accordance with the prior art.
Figure 2B:
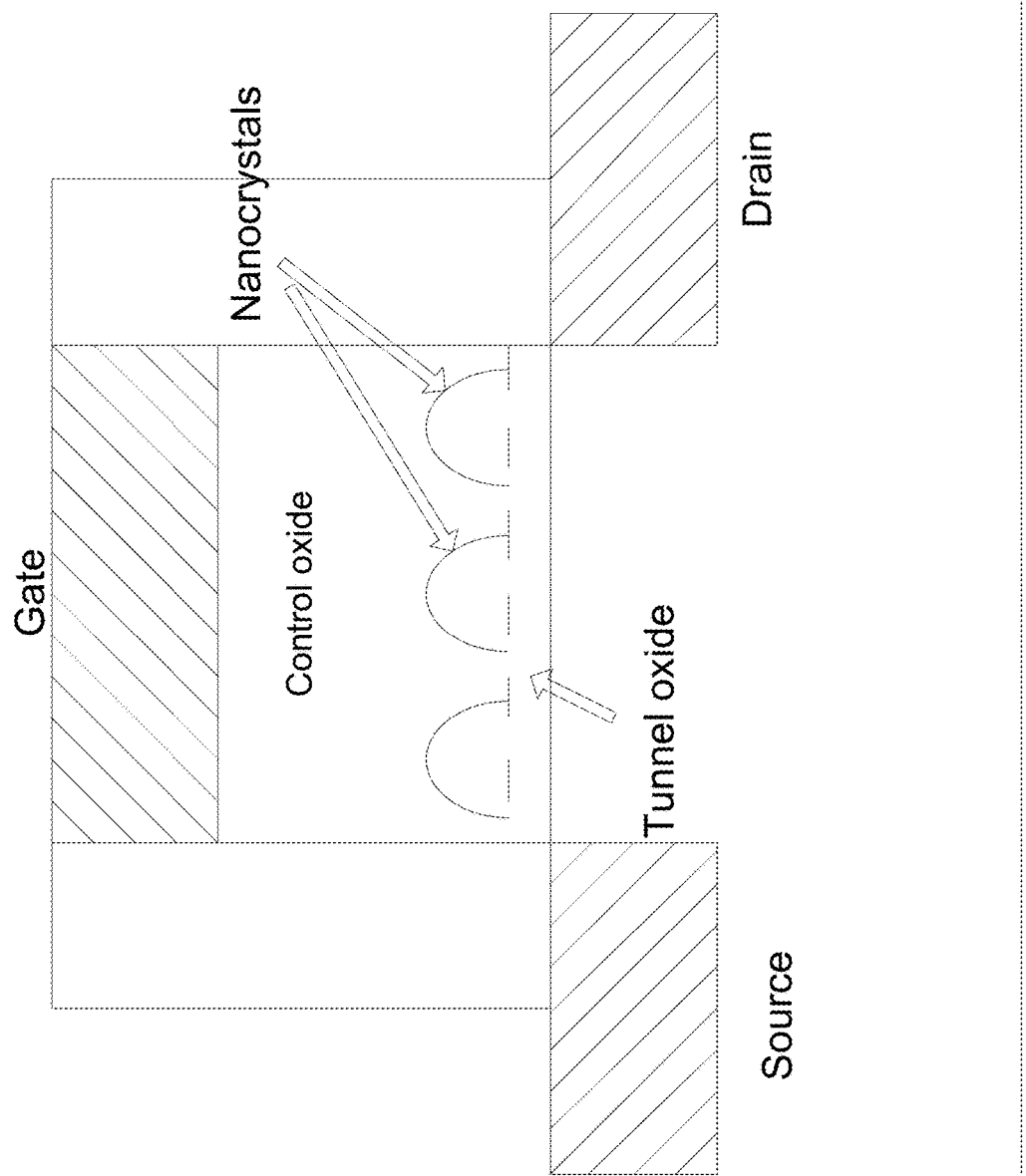
FIG. 2b is a schematic block diagram showing showing a conventional nanocrystal quantum dot floating gate memory, in accordance with the prior art.

Referring to FIG. 2, a quantum dot channel floating gate nonvolatile memory device 2007, comprising a layer of quantum dot superlattice (2008). The quantum dot superlattice includes two or more layers of cladded quantum dots, having thin cladding layer on quantum dot and is comprised of higher energy gap oxide than the gap of the quantum dot. The QDSL layer is located between a source 2009 and drain 2010 region, said drain and source regions are n+ type. The QDSL forms the transport channel which conducts current between source and drain upon biasing. Disposed on quantum dot superlattice is a tunnel oxide layer 2011. The tunnel oxide layer is selected from HfO2, HfAlO2, SiO2, GeO2 and other insulator layers, the tunnel oxide layer is thin enough to transfer carriers from the quantum dot channel to the floating gate layer 2012. The bottom side of floating gate layer is disposed on tunnel oxide, and the top side of floating gate layer is deposited with a control gate dielectric insulator layer 2013. The said floating gate layer is one selected from $Si_3N_4$, cladded Si, Ge quantum dots, and metal quantum dots. Disposed on control gate dielectric insulator layer 2013 is the gate metal contact 2014. The control gate dielectric insulator layer is selected from HfO2, HfAlO2, SiO2, GeO2 and other insulator layers.

The quantum dot superlattice forming the transport channel is disposed on a p-type poly Si thin film 2015, and the poly-Si thin film is disposed on an insulator 2016 selected from SiO2, HfO2, Si3N4. The nonvolatile memory is shown comprising a plurality of quantum dot superlattice transport channel nonvolatile memory cells (shown as 1 . . . to N) which are stacked vertically in a NAND architectural configuration. The NAND architectural configuration comprises of memory cells in series, the memory cells are terminated by field-effect transistors (FIG. 12a) providing access to source and drain regions of the top and bottom nonvolatile cell in series. The NAND configuration shown in FIG. 12a in x-y plane. FIG. 2 shows along the z-axis. A combination of FIG. 2 and FIG. 12a will result in a NAND memory device in 3-dimensions.

Referring to FIG. 3(a), a vertically stacked 3-dimensional layered integrated circuit structure 2030 comprising of more than one layer of quantum dot channel field effect transistors. First layer 2031-1 of quantum dot channel (QDC) field effect transistors (FETs) interconnected as a two transistor inverter in n-MOS configuration. Here, one n-QDCFET (left) is shown as a driver and the other FET (right) as a load. QDC-FETs comprise of at least one layer of quantum dots serving as the transport channel 2032. The transport channel is a quantum dot superlattice (QDSL) layer, which includes two or more layers of cladded Ge quantum dots. The cladding layer on quantum dots is thin and is of higher energy gap than the energy gap of the quantum dot. In one embodiment, the cladding layer is selected from $GeO_x$, $SiO_x$, $HfO_2$, ZnSSe, the Ge QDSL layer 2032 is located between a source 2033 and drain 2034 region, and drain and source regions are $n^+$ type, resulting in n– channel QDC-FET.

The Ge quantum dot superlattice transport channel 2032 is deposited with a tunnel oxide layer 2035, selected from $HfO_2$, $HfAlO_2$, $SiO_2$, $GeO_2$ and other insulator layers. The tunnel oxide layer 2035 is deposited with a gate layer 2036, and gate layer is selected from TiN, TaN, doped poly-Si, Al, Au, and other metals to provide desired threshold voltage $V_{TH}$. The Ge quantum dot superlattice transport channel is disposed on a p-type semiconductor layer 2037 selected from poly Si, a-Si:H, a-SiGe:h, and a-SiC:H, thin film, and the p-type semiconductor thin film is disposed on an insulator layer 2038 selected from $SiO_2$, $HfO_2$, $Si_3N_4$. The insulator layer 2038 is deposited on a substrate 2039. The source 2033 and drain 2034 regions are deposited with Ohmic contacts 2040 and 2041, respectively. The source, drain and gate contacts are electrically interconnected to form electrical circuits using first layer 2031-1 of quantum dot channel field effect transistors QDC-FETs.

The electrical interconnects including 2042 are isolated by an insulator layer comprised of two parts 2043-1 and 2043-2. This layer is constructed such that it surrounds all electrical contacts and interconnects. In one embodiment, it may be deposited using chemical vapor deposition (CVD). That is, using CVD $SiO_2$, for example. The top part of CVD oxide layer is 2043-2. The bottom part of CVD oxide is 2043-1, which isolates source contact 2040, source interconnect 2040-1, gate 2036, gate interconnect 2036-1, drain contact 2041 and drain interconnect 2041-1. The drain interconnects 2041-1 of driver QDC-FET (left FET) is connected via interconnect 2042 to source interconnect 2040-1 and gate interconnect 2036-1 of load QDC-FET (right). The drain interconnect 2041-1 of load QDC-FET (right) is connected to supply VDD and source interconnect 2040-1 of driver QDC-FET to ground GND or VSS.

The top surface of CVD oxide layer 2043-2 is panarized and is deposited with the second insulator 2038-1. A second layer 2031-2 of quantum dot channel field effect transistors (FET) and interconnects are realized on the second insulator layer 2038-1. The second layer 2031-2 comprises of QDC-FET based electrical circuits having its own pattern of interconnects per electrical circuit functionality. The addition of third and fourth and a plurality of QDC-FET layers are realized to form 3-dimensional integrated circuit 2030. The 3-D integrated circuit 2030 is disposed on a substrate 2039. In one embodiment, the substrate 2039 is configured as Si-on-insulator (SOI). Here, 20390 is the p-type single crystal thin silicon layer which hosts n-FETs 20392. The 20390 layer also has n-wells 20391 which hosts p-FETs 20393. N- and p-FETs can also be electrically interconnected to form CMOS circuits. Still in another embodiment, in addition to hosting n-FETs, p-FETs, CMOS circuits, the p-type single crystal thin silicon layer 20390 hosts quantum dot access channel (QDAC) nonvolatile random access memory (NVRAM) cells 20394 as described in the original invention. Underneath the p-type single crystal thin silicon layer 20390 is an oxide layer 20391 which is also known as box oxide. The box oxide 20391 is hosted on top of Si substrate 20395.

Referring to FIG. 3(b), a vertically stacked 3-dimensional integrated circuit 2030, comprising of plurality of layers having electrical circuits using QDC-FETs (in layer 2031-1 and layer 2031-2), CMOS-FETs (such as n-FETs 20392 and p-FETs 20393) as well as n-QDC-FETs 20400 (in layer identified as 2039). Light-emitting devices (LED) 20395 are shown to be incorporated in layer 2031-3 as well as 2039. And at least one layer 2031-4 comprising of photodetectors (PD) 20396. Light emitted from Ge QDSL light-emitting diode (20395 in layer 2031-3 upon forward biasing) is interfaced to an optical waveguide (WG) 20396. The output of the optical waveguide (WG) is received by photodetector device (PD) 20396, located in in layer 2031-4, using waveguide couplers (WC) 20397 and 20398 and optical waveguide 20399. In one embodiment, waveguide coupling is achieved by a directional coupler. In addition, tapered waveguides and optical gratings can be used. LEDs 20395 such as in layer 2031-3 and photodetectors 20396 such as shown in layer 20396 are connected to FET circuits shown in layer 2039, 2031-1 and 2031-2.

This enables output of QDC-FET and CMOS electrical circuits located in one or more layers of 3-D integrated stack to be connected via optical interconnects. This reduces the delay time between various electrical functional blocks. The 3-D integrated circuit 2030 permits use of quantum dot access channel based nonvolatile random access memories 20394 as well as vertically stacked array nonvolatile memory cells 20401 such as shown in FIG. 2. These can be realized in layers 5 and 6 etc. In one embodiment the construction of Ge QDSL layer based photodetectors is described below. Here, Ge QDSL 2001 (like LED of FIGS. 1a and 1b) serves as the photon absorbing layer. The Ge QDSL layer is sandwiched between p-type (2002-1, and 2002-2 two layers) and n-type semiconductor layers (2003-1 and 2003-2), having larger energy band gap than the direct mini-energy band gap of the Ge QDSL. The p-type and n-type semiconductor layers in photodetectors are selected from p- or n-doped amorphous Si:H and SiC:H layers, II-VI layers such as p-ZnSTe or p-ZnTe or n type ZnCdSe or n type CdS.

The p-type semiconductor layer 2002-2 on which Ge QDSL photodetector is disposed is deposited on substrate 2017, selected from glass coated with transparent conducting oxides, p-Si, p-Si on insulator, Si-on-sapphire. The p-type and n-type layers are contacted by Ohmic contacts 2021 and 2023, respectively, which are used for biasing. In one embodiment substrate 2017 is replaced by an oxide layer (2038-2). Still in another embodiment, light emitting devices 20395 are realized in SOI substrate 2039 in place of layer 3 (2031-3). In FIG. 3(b) the electrical interconnects using vias and optical waveguides are not shown in detail. Nonvolatile memory cell array 20401 can be realized in the 3-D IC structure in layers 5, 6 and higher as shown. FIG. 3b-1 shows cross sectional details of a light-emitting diode (LED) shown as a box in FIG. 3(b) in layer #3(2031-3). FIG.

3b-2 shows the details of a photodetector (PD) shown as a box in FIG. 3(b) in layer #4 (2031-4).

Referring to FIG. 3(c) shows the cross-sectional schematic of a vertically stacked 3-dimensional integrated circuit 2030-1 is shown and includes dynamic random access memory (DRAM) cells. In one embodiment, a DRAM cell 20402 consists of a QDC-FET 2040 and a storage capacitor 20403. The access transistor is similar to 20400 and shown to be located in layer 2031-2. The source 2033 of access transistor 20400 is connected to bit line 20404. The gate 2036 (layer 2031-2) is connected to a Word line 20405. The drain 2034 (layer 2031-2) is connected to bit line 20406. Bit line 20406 is electrically connected to one plate 20407 of the storage capacitor and the other plate 20408 is connected to the power supply 20410. The storage capacitors 20403 are realized using high-k dielectric layers 20409. The high-k is selected one from HfAlO2, HfO2, GeOx-cladded Ge and SiOx-cladded Si quantum dots, that is sandwiched between two plates selected from n-type poly-Si, p-type poly-Si, TiN, TaN, Al, W and other metals. Capacitors store charges that represent '0' or '1' bit, and they are refreshed at a clock rate. Desired magnitude of capacitor value is realized by electrically connecting many capacitors in different vertically stacked layers in parallel. DRAM cells are electrically connected to other circuits and devices to implement the functionality of the said 3-D vertically stacked integrated circuit.

FIG. 3(d) shows QDC-FET as thin film transistors (TFTs) for addressing pixels in flat panel displays (FPDs). Here, three layers of vertically stacked field-effect transistors (FETs) 2030-2 are shown. In bottom layer, the FETs are n-channel QDC-FETs 20413 (using high-mobility $GeO_x$—Ge transport channel 2032) on p-type amorphous Si 20414 and/or doped poly-Si thin films deposited on a substrate 20415 (which is selected from glass, sapphire, polyimide). Stacked 3-layers of TFTs can be used for addressing 3 sub-pixels (one for each color, blue, green, red) in an array of pixels used in high performance LCD (liquid crystal displays) or organic light emitting diode (OLED) flat panel displays. In one embodiment, an array of QDC-FETs is realized in layer 20416. Similarly, two more layers 2031-1 and 2031-2 are vertically stacked. Thus, three set of QDC-FETs can address three color (blue, green, red) sub-pixels within a pixel. Two embodiments of QDC-FETs are shown in insets. One QDC-FET 20413 is in first layer 20416. The second one is in layer 2031-1 and is realized on insulating layer 2038. For FET 20413, Ge quantum dot superlattice layer serves as transport channel is 2032, n+ source 2033 and drain 2034 regions, gate oxide 2035 (e.g. IHfO2 or HfAlO2), gate 2036 are similar to those shown for QDC-FETs in layers 2031-1 and 2031-2. The source contact is 2040 and the drain contact is 2041. Interconnects are schematically shown as they depend on the flat panel display architecture. These are not marked separately. Indium tin oxide interconnects (which are transparent) and pads for pixels are not shown in this figure.

PRIOR ART

FIG. 4(a) shows a floating gate nonvolatile memory NAND architecture and FIG. 4(b) is a schematic diagram and cross-sectional view of 3D V-NAND array. FIG. 4(c) shows a cross-sectional schematic showing silicon nitride trap layer and poly-Si channel in vertical stacked cells in a V-NAND array and FIG. 4(d) provides additional details of V-NAND cell (charge trap flash, CTF) construction. FIG. 5(a) shows schematically a one-transistor (FET) and one-capacitor cell ($C_{ox}$) and FIG. 5(b) shows the device cross-section with access FET on left and MOS capacitor on right. FIG. 5(c) shows the writing "1" and "0" and FIG. 5(d) shows a trench capacitor storing charge. FIG. 6 describes formation of Mach-Zehnder interferometer (MZI) or optical modulators using silicon waveguides (including photonic crystal waveguide). Optical waveguides are used to waveguide light from light-emitting diodes (LEDs) to photodetectors (PDs). FIG. 7(a) shows a flat panel display using active matrix addressed organic light emitting diodes (AMOLED) (a) ID-VG transfer characteristics as a function of bias-temperature-illumination stress. FIG. 7(b) shows schematics of etch-stopper (ES) and back-channel-etch (BCE) structures are illustrated and FIG. 7(c) shows a conventional pixel design for an AMOLED panel uses two transistors and one capacitor.

Figure 8:
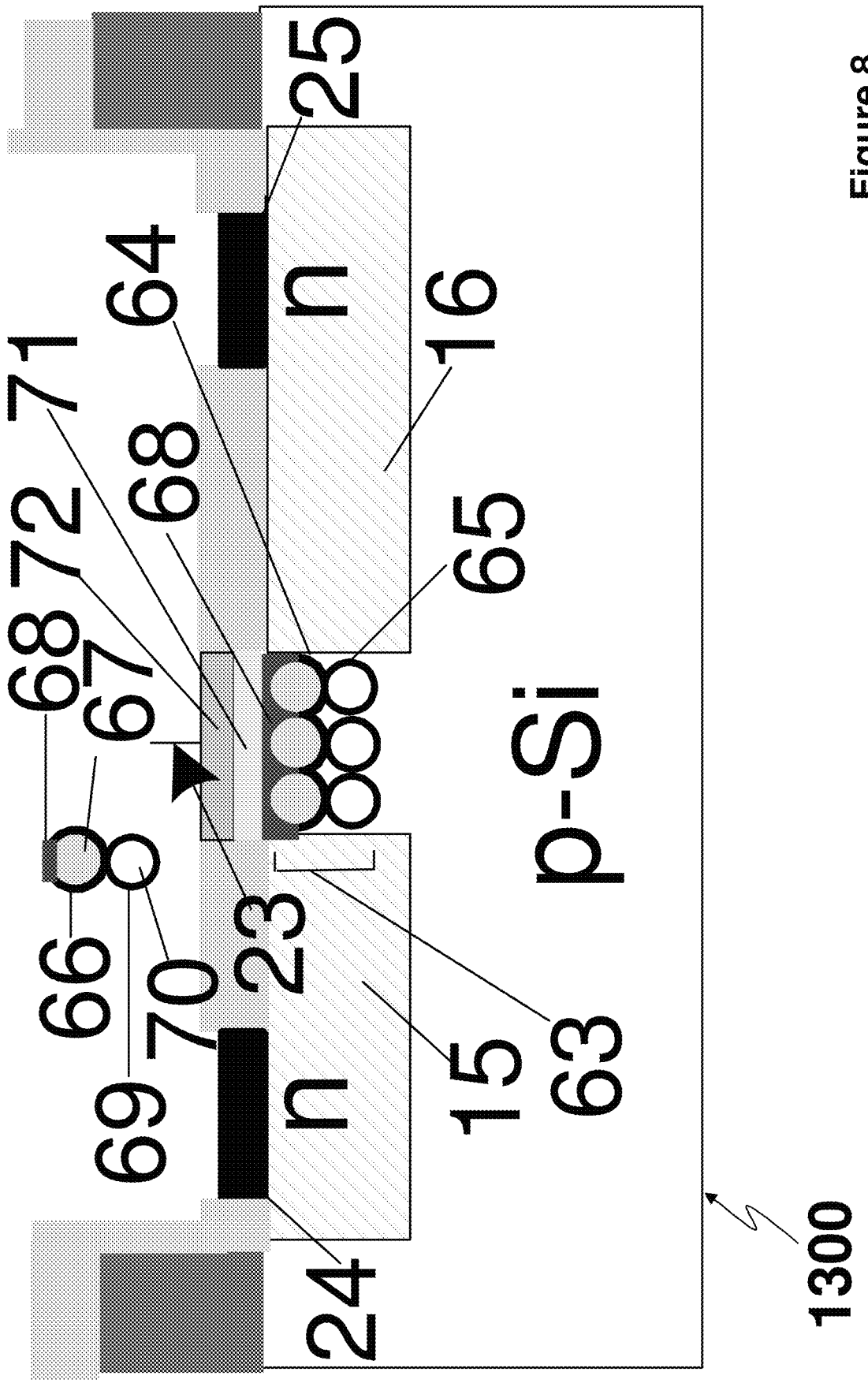
FIG. 8 is a schematic block diagram of a Quantum dot channel having dots cladded with SiO2 as well as an II-VI insulator, in accordance with the present invention.

FIG. 8 (a) Cross-section of a Ge or Si quantum dot channel (QDC) device 3000 introducing spin polarized electrons by magnetic tunnel junction 3001 in primary source region 3002, transporting them under primary gate 3003 into primary quantum dot channel 3005, and collecting them at the primary drain region 3004. The primary quantum dot channel 3005 has a width W and a length L under the primary gate region 3003. The primary source region 3002, primary drain region 3004 and primary quantum dot channel 3005 are disposed on first p-Si layer 3006. First p-Si layer 3006 is disposed on first insulator layer 3007 which is selected one from oxides such as SiO2, HfO2 and lattice-matched ZnMgS or ZnBeMgS layers. First insulator layer 3007 is disposed on second p-Si layer 3008, and the second p-Si layer 3008 is disposed on second insulator layer 3009 such as SiO2 box oxide layer, and the box oxide is deposited on a Si substrate 3010. Disposed on 3005 is a tunnel oxide 3011 and a primary gate layer 3003.

The QDSL layer forming primary and secondary quantum dot channels have disposed on top tunnel oxide insulator layer 3011, and wherein tunnel oxide is disposed with a gate layer (such as 3003 in primary channel) selected one from TaN, TiN, Al, Au, poly-Si and poly-Ge. The magnetic tunnel junction 3001, in one embodiment, consists of a metal-insulator-semiconductor (MIS) type structure which injects electrons into p-Si layer 3006 in the region identified as primary source region 3002. The metal layer is a magnetic thin film 3012 and the insulator layer 3013 is an oxide selected from SiO2, HfO2, CsO, MgO, and ZnO. The magnetic tunnel junction 3001 is surrounded by field oxide region 3014 on all sides except the primary gate region 3003 or tunnel oxide 3004. The magnetic tunnel junction 3015 on the primary drain 3004 is composed of a MIS structure where insulator layer is 3016 and the metal magnetic layer is 3017. The primary drain region 3004 and magnetic tunnel junction 3015 are surrounded by field oxide 3018. Field oxide regions 3014 and 3018 provide confinement of electrons. The first p-Si layer 3006 thickness determines if the gate 3003 will cause partial or full depletion under the primary quantum dot channel 3005.

In one embodiment, the device is configured as a hybrid field-effect transistor (FET comprising of a source, drain and gate region) and a bipolar junction transistor (BJT). Here, the source and emitter are same, collector and drain are same. However, there is a separate p-type base region 3019. In this hybrid structure, base region supports MIS magnetic tunnel junction and provides a pathway for holes to be collected. This is due to the fact that a MIS structure has an injection efficiency and permits some hole current to flow. The hole current will flow via the second p-Si layer 3008 to the base contact in case first p-Si layer 3006 is fully depleted under the primary quantum dot channel 3005 under the gate 3003. However, all the spin-polarized electrons provided by the magnetic tunnel junction are directed to the primary quantum dot channel 3005 and are collected by the drain region 3004. In one embodiment, the primary drain is a conventional drain in place of MIS structure. In another embodiment, the primary source region 3002 is n-region and spin polarized electrons are introduced in it from the magnetic tunnel junction 3001. Thus, in such an embodiment, base 3019 is optional. The source/emitter to gate 3003 voltage 3031 is shown. The source to drain voltage is $V_{DS}/V_{EC}$. The emitter/source to base bias $V_{EB}$ is also shown.

FIG. 8(*b*) Schematic of a quantum dot channel logic device 3020 where transfer of spin-polarized electrons from primary 3005 to various secondary quantum dot channels (3021, 3022, 3023) takes place. The width w of secondary quantum dot channels is such that they serve as electron waveguides. The construction of the secondary quantum dot channels (3021, 3022, and 3023) is similar to the primary quantum dot channel 3005 with QDSL layer comprising of one or more of cladded GeOx-Ge, SiOx-Si quantum dots. The dots have a tunnel oxide insulator like 3011 and a gate layer like 3003. The transfer mechanism of spin polarized electrons from primary to secondary channels is like in charge coupled devices (CCDs). Also shown here is the logic blocks (3024, 3025, and 3026) where desired logic operation (e.g. NAND, NOR, AND, OR) is performed and the binary outputs (3027, 3028, 3029) are interfaced with conventional logic.

A plurality of secondary quantum dot channels (3021, 3022, and 3023) in vicinity and along the length of primary quantum dot channel 3005, and wherein width w of secondary quantum dot channels is less than the length L of primary quantum dot channel. Electrons are transferred from the primary quantum dot channel 3005 to secondary quantum dot channel 3021 upon application of gate voltage 3030 which is greater than primary channel gate voltage 3031 (FIG. 8*a*). Note that all voltages are with respect to primary source region metal contact 3012. In one embodiment, transferred spin polarized electrons from the primary quantum dot channel 3005 are wave-guided into 3021 and interfaced with logic gate 3024. The logic gates are described in FIG. 8*c*.

FIG. 8(*c*) shows top view of quantum interference logic gates formed using T-junctions type quantum interference transistors (QUITs). Here, quantum dot channel serves as electron waveguides, using ballistic or quasi-ballistic coherent electrons. Logic is performed using quantum interference transistors realized in electron waveguides in configuration selected from T junctions and quantum interference transistors (QUIT) with two arms like Mach-Zehnder interferometer. T-junctions 3032 and 3033 are shown. The length of stub 3034 of T-junction 3032 is integer multiple of either quarter wave or half wavelength of the quantum dot channel waveguide guide. We describe the layout of logic gate 3024 below. The T-junction QUIT is ON and OFF depending on if the stub 3022 is ON or OFF. That is if its gate voltage keeps the quantum dot channel forming the stub is ON or OFF. The logic operation is shown to be carried out using two input voltage signals A and B to realize a logic function selected from NAND, NOR and AND. The NAND requires a NOT gate which is an inverter. Here, the NOT could be a Mach-Zehnder type device where one arm has gate voltage so that a phase shift of 180 degrees in electron waves is created.

It is noted that FIG. 6 shows an optical Mach-Zehnder interferometer. The difference here is that we have electron waveguides which are much smaller. The output of logic gates (3027, 3028, and 3029) implemented in secondary quantum dot channels is a binary state "1" or "0". The output ends (3033, 3034, and 3035) of the secondary channels is connected to the primary drain region 3004, serving as common return path for spin polarized electrons. Here, in the case of coherent, ballistic/quasi-ballistic electrons and their waveguides and QUITs, the overall logic performed in plurality of secondary quantum dot channels is global. That is, logic is dependent on ON and OFF states of all inputs applied to secondary quantum dot channel based logic blocks (3024, 3025, and 3026). The primary and secondary quantum dot channels comprise of at least one layer of quantum dot superlattice (QDSL) transport channel. The quantum dot superlattice layer includes one or more layers of cladded Ge, Si, GaAs quantum dots, and the cladding layer selected one from GeOx, SiOx, $HfO_2$, ZnSSe, on quantum dots is thin and is of higher energy gap than the energy gap of the quantum dot. The width of primary and secondary quantum dot channels is in the range of 4-10 nm, and width permits guiding of coherent spin-polarized electrons, and wherein the lengths of T-junction and Mach-Zehnder type quantum interference transistors permit ballistic carrier transport.

Additional Details:

In one embodiment the magnetic tunnel junction injects a pulse of spin-polarized electrons with a duration smaller than the coherence time of the spin polarized electrons in the quantum dot channels. In addition the length L of primary channel 3005 is less than the coherence length of spin polarized electrons. In one version, the width W of primary quantum dot channel and width w of secondary quantum dot channels are such to support spin-polarized electrons with a narrow energy spectrum controlled by the density of states as well waveguide modes.

In accordance with the present invention, the processing of the method of the present invention may be implemented, wholly or partially, by a controller operating in response to a machine-readable computer program. In order to perform the prescribed functions and desired processing, as well as the computations therefore (e.g. execution control algorithm (s), the control processes prescribed herein, and the like), the controller may include, but not be limited to, a processor(s), computer(s), memory, storage, register(s), timing, interrupt (s), communication interface(s), and input/output signal interface(s), as well as combination comprising at least one of the foregoing.

Moreover, the method of the present invention may be embodied in the form of a computer or controller implemented processes. The method of the invention may also be embodied in the form of computer program code containing instructions embodied in tangible media, such as floppy diskettes, CD-ROMs, hard drives, and/or any other computer-readable medium, wherein when the computer program code is loaded into and executed by a computer or controller, the computer or controller becomes an apparatus for practicing the invention. The invention can also be embodied in the form of computer program code, for example, whether stored in a storage medium, loaded into and/or executed by a computer or controller, or transmitted over some transmission medium, such as over electrical wiring or cabling, through fiber optics, or via electromagnetic radiation, wherein when the computer program code is loaded into and executed by a computer or a controller, the computer or controller becomes an apparatus for practicing the invention. When implemented on a general-purpose microprocessor the computer program code segments may configure the microprocessor to create specific logic circuits.

It should be appreciated that while the invention has been described with reference to an exemplary embodiment, it will be understood by those skilled in the art that various changes, omissions and/or additions may be made and equivalents may be substituted for elements thereof without departing from the spirit and scope of the invention. Moreover, the embodiments or parts of the embodiments may be combined in whole or in part without departing from the scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. A p-n junction diode, comprising:
at least one layer of quantum dot superlattice, wherein the quantum dot superlattice includes two or more layers of cladded quantum dots, wherein the cladding is thin and is comprised of higher energy gap oxide than the gap of the quantum dot, wherein the other layer forming the diode is of opposite conductivity than that of the quantum dot superlattice.

2. The p-n junction diode of claim 1, wherein the p-n junction diode is configured as a solar cell, wherein the diode includes at least one layer of quantum dot superlattice, the quantum dot superlattice including two or more layers of cladded quantum dots, wherein the cladding is thin and is comprised of higher energy gap oxide than the gap of the semiconductor dot, the other layer forming the diode as of opposite conductivity than that of the quantum dot superlattice.

3. The p-n junction diode of claim 1, wherein the p-n junction diode is configured as a light emitting diode, wherein the light emitting diode includes at least one layer of Ge quantum dot superlattice, the quantum dot superlattice including two or more layers of cladded Ge quantum dots, wherein the cladding is thin $GeO_x$ layer and wherein the energy gap oxide is greater than the gap of the Ge dot, the other layer forming the diode as of opposite conductivity than that of the quantum dot superlattice.

4. The p-n junction diode of claim 1, wherein the p-n junction diode includes layers of GeOx-Ge cladded dots forming quantum dot super-lattice (QDSL), and
wherein the QDSL super-lattice is sandwiched between a p-semiconductor layer and an n-semiconductor layer,
wherein each of the p-semiconductor layer and the n-semiconductor layer includes a larger band gap than the direct mini-energy band gap of the Ge QDSL, and
wherein the semiconductor layers are selected from amorphous Si:H, SiC:H layers, II-VI layers p-ZnSTe or p-ZnTe or n type ZnCdSe or n type CdS, and
wherein p-type semiconductor layers on which Ge QDSL is disposed is deposited on substrate selected from glass having a coating of transparent conducting oxides, p-Si, p-Si on insulator, Si-on-sapphire, and
wherein forward biasing of the p-n junction diode emits light commensurate to Ge QDSL direct energy bands.

5. The light-emitting diode of claim 4, configured as an edge-emitting laser diode comprising,
Ge quantum dot superlattice (QDSL) active layer, and where in the Ge QDSL is deposited with first and second p- and n-semiconductor layers,
wherein first p- and n-semiconductor layers are selected one from amorphous Si:H, SiC:H, wherein these layers are disposed on either side of the Ge QDSL, and serving as barrier layers, and
wherein the second p-layer is disposed on first p-layer and second p-layer is disposed on first n-semiconductor layers, and
wherein said second p-semiconductor layer is selected from ZnTe, ZnSTe, ZnBeTe, ZnCdSeTe, and second n-semiconductor layer is selected from ZnCdSe, CdS, ZnCdSSe,
wherein second p-layer is disposed on $p^+$-Si layer, and $p^+$-Si is part of a silicon on insulator (SOI) substrate comprising of said p+-Si, $SiO_2$ insulator layer and Si substrate, wherein $p^+$-Si layer is electrically contacted forming an Ohmic contact, and
wherein second n-type semiconductor layer is disposed with an Ohmic contact directly or using an n+ poly Si layer,
wherein in second n-type semiconductor layer or n+ poly Si layer are deposited with an oxide insulator selected from $SiO_2$, $Al_2O_3$, $Si_3N_4$.

6. The p-n junction diode of claim 1, wherein the p-n junction diode is configured as a photodetector, wherein the photodetector diode includes at least one layer of Ge quantum dot superlattice, the quantum dot superlattice including two or more layers of cladded Ge quantum dots, wherein the cladding is thin $GeO_x$ layer and wherein the energy gap oxide is greater than the gap of the Ge dot, and
wherein the Ge QDSL layer is sandwiched between p-type and n-type semiconductor layers, respectively, and said p-type and n-type layers having larger energy band gap than the direct mini-energy band gap of the Ge QDSL,
wherein said p-type semiconductor layers are selected from p-poly Si, amorphous Si:H and SiC:H layers, II-VI layers such as p-ZnSTe or p-ZnTe, and
wherein n-type layers are selected one or more from ZnCdSe, n CdS, poly-Si, a-Si:H, a-SiC:H,
and wherein p-type semiconductor layers on which Ge QDSL is disposed is deposited on substrate selected from glass having a coating of transparent conducting oxides, p-Si, p-Si-on insulator SOI), Si-on-sapphire,
and wherein reverse biasing of said photodetector diode absorbs light commensurate to Ge QDSL mini-energy bands.

* * * * *